United States Patent [19]
Kubota et al.

[11] Patent Number: 6,054,976
[45] Date of Patent: Apr. 25, 2000

[54] SIGNAL AMPLIFIER, SIGNAL AMPLIFIER CIRCUIT, SIGNAL LINE DRIVE CIRCUIT AND IMAGE DISPLAY DEVICE

[75] Inventors: Yasushi Kubota, Sakurai; Kenichi Katoh, Tenri; Hiroshi Yoneda, Ikoma, all of Japan

[73] Assignee: Sharp Kabushiki Kaisha, Osaka, Japan

[21] Appl. No.: 09/004,327

[22] Filed: Jan. 8, 1998

Related U.S. Application Data

[60] Division of application No. 08/554,286, Nov. 6, 1995, Pat. No. 5,734,366, which is a continuation-in-part of application No. 08/217,885, Mar. 25, 1994, abandoned.

[30] Foreign Application Priority Data

| Dec. 9, 1993 | [JP] | Japan | 5-309517 |
| Jun. 8, 1995 | [JP] | Japan | 7-142278 |

[51] Int. Cl.$^7$ ................................................. G09G 3/36
[52] U.S. Cl. ............................................................ 345/100
[58] Field of Search ................................ 345/98, 87, 92, 345/204, 100

[56] References Cited

U.S. PATENT DOCUMENTS

| 3,836,862 | 9/1974 | Seely et al. ........................... 330/22 |
| 4,255,715 | 3/1981 | Cooperman ............................ 330/9 |
| 4,755,768 | 7/1988 | Shimokawa ........................... 330/290 |

(List continued on next page.)

FOREIGN PATENT DOCUMENTS

| 0 323 260 A2 | 7/1989 | European Pat. Off. . |
| 0 391 654 A2 | 10/1990 | European Pat. Off. . |
| 0 416 550 A2 | 3/1991 | European Pat. Off. . |
| 0 565 167 A2 | 10/1993 | European Pat. Off. . |
| 1-38727 | 9/1989 | Japan . |
| 2-001893 | 1/1990 | Japan . |
| 3-167977 | 7/1991 | Japan . |
| 04 142591 | 5/1992 | Japan . |
| 4-142591 | 5/1992 | Japan . |
| 4-201581 | 7/1992 | Japan . |
| 5-5865 | 1/1993 | Japan . |
| 5-173504 | 7/1993 | Japan . |
| 2095946 | 10/1982 | United Kingdom . |

OTHER PUBLICATIONS

P.E. Allen, D.R. Holberg: "CMOS Analog Circuit Design" 1987, Holt Rinehart & Winston, New York, XP002009395.

(List continued on next page.)

*Primary Examiner*—Matthew Luu
*Attorney, Agent, or Firm*—Nixon & Vanderhye P.C.

[57] ABSTRACT

An image display device includes an operational amplifier, a signal amplifier provided with a condenser for setting a gain of the operational amplifier, a signal amplifier circuit having such signal amplifier or a buffer amplifier, the signal amplifier circuit being provided with an offset adjusting function, and a data signal line drive circuit having a signal amplifier or a signal line drive circuit. The described arrangement enables the gain of the signal amplifier to be set by a capacitance of the condenser, thereby providing a signal amplifier circuit which permits the gain to be set much more precisely as compared to the conventional signal amplifier circuits even when adopting a signal amplifier formed on a semiconductor thin film such as a polycrystalline silicone thin film. The arrangement also provides a signal amplifier circuit which permits a voltage in the same level as a voltage of the input signal to be outputted. Furthermore, the arrangement provides high quality data signal line drive circuit and the image display device.

33 Claims, 37 Drawing Sheets

U.S. PATENT DOCUMENTS

| | | | |
|---|---|---|---|
| 4,781,437 | 11/1988 | Shields et al. | 345/87 |
| 5,006,739 | 4/1991 | Kimura et al. | 307/270 |
| 5,087,890 | 2/1992 | Ishiguro et al. | 330/259 |
| 5,089,810 | 2/1992 | Shapiro et al. | 345/87 |
| 5,105,107 | 4/1992 | Plus et al. | |
| 5,105,187 | 4/1992 | Plus et al. | |
| 5,111,195 | 5/1992 | Fukuoka et al. | 245/87 |
| 5,192,945 | 3/1993 | Kusada | 345/87 |
| 5,196,738 | 3/1993 | Takahara et al. | 345/87 |
| 5,252,957 | 10/1993 | Itakura | 345/98 |
| 5,600,345 | 2/1997 | Dingwall et al. | 345/100 |
| 5,625,373 | 4/1997 | Johnson | 345/100 |

OTHER PUBLICATIONS

Y. Tsividis & P. Antognetti, Editors: "Design of MOS VLSI Circuits", Prentice–Hall, Inc., New Jersey, XP002009396.

"A Thin–Film–Transistor–Controlled Liquid–Crystal Numeric Display," *IEEE Trans., Electron Device*, vol. ED–26, pp. 802–806, May 1979, pp. 109–113, by Erskine et al.

"Thin Film Active Devices," Handbook of Thin Film Technology, 1970, pp. 20–1 though 20–17, by Weimer.

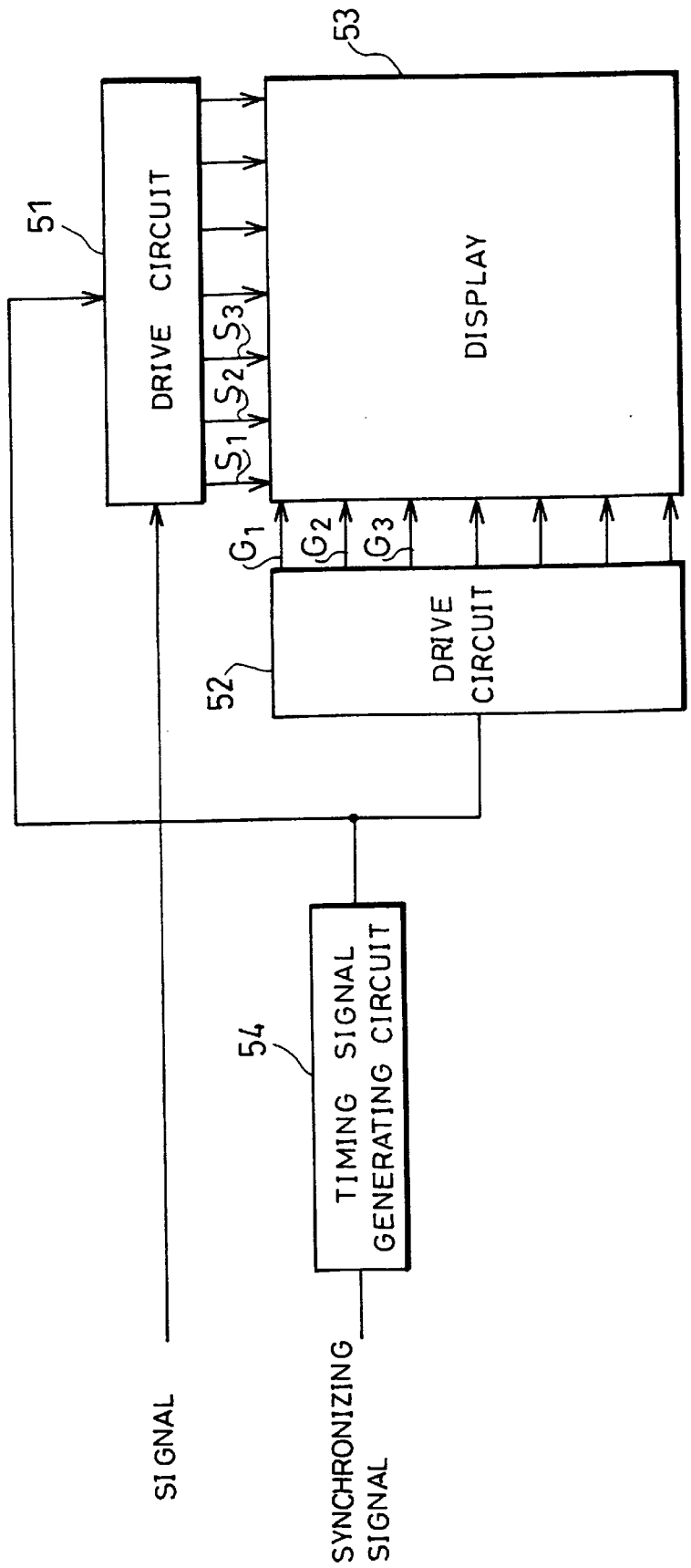
F I G. 10

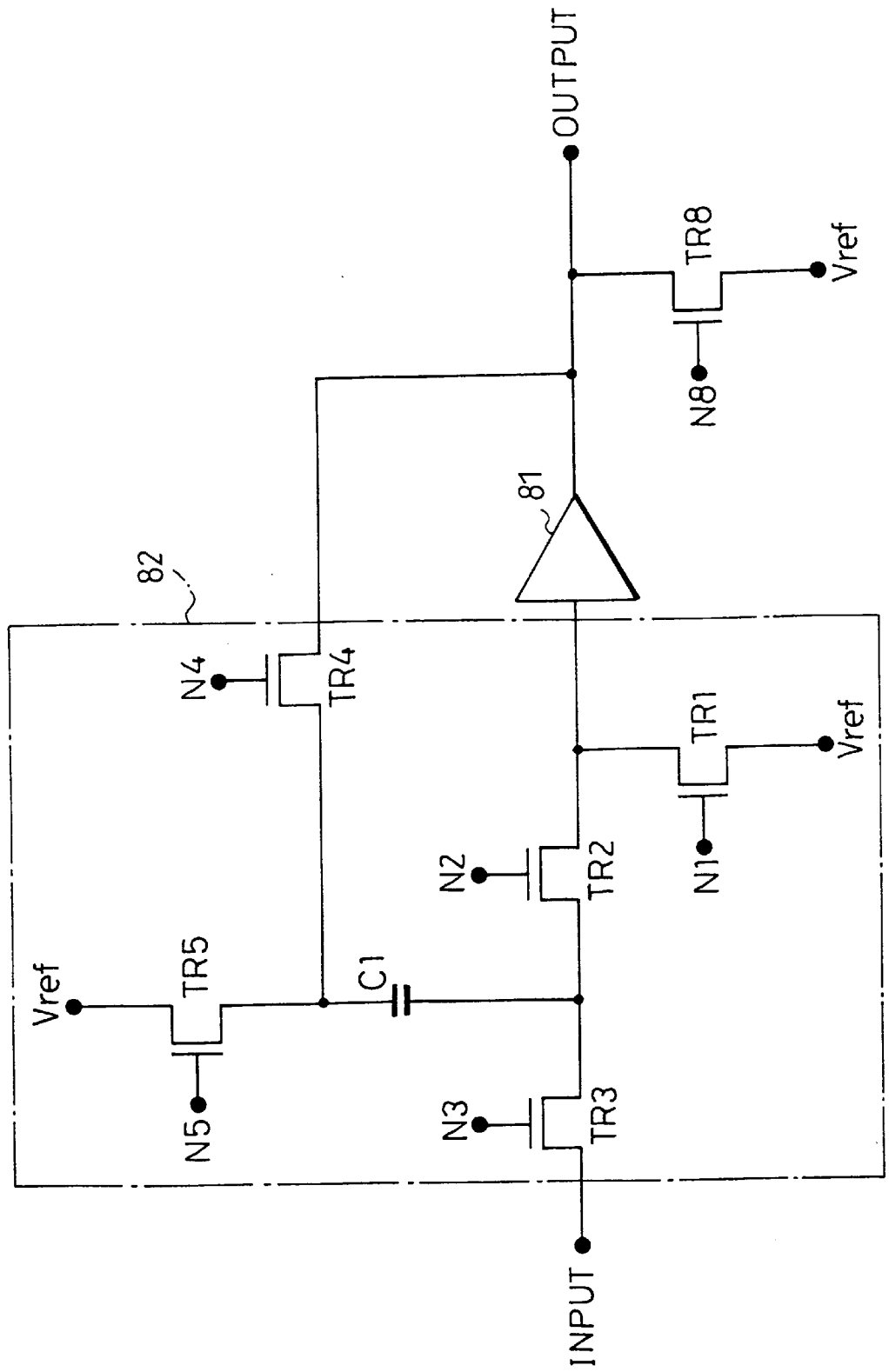
F I G. 23

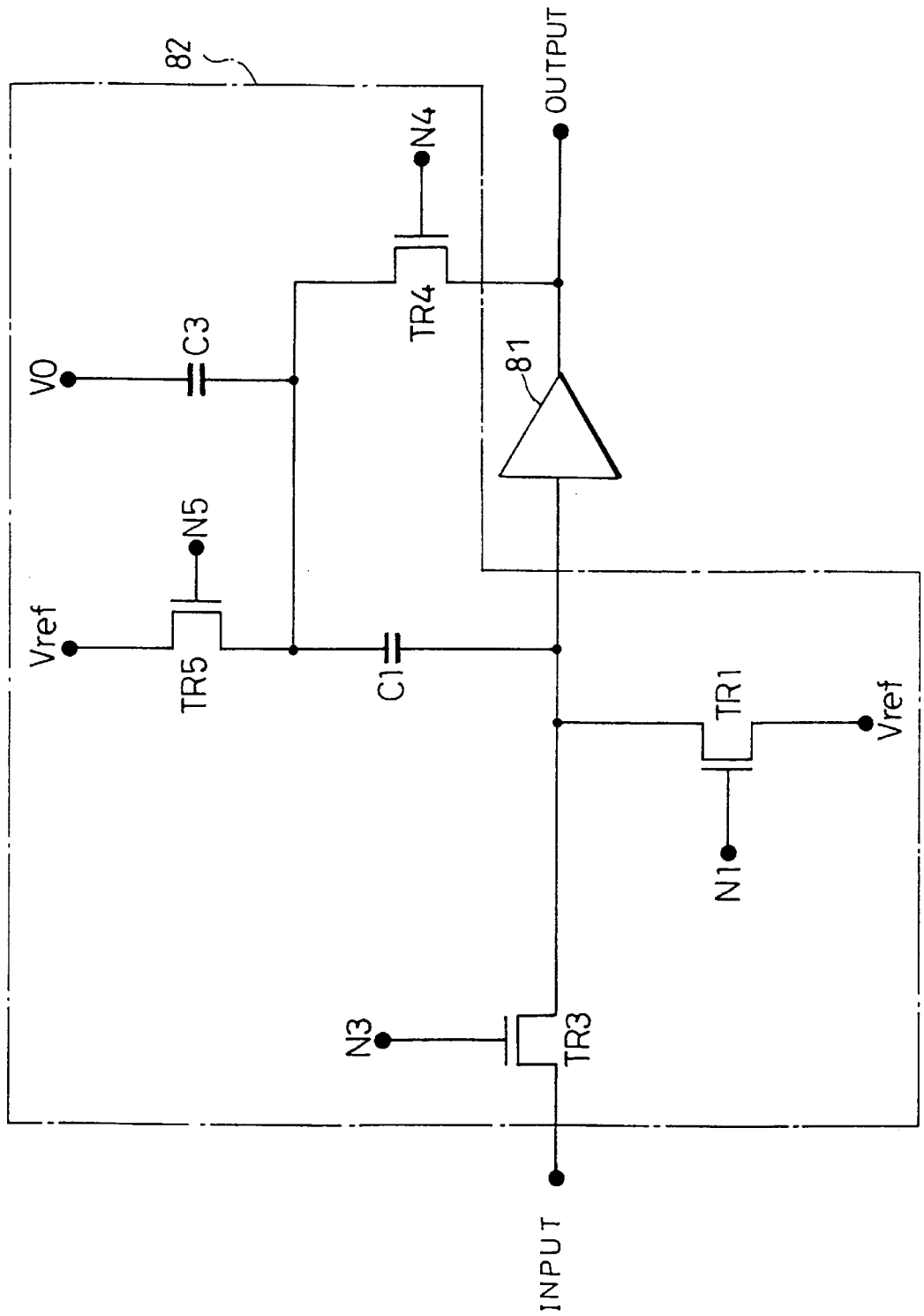
F I G. 27

SIGNAL AMPLIFIER, SIGNAL AMPLIFIER CIRCUIT, SIGNAL LINE DRIVE CIRCUIT AND IMAGE DISPLAY DEVICE

This is a division of application Ser. No. 08/554,286, filed Nov. 6, 1995 U.S. Pat. No. 5,734,366, now pending; which in turn is a continuation-in-part of application Ser. No. 08/217,885, filed Mar. 25, 1994, now abandoned.

FIELD OF THE INVENTION

The present invention relates to a high precision signal amplifier and a signal amplifier circuit provided with an offset adjusting function. The present invention also relates to a signal line drive circuit and an image display device of an active-matrix drive system respectively provided with such signal amplifier circuit and signal amplifier.

BACKGROUND OF THE INVENTION

Signal amplifiers are used in a variety of fields by adopting circuit systems suited for respective fields.

The following descriptions will provide examples of an image display device of an active-matrix drive system and a signal amplifier used in each example will be explained. However, this invention is not limited to the undermentioned examples.

In the following example of the image display device of the active-matrix drive system, a buffer amplifier provided therein will be explained.

As shown in FIG. 30, the image display device of the active-matrix drive system is composed of drive circuits 101 and 102 and a display 103.

The display 103 is composed of display cells $C_{ij}$ arranged so as to form a matrix. The drive circuit 101 samples a video signal so as to send a voltage obtained as data by sampling over a data signal line $S_{jp}$. The drive circuit 102 selects a scanning signal line $G_i$ in order so as to send data on the data signal line $S_j$ to each display cell $C_{ij}$. As shown in FIG. 31, in a liquid crystal display, each display cell $C_{ij}$ is composed of a liquid crystal element 104 and a FET 105 (field effect transistor) for driving the liquid crystal element 104. The display cell $C_{ij}$ may include a condenser 106 if necessary.

A gate of the FET 105 is connected to the scanning signal line $G_i$, and a drain and a source of the FET 105 are respectively connected to the data signal line $S_j$ and an electrode of the liquid crystal element 104. The other electrode of the liquid crystal element 104 is connected to a line used in common for all the display cells $C_{ij}$. As a result, a transmittance or a reflectance of the liquid crystal of the liquid crystal element 104 are modulated based on data, thereby display an image.

The drive circuit 101 has the following two types: a digital driver for sending digital data over the data signal line $S_j$; and an analog driver for sending analog data over the data signal line $S_j$.

As an example of digital drivers, a digital driver for a 3 bit-input, i.e., an 8-gradation (=$2^3$) display is shown in FIG. 32.

The digital driver is composed of a shift register 107, a plurality of latches 108, a plurality of switching circuits 109 and a plurality of digital buffers 110.

As shown in FIG. 33, each digital buffer 110 is composed of a decoder 111 for decoding a signal from the switching circuits 109 and a switching circuit 112 for selecting a voltage from V1 through V8 in order to achieve the 8-gradation display according to an output from the decoder 111.

As described, the digital driver requires voltage levels and switching circuits 112 in the same number as the number of gradations. Therefore, in the multiple gradation display, the circuit becomes larger in size. For this reason, the following analog driver is more suited for the multiple gradation display.

The drive system for analog drivers is classified into the following two systems: dot sequential drive system and line-sequential drive system.

As shown in FIG. 34, an analog driver of the dot sequential drive system is composed of a shift register 107, a plurality of latches 108 and a plurality of switching circuits 112. The analog driver outputs data over the data signal line $S_j$ by opening and closing the switching circuits 112 in synchronous with a pulse from each block of the shift register 107.

A period in which an output of data over the data signal line $S_j$ is permitted is H1/N where H1 is an effective horizontal scanning period (approximately 80% of the horizontal scanning period) and N is a number of picture elements in a horizontal direction, i.e., a number of display cells $C_{i1}$ to $C_{iN}$. For this reason, when displaying an image on a large screen, a period for sending data to the data signal line $S_j$ becomes short.

As shown in FIG. 35, an analog driver of the line-sequential drive system is composed of a shift driver 107, a plurality of latches 108, a plurality of switching circuits 113, a plurality of condensers 116, a plurality of switching circuits 114, a plurality of condensers 117 and a plurality of buffer amplifiers 115 having the previously described characteristics.

The buffer amplifier 115 is a kind of a signal amplifier, and has characteristics of high input impedance and low output impedance and of a voltage gain of substantially one.

Various kinds of circuits are applicable to the buffer amplifier 115 as shown in FIG. 36 through FIG. 38. In the line-sequential drive system, data from the switching circuit 113 is temporarily held in a sampling-use condenser 116 of a small capacity, and the switching circuits 114 are then set ON by a transfer signal in the next horizontal blanking period. As a result, all the data sent in the previous horizontal scanning period are sent into the respective holding condensers 117 and the buffer amplifiers 115 at one time, and are sent over the data signal line $S_j$. Therefore, a sufficient length of the period is ensured for sending data over the data signal line $S_j$.

In the described liquid crystal display device of the active-matrix drive system, the FET 105 of the display cell $C_{ij}$ (see FIG. 13) is formed using an amorphous silicon thin film formed on a transparent substrate, and drive circuits 101 and 102 are formed as separately provided ICs (integrated circuits). Recently, a monolithic system has been reported as a technique for forming the drive circuits 101 and 102 and the display 103 on a polycrystalline silicon thin film.

For the substrate, a quarts substrate or a resin substrate may be used. In the future, it is possible that a glass substrate is used.

The drive circuit 101 of the data signal line $S_j$ once stores a video signal in the sampling condenser 116, and sends it to the buffer amplifier 115. In this state, as the capacitance is divided between the sampling condenser 116 and the hold condenser 117 of the input section of the buffer amplifier 115, a signal (charge amount) decreases. Therefore, when it is necessary to compensate for this reduction, a signal amplifier having a gain of not less than 1 is effective.

FIG. 39 shows a structure of a non-inverting amplifier as an example of the signal amplifier having a gain of not less than 1. FIG. 40 shows an example of a circuit structure of the signal amplifier.

This signal amplifier is a non-inverting type, and the signal amplifier includes an operational amplifier 151, a resistance element 153a connected across an output terminal and an input terminal of the operational amplifier 151 and a resistance element 154b connected across the input terminal and the signal input source, and the gain (ratio of the output voltage to the input voltage) is (Rf/RS)/Rs. Here, respective resistance value of the resistance elements 152a and 152b are denoted as Rf and RS.

In such signal amplifier, a gain can be obtained as desired by setting the resistance value of the resistance elements 152a and 152b or the resistance value of the resistance elements 153a and 153b to appropriate values. However, in such conventional signal amplifier as the buffer amplifier 115, an offset voltage may be generated.

for example, in the polycrystalline silicone thin film transistor, since a particle diameter of a liquid crystal and a channel length of the transistor are in the same order, the characteristic such as the threshold voltage, the mutual conductance, a subthreshold factor, etc., differ depending on a transistor. In the case of adopting the signal amplifier composed of a transistor (polycrystalline silicon thin film transistor, etc.,) having a variable characteristic, an offset voltage may be generated from the signal amplifier. Here, the offset voltage defined as a difference in voltage between the input terminal and the output terminal of the signal amplifier, and in the curve representing the input-output characteristics of the signal amplifier, it is shown as the amount of parallel displacement (the curve does not go through the origin).

For example, in the signal amplifier shown in FIG. 40, the transistors TR4a and TR4b and the transistors TR4c and TR4d respectively make pairs. Therefore, if a difference in characteristic of the transistors in the pair is generated, an offset voltage may be generated in the output from the signal amplifier according to the degree of the difference. Furthermore, a more serious problem arises in that in a circuit including a plural signal amplifiers such as a data signal line drive circuit 101 (FIG. 30), each signal amplifier has random value offset voltage due to a difference in characteristic.

Although such offset voltage is generated also in the driving-use IC formed on a conventional monocrystal silicone substrate, as the level of the offset voltage is suppressed to be not more than several mV, it would not be a problem. In contrast, in the described polycrystalline silicon thin film transistor, since a fluctuation in characteristic is large, an offset voltage of 1 V or above may be generated. For example, when the drive voltage (dynamic range) of the liquid crystal is 5V, if a difference in offset voltage of 1V is generated, it would be impossible to display of 4 or above gradations.

Furthermore, when forming the signal amplifier (FIG. 39 or FIG. 41) having a gain of not less than 1, by a technique of the polycrystalline silicon thin film transistor, fluctuations of the resistance elements 152a and 152b (or resistance elements 153a, 153) would be a problem. Namely, normally, the resistance elements 152a and 152b are formed using the same semiconductor thin film as the transistor, the resistances Rf and RS fluctuate to a large degree, resulting the problem that a gain differs for each signal amplifier. This appears in the curve representing the input-output characteristic of the signal amplifier as a fluctuation in tilt.

To solve the above-mentioned problem, a liquid crystal display disclosed in Japanese Laid-Open patent publication No. 142591/1992 (Tokukaihei 4-142591) discloses a liquid crystal display device wherein a voltage for compensating for an offset voltage in each signal amplifier is stored beforehand as compensating data in a memory, and by inputting a signal obtained by adding this compensation data and the video signal is inputted in the data signal line drive circuit to eliminate the offset voltage, thereby preventing the effect from fluctuation.

In the described method, however, since an offset amount differs for each data signal line as explained earlier, voltage offsets generated from all the signal line outputs are measured after completing the device, and the results of the measurement are stored in the memory. This causes an increase in cost for measuring the device and writing in the memory, and also causes an increase in process cost for integrating a nonvolatile memory into the driving IC.

In addition, the Fermi level and the carriage mobility of the semiconductor vary to a large degree by temperature, and this cause the properties of the signal amplifier to vary by the operation environment temperature of the image display device. In the case where the property of the transistor characteristic fluctuate to a large degree such as the polycrystalline silicon thin film transistor, its temperature dependency may also fluctuate.

Furthermore, in the polycrystalline silicone thin film transistor, plural localized levels exit on a grain boundary of the polycrystalline silicone and an interface between the gate insulating film-polycrystalline silicone interface, and the TFT (thin film transistor) substrate is in a floating potential state. Thus, characteristics of the transistor fluctuate as time passes to a greater degree than the transistor formed on the monocrystal silicone substrate, and this may cause the characteristics (offset voltage and the tilt of the input-output characteristic) of the signal amplifier to fluctuate as time passes.

The described problems associated with fluctuates in temperature and fluctuations as time passes would not be solved by the conventional method (Japanese Laid-Open Patent Publication No. 142591/1992 (Tokukaihei 4-142591)) for storing the offset voltage of each signal amplifier in the memory because, in practice, it is not possible for the user of the image display device to measure the offset voltage of each signal amplifier and to rewrite the content of the memory according to the result.

As described, in the signal amplifier, an offset voltage and a tilt of the input-output characteristic fluctuate, and especially when adopting the signal amplifier composed of polycrystalline silicone thin film, this variation would become large. Furthermore, in the image display device provided with the signal amplifier having such fluctuations, since the offset voltage and the tilt of the input-output characteristic differ for each signal amplifier, it is difficult to achieve a high quality image display.

SUMMARY OF THE INVENTION

The first object of the present invention is to provide a signal amplifier which is free from an offset voltage and variations in tilt of input-output characteristics even in applications of polycrystalline silicone thin film transistor having large fluctuations in element characteristic.

In order to achieve the first object, a signal amplifier circuit in accordance with the present invention is characterized by including:

an operational amplifier; and eleventh and twelfth condensers for setting a gain of the operational amplifier, wherein:

the eleventh condenser is connected across an inverting input terminal and an output terminal of the operational amplifier, the twelfth condenser is connected across the inverting input terminal of the operation amplifier and the constant voltage source, the twelfth condenser outputting an output signal obtained by a noninversion-amplification of an input signal of a noninverting input terminal.

According to the described arrangement, a gain of the signal amplifier can be set by capacitances of the eleventh and twelfth condensers, thereby achieving a noninverting-type signal amplifier which enables a gain to be set more accurately as compared to conventional signal amplifiers which set a gain by a resistor. Especially, by forming the signal amplifier on a semiconductor thin film such as polycrystalline silicon thin film, etc., a noninverting-type signal amplifier which enables a still more precise setting of a gain can be achieved.

In order to achieve the first object, another signal amplifier circuit in accordance with the present invention is characterized by comprising:

an operational amplifier; and eleventh and twelfth condensers for setting a gain of the operational amplifier, wherein:

the eleventh condenser is connected across an inverting input terminal and an output terminal of the operational amplifier, an noninverting input terminal is connected to a constant voltage source, and an output signal obtained by inversion-amplification of an input signal inputted to the inverting input terminal through the twelfth condenser from the signal source is outputted from the output terminal.

According to the described arrangement, a gain of the signal amplifier can be set by capacitances of the eleventh and twelfth condensers, thereby achieving a noninverting-type signal amplifier which enables a gain to be set more accurately as compared to conventional signal amplifiers which set a gain by a resistor. Especially, by forming the signal amplifier on a semiconductor thin film such as a polycrystalline silicon thin film, etc., a noninverting signal amplifier which enables a still more precise setting of a gain can be achieved.

The second object of the present invention is to provide a signal amplifier circuit having a desirable buffer characteristic that a signal outputted therefrom has the same voltage level as a signal inputted thereto with a simple structure.

In order to achieve the second object, a signal amplifier circuit in accordance with the present invention is characterized by including:

a buffer amplifier, and adjusting means for detecting a difference in voltage as an offset voltage between a reference voltage and an output voltage from the buffer amplifier when the reference voltage is inputted thereto and for inputting a voltage obtained by subtracting the offset voltage from a voltage of an input signal into the buffer amplifier so as to cancel the offset voltage.

By eliminating the offset voltage, the described arrangement provides a signal amplifier circuit having such a desirable buffer characteristic that even if the offset voltage is generated from the buffer amplifier, the voltage in the same level as the voltage of the input signal can be outputted.

In order to achieve the second object, the second signal amplifier circuit is characterized by including:

an amplifier; and adjusting means for detecting a difference in voltage as an offset voltage between a reference voltage and an output voltage from the amplifier when the reference voltage is inputted thereto, and inputting a compensating signal that is an attenuated signal of the first signal obtained by shifting a level of the input signal by a level of the offset voltage, to reduce the offset voltage of the amplifier, wherein a gain of the amplifier is set to an amplitude ratio of the first signal to the compensating signal.

The described arrangement permits the offset voltage of the amplifier to be reduce, thereby obtaining a output signal in almost same level as the input signal.

The third object of the present invention is to provide a signal line drive circuit and an image display device which permit a high quality image display.

In order to achieve the above object, the signal line drive circuit of the present invention which includes:

sampling means for taking-in a video signal in synchronous with a clock signal; and output means for sending video signals obtained by sampling over a data signal line at one time in synchronous with another clock signal, is characterized in that the output means is either the described signal amplifier or signal amplifier circuit.

This arrangement permits a signal in the same level as a sampled video signal to be sent over the data signal line.

In order to achieve the third object, an image display device in accordance with the present invention is characterized by including:

a buffer amplifier;

a display composed of display cells arranged so as to form a matrix;

a first drive circuit for sampling a video signal so as to send a voltage obtained as data by sampling over a data signal line; and a second drive circuit for selecting a scanning signal line in order so as to send data on the data signal line to each display cell, wherein the first drive circuit includes:

a shift resister, switching circuits in the same number as the number of display cells in a lateral direction, sampling use condensers in the same number as the number of the switching circuits; and signal amplifier circuits in the same number as the number of the sampling use condensers, the shift register sends a signal in order into each switching circuit in synchronous with a clock signal, the switching circuit is then set ON when receiving a signal from the shift register, each sampling use condenser samples a level of a video signal obtained as data when the switching circuit is set ON, when data in the same number as the number of display cells in the lateral direction are held in the sampling use condensers, the signal amplifier circuits take-in the data from the sampling-use condensers at one time and output to the data signal line, thereby displaying the video signal on the display, and the signal amplifier circuit includes:

a buffer amplifier, and adjusting means for detecting a difference in voltage as an offset voltage between a reference voltage and an output voltage from the buffer amplifier when the reference voltage is inputted thereto and for inputting a voltage obtained by subtracting the offset voltage from a voltage of the video signal sampled in the condenser into the buffer amplifier so as to eliminate the offset voltage.

Since the described arrangement enables a voltage in the same level as the voltage stored in the sampling-use condenser to be sent over the data signal line, thereby achieving a high quality image display.

In order to achieve the third object, the image display device of the present invention which includes:

a display composed of display cells arranged so as to form a matrix;

a first signal line drive circuit for sampling a video signal so as to send the video signal obtained by sampling over a data signal line; and a second signal line drive circuit for selecting a scanning signal line in order so as to write the video signal on said data signal line onto a display picture element, is characterized in that:

the first signal line drive circuit includes output means, and the display picture element and the first signal line drive circuit are formed on the same substrate, and the first signal line drive circuit is composed of a thin film transistor.

Since the described arrangement permits the signal in the same level as the inputted video signal to be outputted to the data signal line, a high quality image display can be achieved. Moreover, the feature that the display element and the first signal line drive circuit are formed on the same substrate and the first signal line drive circuit is composed of the thin film transistor enables a transmission image display device and a drive circuit of a practical application including such signal amplifier can be achieved.

For a fuller understanding of the nature and advantages of the invention, reference should be made to the ensuing detailed description taken in conjunction with the accompanying drawings.

BRIEF DESCRIPTION OF THE DRAWINGS

FIG. 1 through FIG. 12 show one embodiment of the present invention.

FIG. 1 is a view showing a schematic structure of a signal amplifier circuit in accordance with the present invention.

FIG. 2 is a circuit diagram showing the first example of the signal amplifier circuit of FIG. 1.

FIG. 3 is a timing chart of a control signal in the signal amplifier circuit of FIG. 2.

FIG. 4 is a circuit diagram showing a sample configuration of a signal amplifier circuit which permits a shorter adjusting time.

FIG. 5 is a circuit diagram showing another sample configuration of a signal amplifier circuit which permits a shorter adjusting time.

FIG. 6 is a circuit diagram showing the second example of the signal amplifier circuit of FIG. 1.

FIG. 7 is a timing chart of a control signal in the signal amplifier circuit of FIG. 6.

FIG. 8 is a circuit diagram showing the third example of the signal amplifier circuit of FIG. 1.

FIG. 9 is a timing chart of a control signal in the signal amplifier circuit of FIG. 8.

FIG. 10 is a block diagram showing a schematic configuration of a liquid crystal display device as an application example of the signal amplifier circuit of FIG. 1.

FIG. 11 is a block diagram showing a schematic configuration of a drive circuit for sending data over a data signal line in the liquid crystal display device of FIG. 10.

FIG. 12 is a timing chart showing an operation of the drive circuit of FIG. 11.

FIG. 22($b$) is a waveform chart of a control signal to be inputted to a signal amplifier provided with a inverting amplifier among the signal amplifiers of FIG. 21.

FIG. 23 is a circuit diagram showing the signal amplifier of FIG. 21 which is additionally provided with a switching element for applying a reference voltage to an output terminal.

FIG. 26($b$) is a waveform chart of a control signal to be inputted to the signal amplifier provided with an inverting amplifier among the signal amplifiers of FIG. 25.

FIG. 27 is a circuit diagram showing another example of the signal amplifier of FIG. 20.

DESCRIPTION OF THE EMBODIMENTS

The following descriptions will discuss one embodiment of the present invention in reference to FIG. 1 through FIG. 12.

Figure 1:
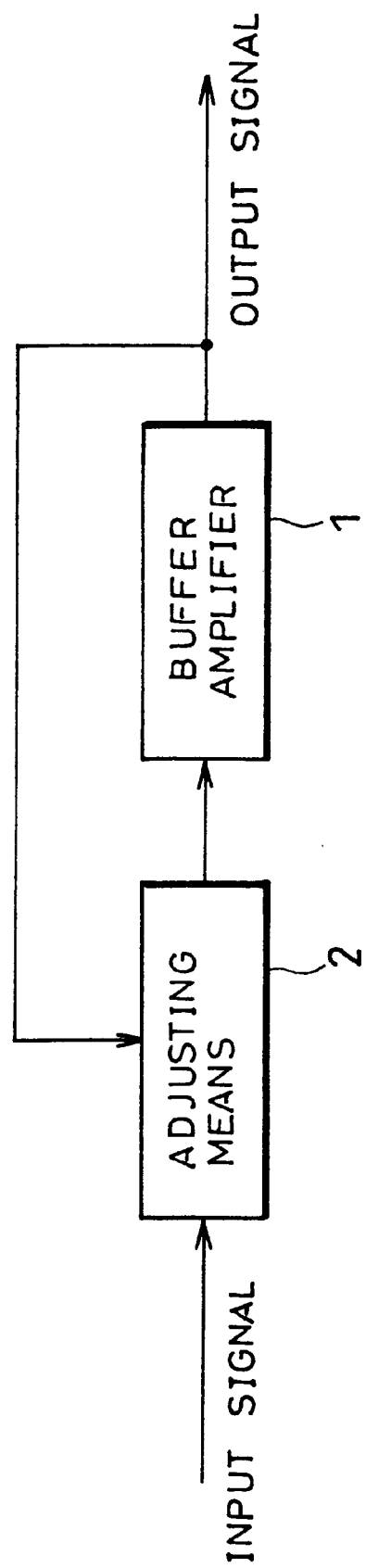

As shown in FIG. 1, a signal amplifier circuit in accordance with the present embodiment is provided with a buffer amplifier 1 and adjusting means 2 for canceling out an offset voltage $\Delta V$ generated in the buffer amplifier 1.

The adjusting means 2 inputs a reference voltage $V_0$ to the buffer amplifier 1 and detects a difference in voltage as an offset voltage $\Delta V$ between an output voltage $(V_0+\Delta V)$ of the buffer amplifier 1 and a reference voltage $V_0$. Then, the adjusting means 2 inputs a voltage $(V-\Delta V)$ obtained by subtracting the offset voltage $\Delta V$ from the voltage V of the input signal into the buffer amplifier 1.

When the voltage $(V-\Delta V)$ is inputted to the buffer amplifier 1, a voltage $(V-\Delta V+\Delta V)$ is outputted. Namely, the offset voltage $\Delta V$ is canceled out, and the voltage V is outputted. According to the signal amplifier circuit of the present embodiment, even if the offset voltage $\Delta V$ is generated in the buffer amplifier 1, a desirable buffer characteristic that a signal outputted has the same voltage level as a signal inputted thereto can be achieved.

Therefore, even when the buffer amplifier 1 is manufactured using a transistor composed of a monocrystal semiconductor, a polycrystalline semiconductor or amorphous semiconductor, a signal amplifier circuit having a desirable buffer characteristic can be achieved.

It may be arranged such that the adjusting mean 2 detects the offset voltage $\Delta V$ when the signal amplifier circuit starts operating. However, in the case where an input signal is inputted in synchronous with a clock signal, it is preferable that a detection of the offset voltage $\Delta V$ is carried out at each clock.

In the above arrangement where the offset voltage $\Delta V$ is canceled at each clock, even if the offset voltage $\Delta V$ changes due to a change in the environment under which the signal amplifier circuit operates (for example, a change in temperature) or due to a change in properties of the signal amplifier circuit as time passes, the offset voltage $\Delta V$ can be always canceled out.

Figure 2:
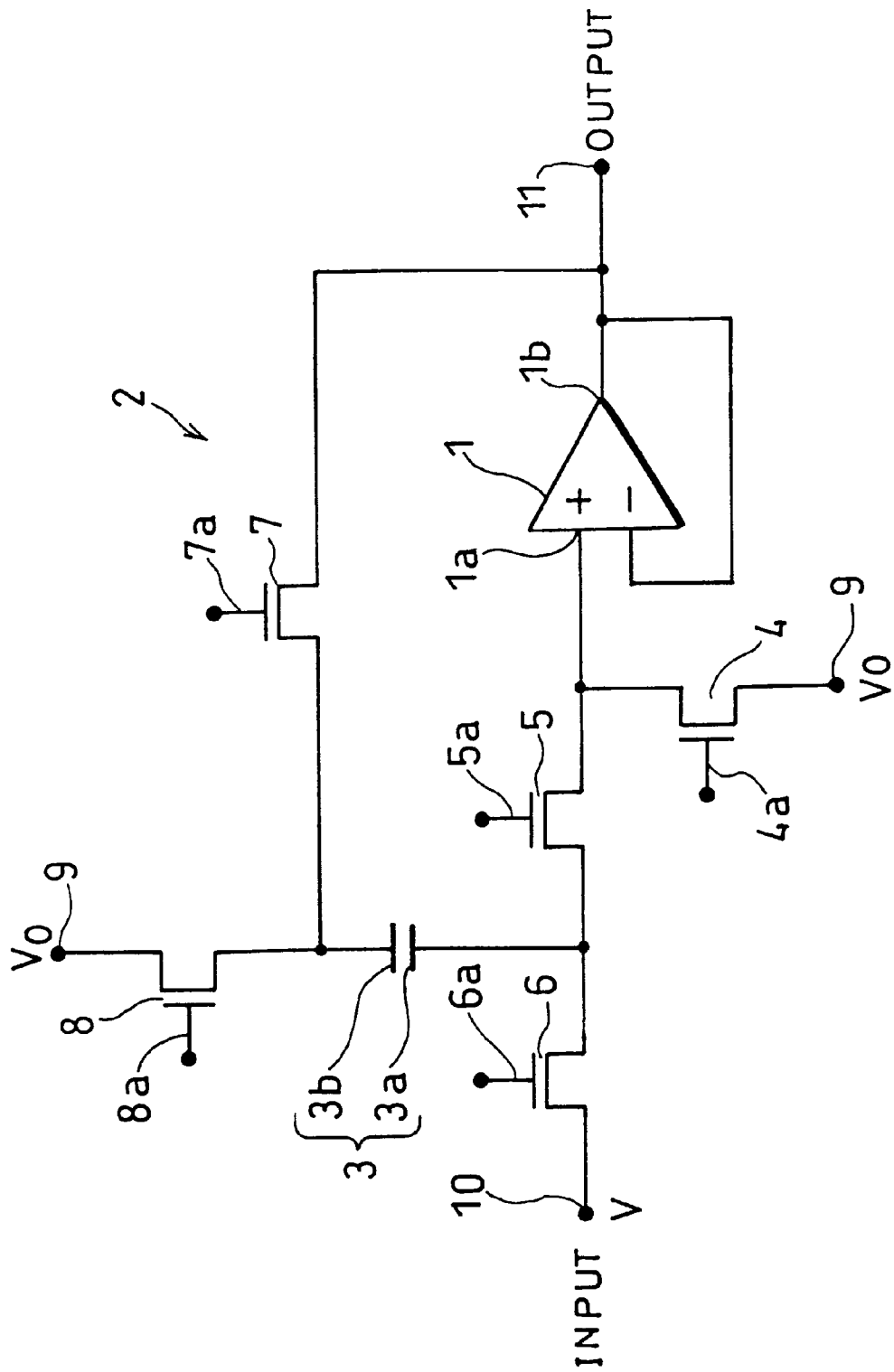

The first example of the signal amplifier circuit will be explained below in reference to FIG. 2.

The signal amplifier circuit is composed of a buffer amplifier 1 and the adjusting means 2. The adjusting means is composed of a condenser 3 (first condenser) and switching elements 4–8 (first–fifth switching elements). An input terminal 1a of the buffer amplifier 1 is connected to an input terminal 9 of a reference voltage $V_0$ through the switching element 4. The input terminal 1a of the buffer amplifier 1 is also connected to one electrode 3a of the condenser 3 through the switching element 5. The electrode 3a is connected to an input terminal 10 of the signal amplifier circuit through the switching element 6. The other electrode 3b of the condenser 3 is connected to an output terminal 1b of the buffer amplifier 1 through the switching element 7. The electrode 3b of the condenser 3 is also connected to an input terminal 9 through the switching element 8.

In order to stabilize a signal level, another condenser of a small capacity may be added to the input terminal 1a of the buffer amplifier 1. This is effective if respective parasitic capacities of the buffer amplifier 1 and switching elements 4 and 5 and the stray capacity of wires used in connecting the above components are not sufficient for stabilizing the signal level.

Hereinafter, it is assumed that the buffer amplifier 1 always generates a constant offset voltage $\Delta V$ as long as the level of an input signal falls within a predetermined range.

Figure 3:
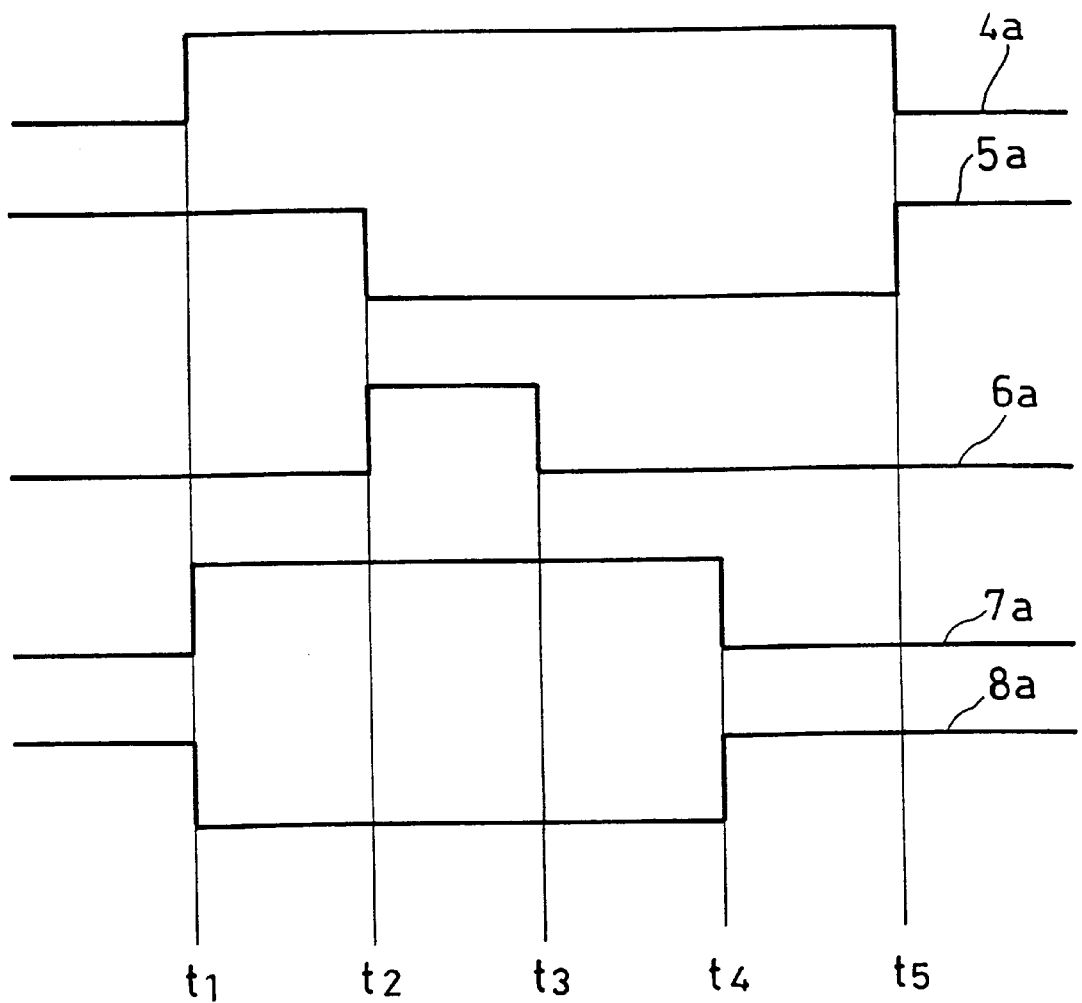

The switching elements 4–8 are respectively controlled by control signals 4a–8a from the control means (not shown) according to a timing chart of FIG. 3.

It is shown in FIG. 3 that respective rise and fall of control signals 4a–8a completely coincide at a time of $t_1$–$t_5$. In practice, however, when respective levels of the control signals 4a–8a change at the time of $t_1$–$t_5$, finite time (transition time) is required. Therefore, in order to cancel out an offset voltage $\Delta V$ accurately, it is necessary to prevent an interference by a transient signal generated at respective rise and fall of the control signals 4a–8a. For the reason above, it is preferable to prevent an interference generated at rise and fall last of the control signals 4a–8a, for example, by delaying a rise of one of the control signals 4a–8a. Additionally, the control signals 4a–8a are applicable to the case where a N-channel MOS transistor are adopted as switching elements 4–8. However, when P-channel MOS transistors are adopted as switching elements 4–8, the phase of the control signals 4a–8a should inverse. The above features are also true for a timing chart to be described later.

At $t_1$, control signals 4a, 5a and 7a are High level and control signals 6a and 8a are Low level, and thus switching elements 4, 5 and 7 are set ON and switching elements 6 and 8 are set OFF.

Therefore, the reference voltage $V_0$ is applied to the input terminal 1a of the buffer amplifier 1 through the switching element 4, and is also applied to the electrode 3a of the condenser 3 through the switching element 5. The output voltage $(V_0+\Delta V)$ from the buffer amplifier 1 is applied to the electrode 3b of the condenser 3 through the switching element 7.

At $t_2$, the control signal 5a is set to low level, and the control signal 6a is set to high level, thereby setting OFF the switching element 5 and switching ON the switching element 6.

As a result, the voltage V of the input signal from the input terminal 10 is applied to the electrode 3a of the condenser 3 through the switching element 6.

At $t_3$, the control signal 6a is set to low level, thereby setting OFF the switching element 6.

At $t_4$, the control signal 7a is set to low level, thereby setting the control signal 8a to high level. As a result, the switching element 8 is set ON.

Therefore, the reference voltage $V_0$ is applied to the electrode 3b of the condenser 3 through the switching element 8. As a result, a voltage of the electrode 3a of the condenser 3 becomes a voltage (V−ΔV) obtained by shifting the voltage V of the input signal by a voltage changed in the electrode 3b (i.e., $V_0−(V_0+ΔV)=−ΔV$).

At $t_5$, the control signal 4a is set to Low level, and the control signal 5a is set to High level, thereby setting OFF the switching element 4 and switching ON the switching element 5.

As a result, the voltage (V−ΔV) of the electrode 3a of the condenser 3 is applied to the input terminal 1a of the buffer amplifier 1 through the switching element 5. As a result, the offset voltage ΔV is eliminated, and the voltage V in the same level as the voltage V of the input signal is outputted from the output terminal 1.

In the described signal amplifier circuit, a time required for adjusting the offset voltage ΔV is ($t_5−t_1$). However, by setting the load of the buffer amplifier smaller, the time required for adjusting the offset voltage ΔV can be made shorter. This is because in the adjusting period, a stabilization of the output voltage ($V_0+ΔV$) of the buffer amplifier 1 when the reference voltage $V_0$ is inputted required the longest time. Especially, when a difference in voltage between the input signal level and the reference voltage $V_0$ before adjusting the offset voltage ΔV is large, the stabilization requires a long time.

Figure 4:
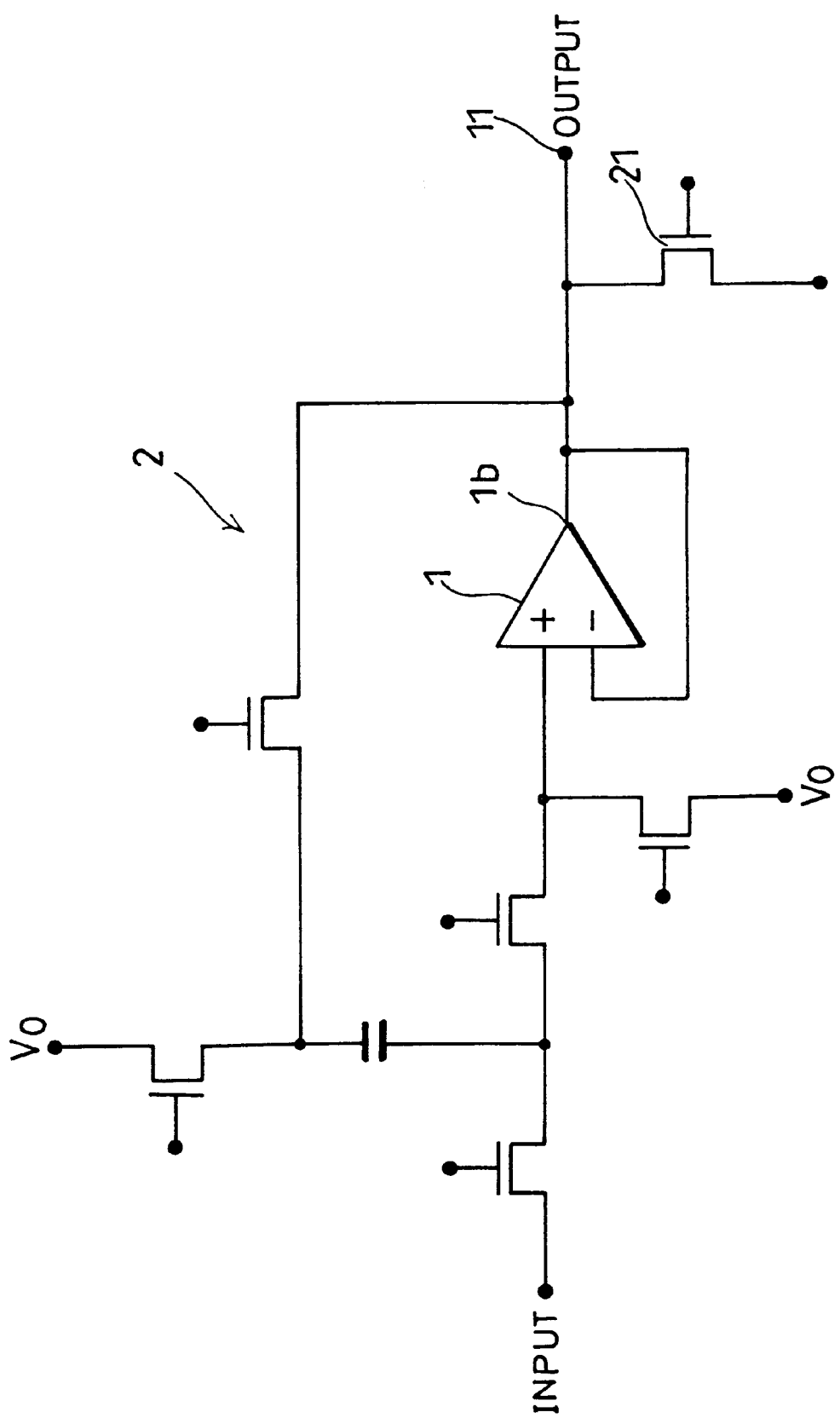
Figure 5:
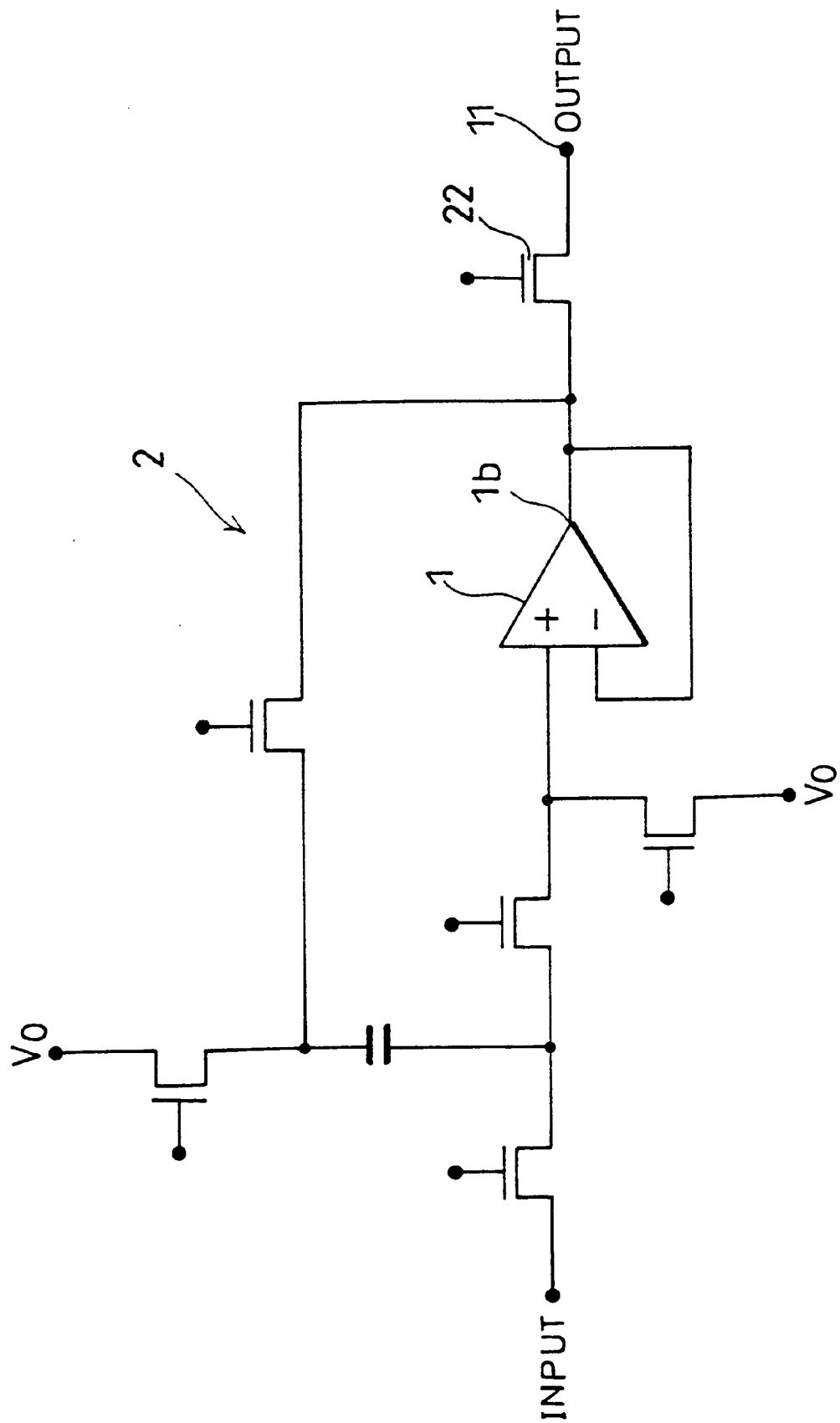

More specifically, it may be arranged such that a switching element 21 (eighth switching element) for applying a reference voltage $V_0$ to an output terminal 1b of the buffer amplifier in a period directly before $t_1$ is provided as shown in FIG. 4. Alternatively, it may be arranged such that a switching element 22 (ninth switching element) for switching off the load from the output terminal 1b of the buffer amplifier 1 in a period between $t_1$ and $t_5$ is provided as shown in FIG. 5.

For the buffer amplifier 1, a circuit shown in the explanation of prior arts (see FIG. 18 and FIG. 20) may be used. However, the present invention is not limited to this. Other circuits having the buffer characteristic may be applicable.

Figure 6:
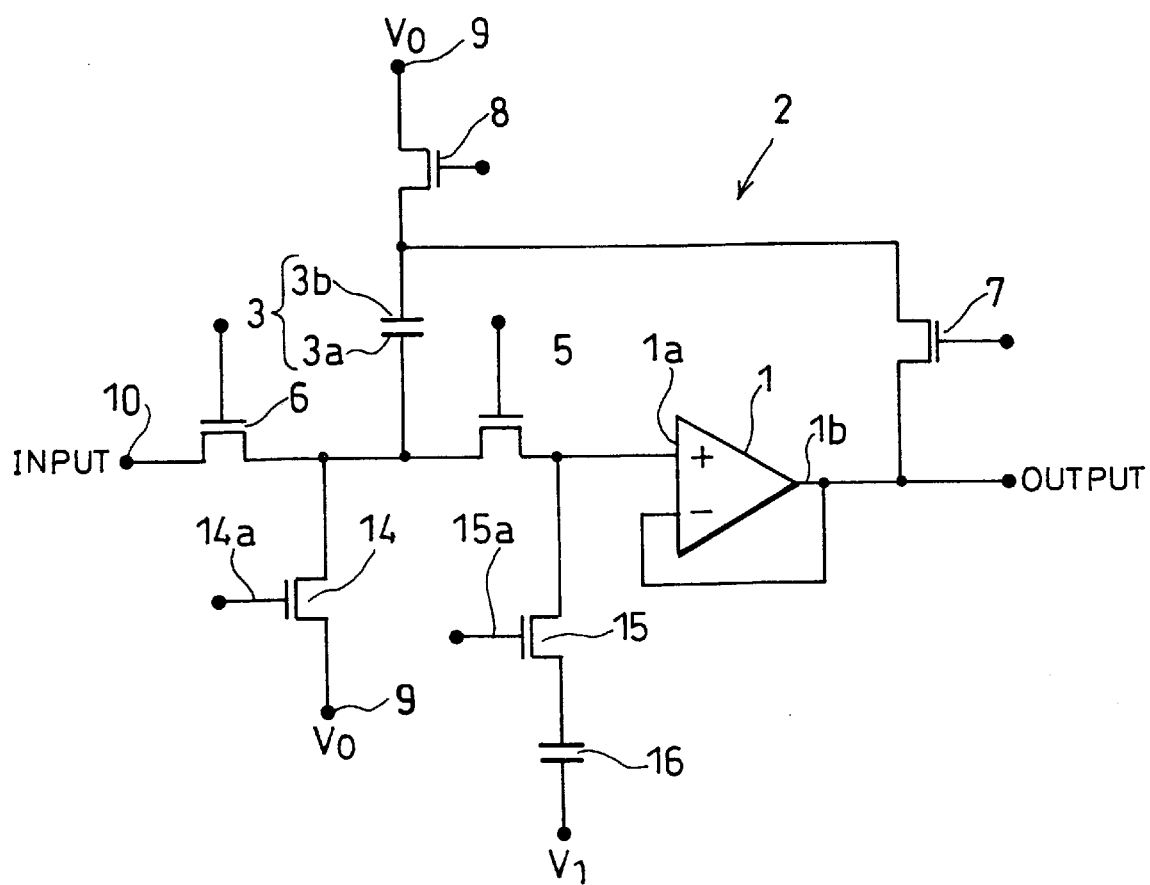

The second example of the signal amplifier circuit will be explained below in reference to FIG. 6.

In the signal amplifier circuit, the switching element 4 of the first example is not provided. Instead, switching elements 14 and 15 (sixth and seventh switching elements) and a condenser 16 holding a reference voltage $V_0$ (second condenser) are additionally provided.

Figure 7:
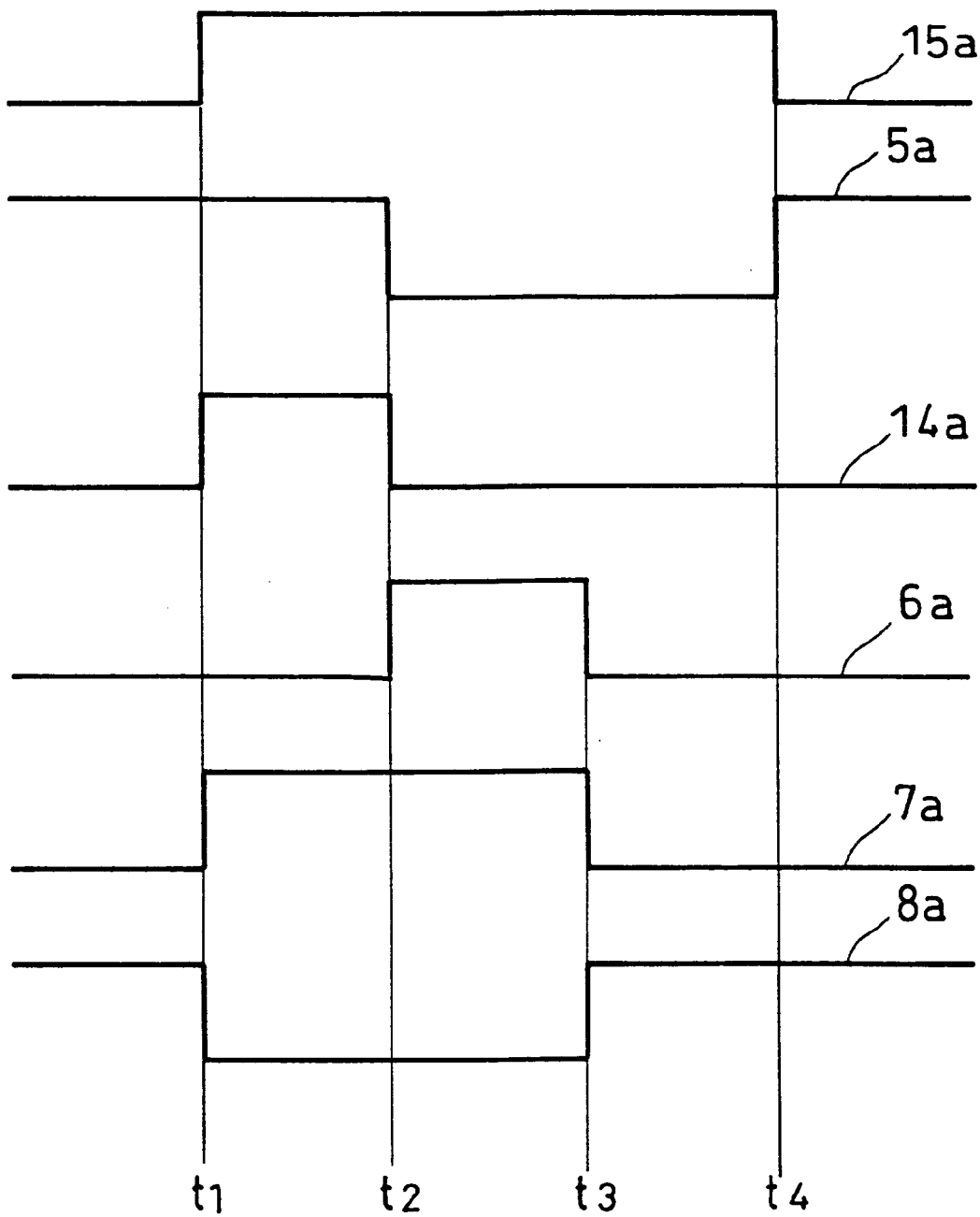

Switching elements 5–8, 14 and 15 are respectively controlled by control signals 5a–8a, 14a and 15a from control means (not shown) according to a timing chart of FIG. 7.

At $t_1$, the control signals 15a, 5a, 14a and 7a are High level, and control signals 6a and 8a are Low level. Thus, the switching elements 15, 5, 14 and 7 are set ON, and the switching elements 6 and 8 are set OFF.

For this reason, the reference voltage $V_0$ is applied to the condenser 16 through the switching elements 14, 5 and 15.

As a result, the condenser 16 is charged, and the potential of the input terminal 1a of the buffer amplifier 1 becomes the reference voltage $V_0$. The offset voltage ΔV is canceled out using a voltage of the terminal on the buffer amplifier side of the condenser 16 (i.e., reference voltage $V_0$). Other than the above, the signal amplifier circuit of this example has approximately the same configuration as the signal amplifier circuit of the first example.

In the signal amplifier circuit of this example, a time required for adjusting the offset voltage ΔV is ($t_4−t_1$) of FIG. 7.

Figure 8:
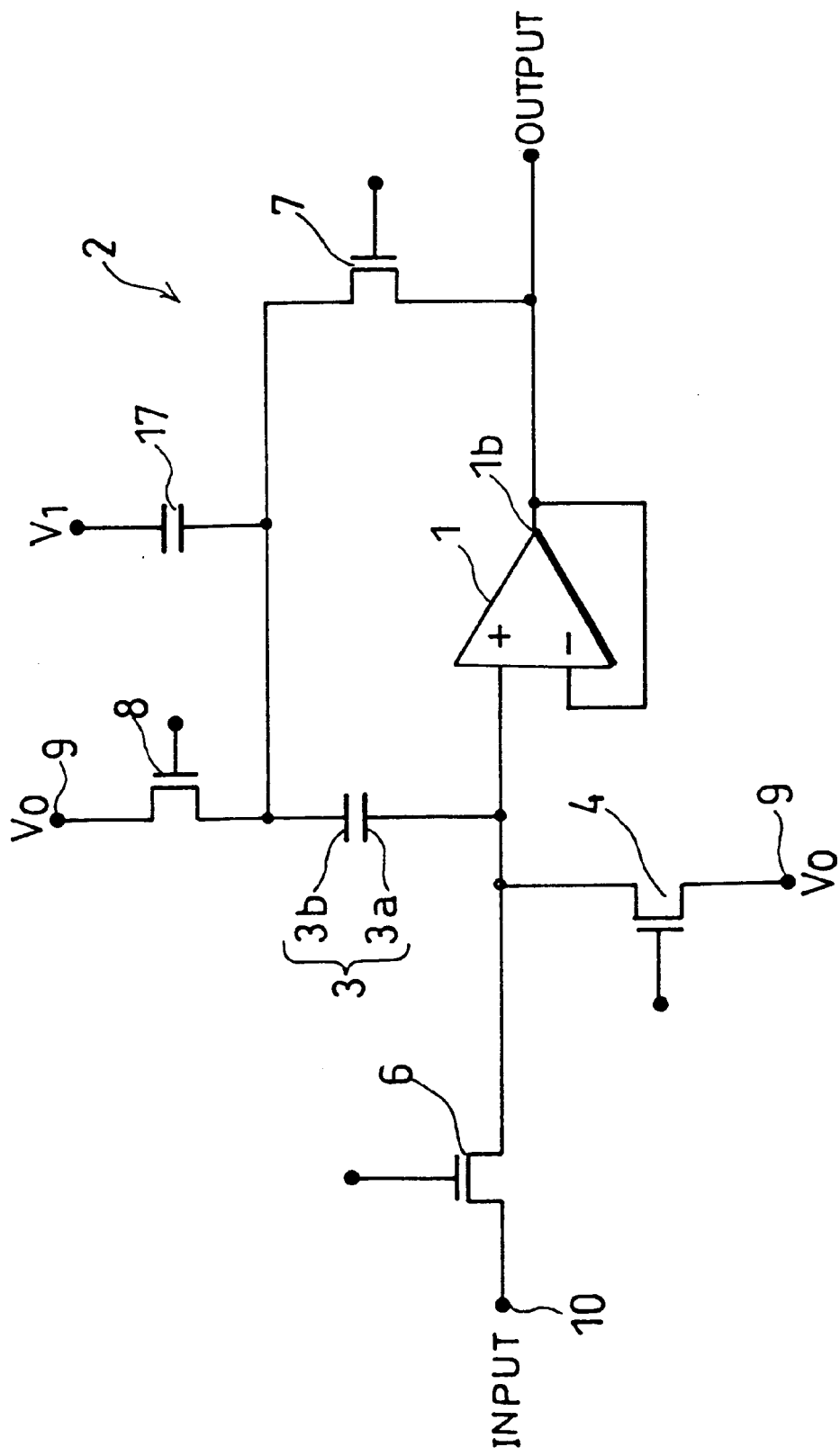

The third example of the signal amplifier circuit will be explained below in reference to FIG. 8.

In the signal amplifier circuit of this example, the switching element 5 of the first example is not provided. Instead, a condenser 17 (third condenser) for holding an output voltage from the buffer amplifier 1 is additionally provided. The electrostatic capacity of the condenser 17 is set significantly larger than that of the condenser 3. Switching elements 4 and 6–8 are respectively controlled by control signals 4a and 6a-8a from the control means (not shown) according to a timing chart of FIG. 9.

At $t_1$, the control signals 4a and 7a are High level, and the control signals 6a and 8a are Low level. Thus, the switching elements 4 and 7 are set ON, and the switching elements 6 and 8 are set OFF.

For this reason, the reference voltage $V_0$ is applied to the input terminal 1a of the buffer amplifier 1 through the switching element 4. The output voltage ($V_0+ΔV$) of the buffer amplifier 1 is applied to the condenser 17 through the switching element 7. As a result, the condenser 17 is charged, and the potential of the electrode 3b of the condenser 3 becomes the output voltage ($V_0+ΔV$) of the buffer amplifier 1 when the reference voltage $V_0$ is inputted. Then, the offset voltage ΔV is canceled out using the voltage ($V_0+ΔV$) held in the condenser 17. Other than the above, the signal amplifier circuit of this example has the same configuration as the previous example.

Figure 9:
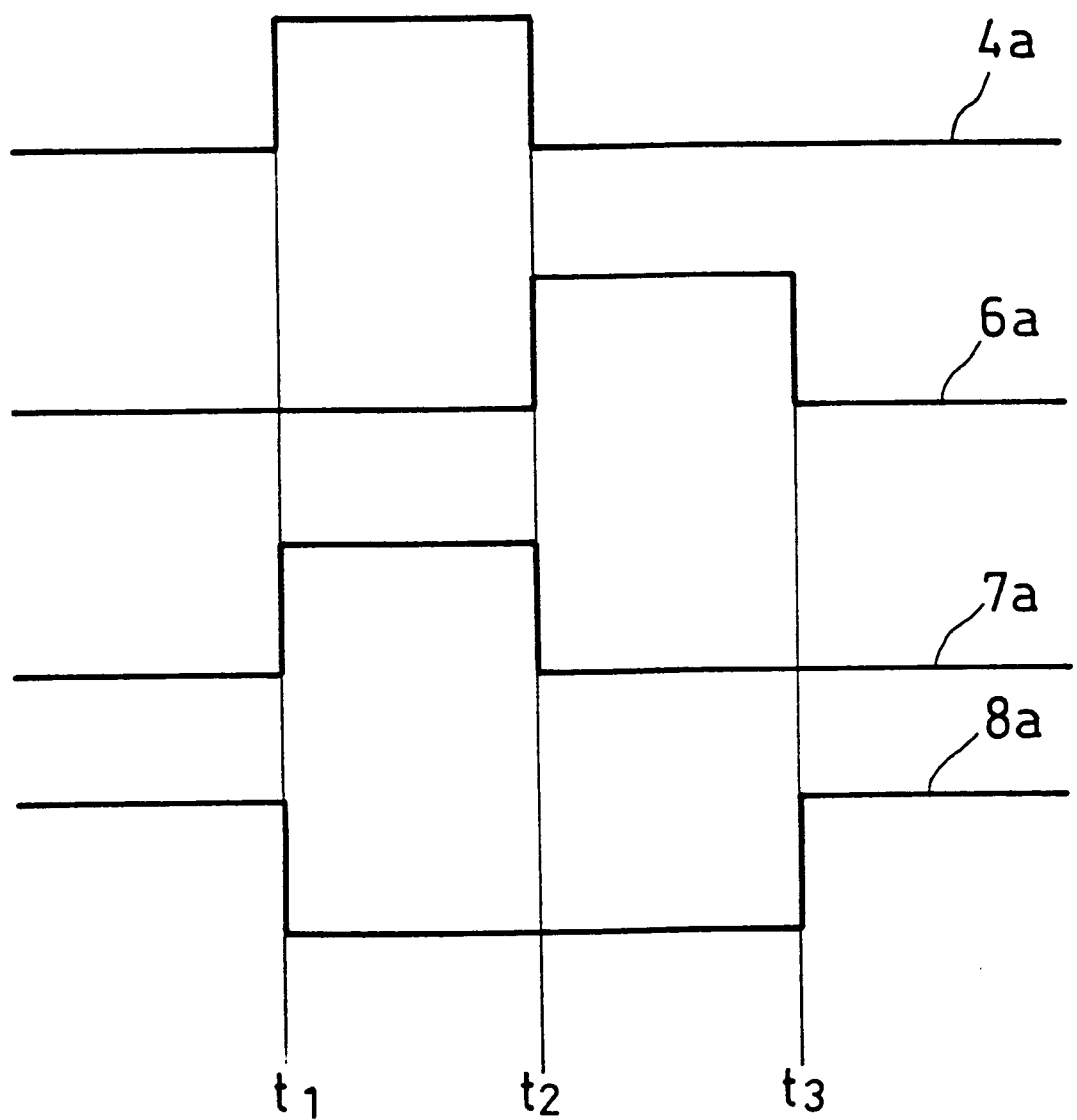

In the signal amplifier circuit of this example, a time required for canceling the offset voltage ΔV is ($t_3−t_1$) shown in FIG. 9.

In the present embodiment, the reference voltage $V_0$ is not specified as long as it falls within a range where the linearity of the buffer amplifier 1 is ensured. However, it is preferable to set to a mid-value of a range of the input signal level of the signal amplifier circuit. As a result, the non-linearity of the buffer amplifier 1 can be minimized, thereby achieving an accurate signal amplifier circuit. Moreover, because a change in the output from the buffer amplifier 1 in a period required for adjusting the offset voltage ΔV can be suppressed evenly, the time required for it can be reduced, and since a voltage applied to the condensers 3, 16 and 17 or switching elements 4–8, 14, 15, 21 and 22 become smaller, a transient leak current generated at respective rise and fall of the control signals 4a–8a can be suppressed.

A constant voltage $V_1$ to be applied to an electrode of the condenser 16 on the other side of the switching element 15 and a constant voltage $V_1$ to be applied to an electrode of the condenser 17 on the other side of the switching element 7 are not specified as long as they are constant. However, for the reasons above, the constant voltage $V_1$ are preferably set to a mid-value of a range of the input signal level of the signal amplifier circuit.

In the above examples, respective internal capacities of switching elements 4, 5 . . . and parasitic capacities of wires are preferably selected to be significantly smaller than the electrostatic capacity of the condenser 3 in order to surely cancel out the offset voltage ΔV.

For each switching element 4, 5, . . . , N-channel or P-channel MOS (metal oxide semiconductor) transistor, or a complementary MOS (CMOS) transistor switch composed of a N-channel MOS and a P-channel MOS connected in parallel may be used. The N-channel MOS transistor and the P-channel MOS transistor, respective waveforms of gate electrodes when opening and closing a switch have phases opposite to one another. Therefore, by adopting the CMOS transistor switch, a potential shift due to the parasitic capacity between the gate electrode and the source electrode can be eliminated. For the above reason, a more accurate signal amplifier circuit can be achieved by adopting the CMOS transistor switch.

In the above preferred examples, the condensers 3, 16 and 17 are used for holding a voltage. However, the present invention is not limited to this. For example, other kinds of analog memory means or digital memory means of a plurality of bits may be used. For the analog memory means, a condenser provided between metal wiring layers or between the metal wiring layer and a semiconductor layer may be used. For the digital memory means, other than those having the same configurations as the analog memory means (condenser), a logic circuit such as a flip-flop may be used.

As an application example of the signal amplifier circuit, a liquid crystal display of an active-matrix drive system adopting the signal amplifier circuit will be explained below.

As shown in FIG. 10, the liquid crystal display is composed of drive circuits 51 and 52 (first and second drive means), a display 53 composed of display cells arranged so as to form a matrix and a timing signal generating circuit 54 (i.e., a clock signal and control signals 5$a$, 6$a$, . . . ) provided for controlling the drive circuits 51 and 52. The timing signal generating circuit 54 may be formed on the substrate whereon the display 53 is formed or on a substrate separately provided separately from the display section 53.

Figure 11:
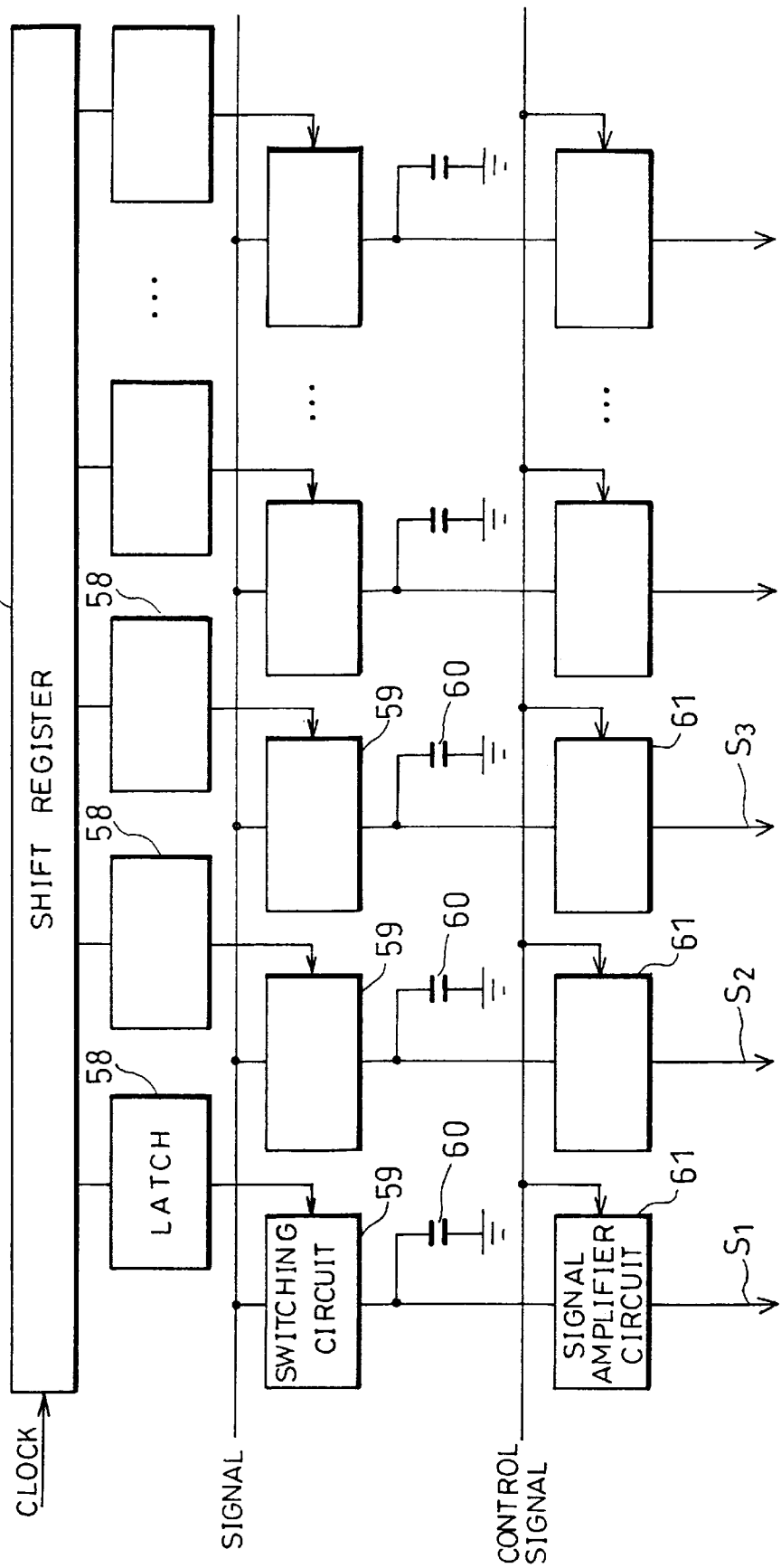

The drive circuit 51 samples a video signal in synchronous with the timing signal and sends a voltage obtained by sampling as data over the data signal line $S_j$ (FIG. 11). The drive circuit 52 selects a scanning signal line $G_j$ in order (FIG. 12), and data on the data signal line $S_j$ is sent to a display cell of the display 53.

As shown in FIG. 11, an analog driver of line-sequential drive system which serves as the drive circuit 51 is composed of a shift register 57, a plurality of latches 58, a plurality of switching circuits 59, a plurality of condensers 60 and a plurality of signal amplifier circuits 61. Here, it is possible to omit latches 58.

Figure 12:
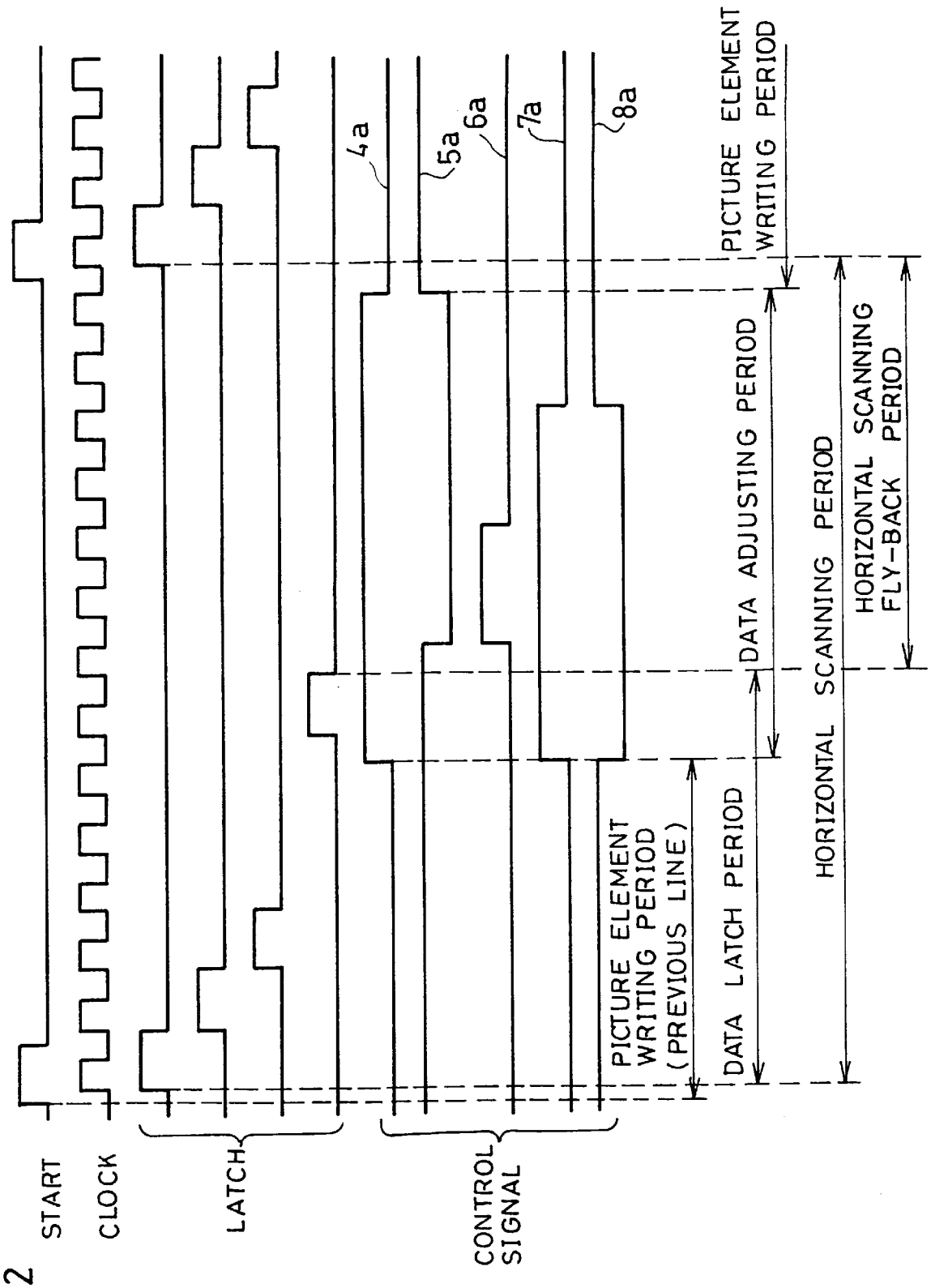

As shown in FIG. 12, the shift register 57 sends a signal over latches 58 in order in synchronous with a clock signal. Each latch 58 holds a signal from the shift register 57 and shifts a signal level if necessary. Each switching circuit 59 is set ON by a signal from the latch 58, and the level of a video signal at that time is sampled by the condenser 60 as data. In the described manner, data of an effective horizontal scanning period, i.e., data of the same number as the number of picture elements in a lateral direction are held in a plurality of condensers 60 respectively.

As described, the signal amplifier circuit 61 is provided with the buffer amplifier 1 and the adjusting means 2 for canceling an offset voltage ΔV of the buffer amplifier 1. Additionally, in the case of a liquid crystal display, the adjusting means 2 also has a function for holding data. The data from respective condensers 60 are read in the signal amplifier circuit 61 using a control signal at one time within the horizontal blanking period. However, an adjustment of the offset voltage ΔV including the process for reading-in the data is carried out either only in the horizontal blanking period or both the horizontal blanking period and the period directly before the horizontal blanking period using the control signal. When the offset voltage ΔV is adjusted in the horizontal blanking period and the period directly before and after the horizontal blanking period, although a sufficient time for the adjustment can be ensured, a period for outputting the video signal to the data signal line $S_j$ may be shortened. However, this would not be a problem because the line-sequential drive system offers a long writing time.

According to the signal amplifier circuit 61 of the present embodiment, even if the offset voltage ΔV of the buffer amplifier 1 is generated, a voltage V of the same level as an input signal V can be sent over the data signal line $S_j$. As a result, a high quality image display can be ensured, thereby permitting a display 53 of a larger size.

In the above arrangement, an adjustment of an offset voltage ΔV is carried out in every horizontal blanking period. Therefore, even if the offset voltage ΔV fluctuates due to a change in operation environment (temperature change, etc.) of the liquid crystal display device, or changes in various characteristics of the signal amplifier circuit 61 as time passes, the offset voltage ΔV can be surely eliminated.

In the above liquid crystal display, a single shift register 57 has been used. However, the present invention is not limited to this. For example, n numbers of shift registers connected in parallel may be used. In this case, a sampling period will be n times of that using a single shift register 57. Namely, a sufficient sampling time can be ensured.

The drive circuits 51 and 52 and the display 53 may be formed on different substrates. However, by forming either one of the drive circuits 51 and 52 or both of the drive circuits 51 and 52 on the substrate whereon the display is formed, a liquid crystal display wherein the drive circuits 51 and 52 are the display 53 are integrated can be achieved.

A single crystal silicon thin film transistor or polycrystalline silicon thin film transistor has its carrier mobility ten times as high as the amorphous silicon thin film transistor, and thus it is suited for the drive circuits 51 and 52. Therefore, the substrate is preferably arranged such that a single crystal silicon thin film or polycrystalline thin film is formed on a transparent substrate. In the above thin film transistors, since the respective substrates are in the floating potential state, the substrates do not affect the threshold voltage, etc. Therefore, in the transistor for transferring a video signal, the above feature is beneficial because it is not necessary to consider a drop in the potential of a signal due to a rise in the threshold voltage.

The liquid crystal display of the present embodiment permits a high quality image display. Therefore, it is suitable not only for display an analog data (a video signal having a successive level change) but also for displaying a video signal having discrete level (digital data) corresponding to the multiple gradation (above 4 gradations).

In the above preferred embodiment, the liquid crystal display has been explained as an application example of the signal amplifier circuit. However, the use of the signal amplifier circuit of the present invention is widespread. For example, it is applicable to an image display device such as a CRT (cathode-ray tube) display, VF (vacuum fluorescent) display, plasma display, EL (electroluminescence) display, etc.

Furthermore, the use of the signal amplifier circuit of the present embodiment is not limited to the image display device. It is also applicable to various devices adopting a buffer amplifier. By replacing the buffer amplifier with the signal amplifier of the present embodiment, excellent buffer characteristics can be achieved.

The following descriptions will discuss another embodiment of the present invention in reference to FIG. 13 through FIG. 29. A signal amplifier circuit of the present embodiment has a gain of not less than one, in contrast to the signal amplifier circuit of the previous embodiment that has a gain of one.

First, a signal amplifier in accordance with the present embodiment of the present invention will be explained in reference to FIG. 13 through FIG. 19.

Figure 13:
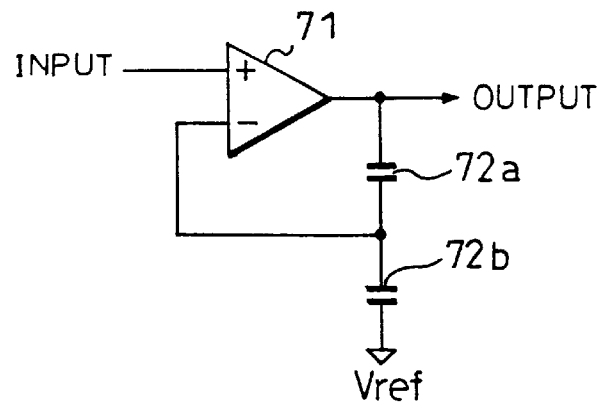
FIG. 13 is a block diagram showing a configuration of a feedback noninverting signal amplifier in accordance with the present invention.

As shown in FIG. 13, a feedback noninverting signal amplifier circuit in accordance with the present embodiment includes an operational amplifier 71 and condensers 72a and 72b (eleventh and twelfth condensers). The condenser 72a is connected across an inverting input terminal and an output terminal of the operational amplifier 71, and the condenser 72a is connected across the inverting input terminal and an external constant voltage source. An input signal is input to a noninverting input terminal, and an output signal is outputted from the output terminal of the operational amplifier 71.

In the described arrangement, an input signal is inputted to the noninverting input terminal. A difference in voltage between a potential of the output terminal and a potential of the inverting input terminal, i.e., a voltage applied to the condenser 72a and a difference in potential between a potential of the inverting input terminal and a potential Vref of a constant voltage source, i.e., a voltage to be applied to the condenser 72b are anti-proportional to capacitances Ca and Cb of the condensers 2a and 2b, which gives the relationship given by the following formula (1):

$$V_o = Vi \times (Ca+Cb)/Ca \quad (1)$$

wherein Vo is a voltage of an output signal when the potential Vref of the constant voltage source is a reference point, and Vi is a voltage of an input signal when the potential Vref of the constant voltage source is a reference point.

From the formula (1), it can be seen that a gain of the signal amplifier of the present embodiment is determined by capacitances Ca and Cb. Namely, by altering the capacitances Ca and Cb of the condensers 72a and 72b, a gain can be set as desired.

Figure 14:
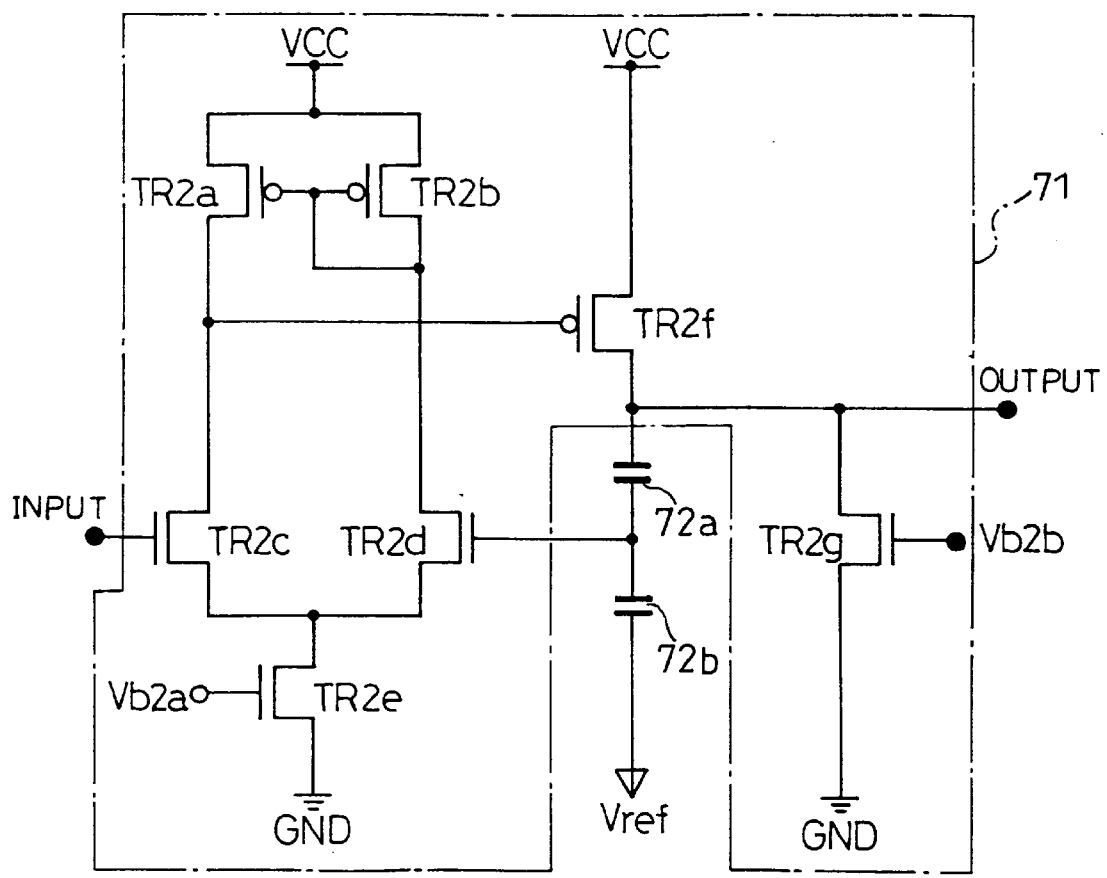
FIG. 14 is a circuit diagram showing an example of the noninverting signal amplifier of FIG. 13.

FIG. 14 shows an example of a noninverting signal amplifier circuit.

The equation given by the formula (1) holds good with accuracy when satisfying the following conditions: Both the potential of the output terminal and the potential of the inverting input terminal of the operational amplifier 71 directly before inputting the input signal to the noninverting input terminal are equivalent to the potential Vref of the constant voltage source directly before the input signal is inputted to the noninverting input terminal, and the potential of the inverting input terminal does not change due to a leakage of charge, etc. For this reason, it is desirable that the inverting input terminal is short-circuited to the output terminal and the voltage terminal of the constant voltage source.

Figure 15:
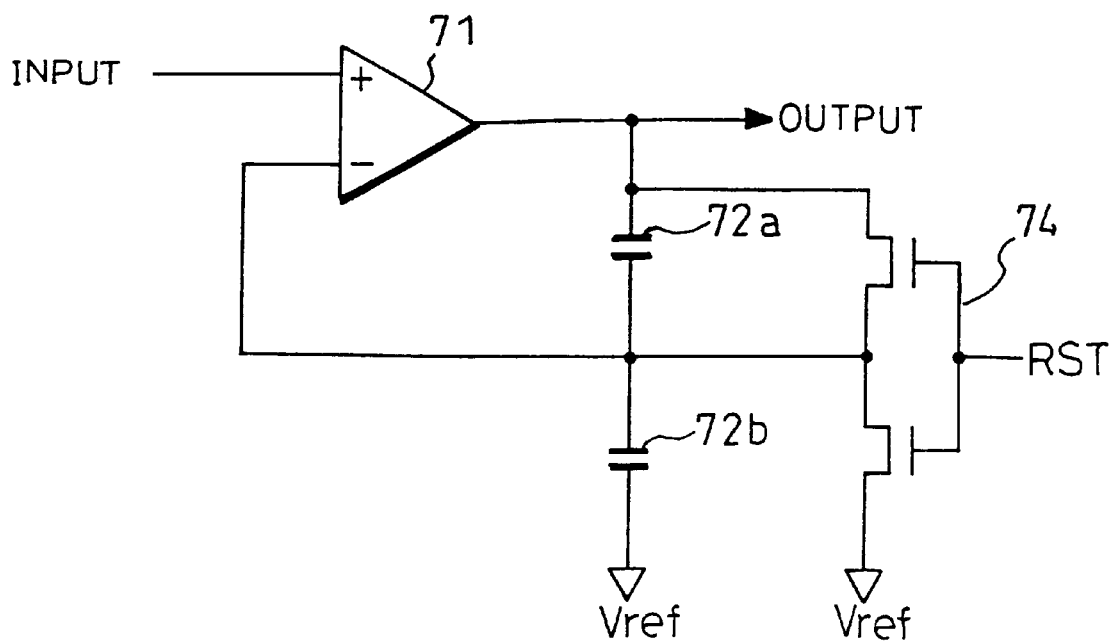
FIG. 15 is a circuit diagram showing an example of a device for shorting an inverting input terminal of the noninverting signal amplifier of FIG. 13 between an output terminal and a voltage terminal of a constant voltage source.
Figure 16:
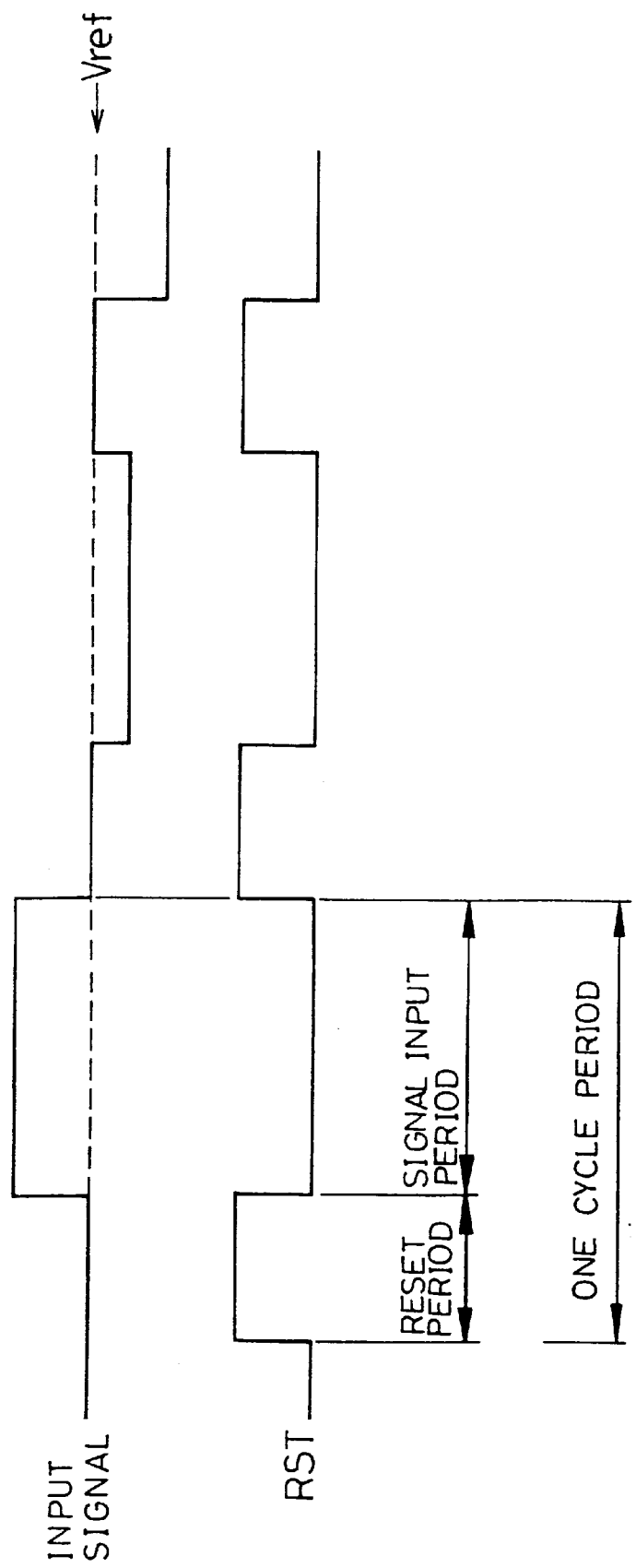
FIG. 16 is a waveform chart showing a signal to be inputted to the noninverting signal amplifier of FIG. 15.

This can be achieved, for example, as shown in FIG. 15, by providing a switching element 74 for resetting the potential of the inverting input terminal and the potential of the output terminal to the potential Vref of the constant voltage source, which is set ON by a reset signal RST to be inputted at every predetermined period. Especially, when the input signal is inputted at every predetermined period (one-cycle period), as shown in FIG. 16, it is effective that a reset period is set directly before the input signal is inputted to reset the potential of the inverting input terminal.

In the signal amplifier of the present embodiment, the condensers 72a and 72b are used as elements for determining a gain, instead of resistances in the conventional signal amplifiers, because the condensers 72a and 72b enable more precise control of the gain of the signal amplifier as compared to the conventional signal amplifiers which set a gain based on resistors.

In the signal amplifier, fluctuations in values of resistors or condensers which control a voltage gain may cause a gain to be displaced from the set value. In general, the condenser offers more stable value in the semiconductor integrated circuit as compared to the resistors. This is because the resistor is associated with factors associated a crystallinity, a density of impurity and a degree of activation, etc., while the capacity value of the condenser is determined only by the stable factors of the thickness and dielectric constant of the insulating film.

Especially, when a signal amplifier composed of a thin film transistor is adopted, the crystallinity greatly fluctuates which causes an unstable resistance value, resulting in the problem that it is difficult to obtain a gain as desired. In addition, when the signal amplifier composed of a polycrystalline silicon thin film transistor is adopted, an instability of the resistance would become more remarkable, the advantageous characteristics of the arrangement of the present embodiment adopting the condensers 2a and 2b would be emphasized.

Figure 17:
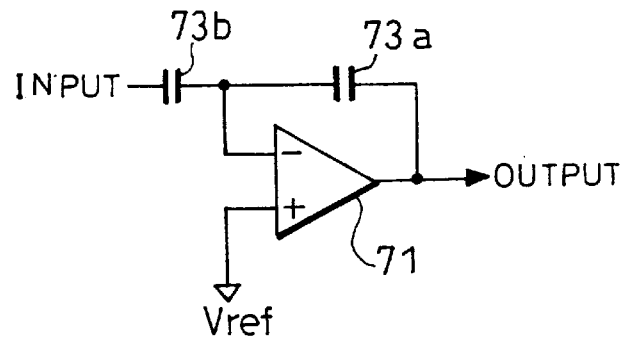
FIG. 17 is a block diagram showing a configuration of a feedback inverting signal amplifier in accordance with the present invention.
Figure 18:
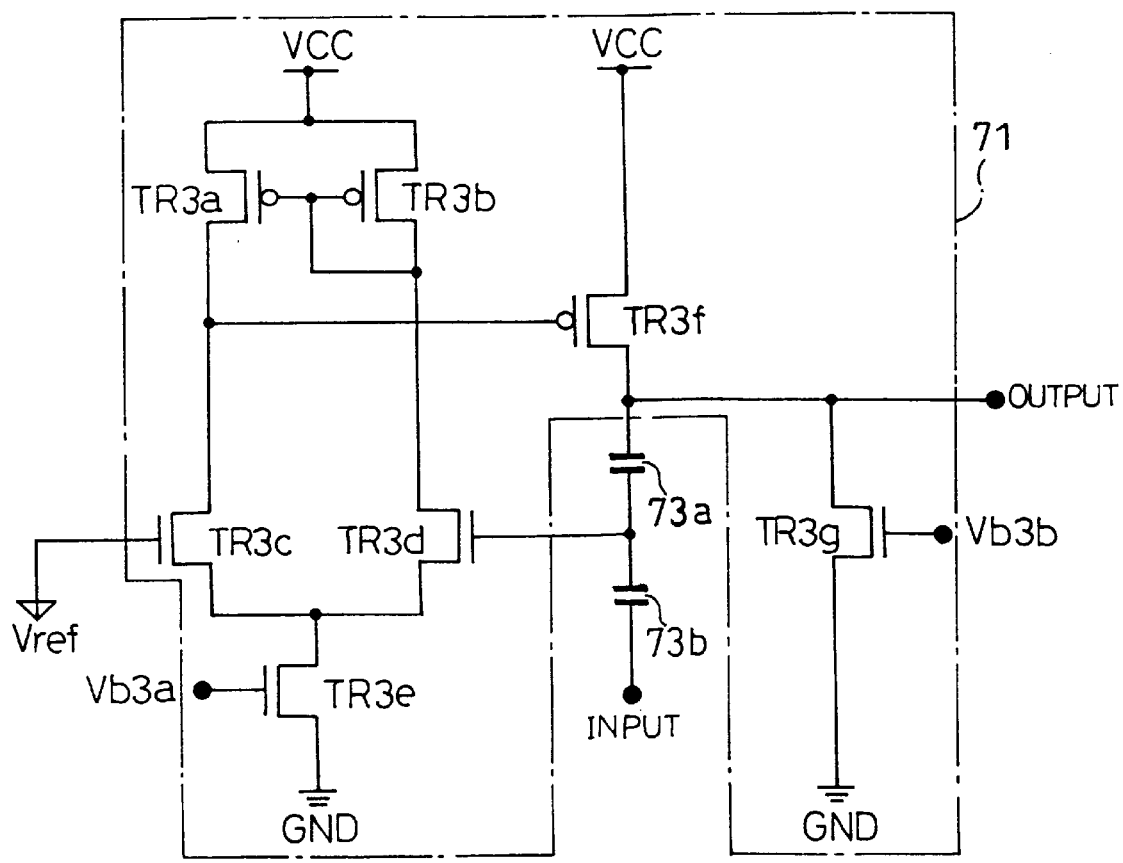
FIG. 18 is a circuit diagram showing an example of the inverting signal amplifier of FIG. 17.
Figure 19:
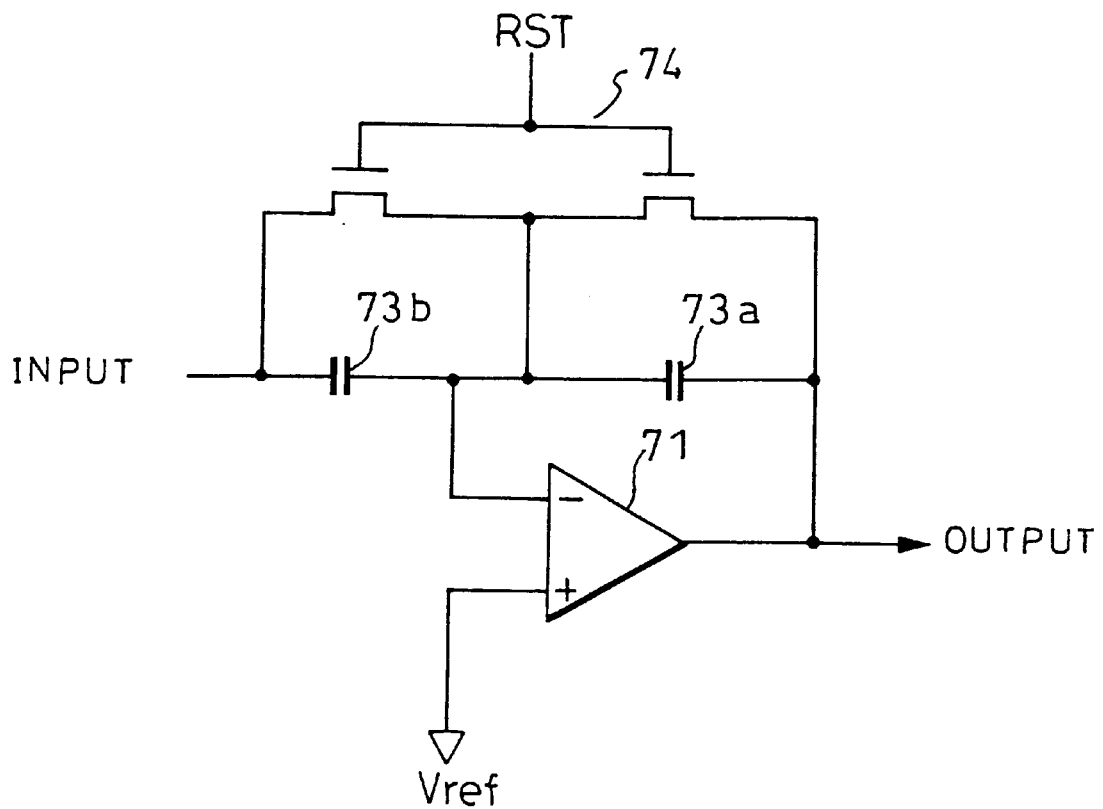
FIG. 19 is a circuit diagram showing an example of the device for short-circuiting the inverting input terminal of the inverting signal amplifier of FIG. 17 between an output terminal and an input signal source.

The following descriptions will discuss a feedback inverting signal amplifier in accordance with the present invention in reference to FIG. 17 through FIG. 19. For convenience in explanations, members having the same functions as the noninverting signal amplifier are designated by the same reference numbers and thus the descriptions thereof shall be omitted here.

As shown in FIG. 17, the signal amplifier is composed of an operational amplifier 71, condensers 73a and 73b (eleventh and twelfth condensers). The condenser 73a is connected across the inverting input terminal of the operational amplifier 71 and an output terminal of the operational amplifier 71, and the noninverting input terminal is connected to an external constant voltage source. The input signal is inputted into the inverting input terminal through the condenser 73b, and the output signal is outputted from the output terminal of the operational amplifier 71.

In the described arrangement, the input signal is inputted to the inverting input terminal through the condenser 73b. A difference in potential between the potential of the output terminal and the potential of the inverting input terminal, i.e., a voltage to be applied to the condenser 73a and a difference in potential between a potential of the inverting input terminal and a potential of the input signal source, i.e., a voltage to be applied to the condenser 73b are inverse-proportion to capacitances Ca and Cb of the condensers 73a and 73b, given by the following formula (2):

$$Vo = Vi \times Cb/Ca \quad (2)$$

wherein Vo and Vi are respectively the voltage of the output signal and the voltage of the input signal when using the potential Vref of the constant voltage source as a reference.

From the formula (2), it can be seen that a gain of the signal amplifier of the present invention is determined by capacitances Ca and Cb. In other words, by alternating the capacitances Ca and Cb of the condensers 73a and 73b, a gain can be set as desired.

FIG. 18 shows an example of inverting signal amplifier circuits.

The equation of the formula (2) holds good with accuracy when satisfying the following conditions:

(1) Both a potential of the output terminal of the operational amplifier 71 and a potential of the input signal source are equivalent to the potential of the inverting input terminal (=potential Vref of the constant voltage source) directly before inputting the input signal to the operational amplifier 71; and (2) the potential of the inverting input terminal does not change due to a leakage of charge, etc. For this reason, it is desirable that the inverting input terminal is short-circuited to the output terminal and the constant voltage source.

This can be achieved, for example, as shown in FIG. 19, by providing a switching element 74 for resetting the potential of the output terminal and the potential of the input signal source to the potential of the inverting input terminal. The switching element 74 is set ON by receiving a reset signal RST at each predetermined period. Especially, when the input signal is inputted at every predetermined period (one-cycle period), as shown in FIG. 16, it is effective to reset the potential of the inverting input terminal that a reset period is set directly before the input signal is inputted.

The inverting signal amplifier of the present embodiment offers more precise gain control for the same reasons as the aforementioned noninverting signal amplifier.

A signal amplifier circuit provided with an offset adjusting function in accordance with the present invention will be explained in reference to FIG. 20 through FIG. 28.

Figure 20:
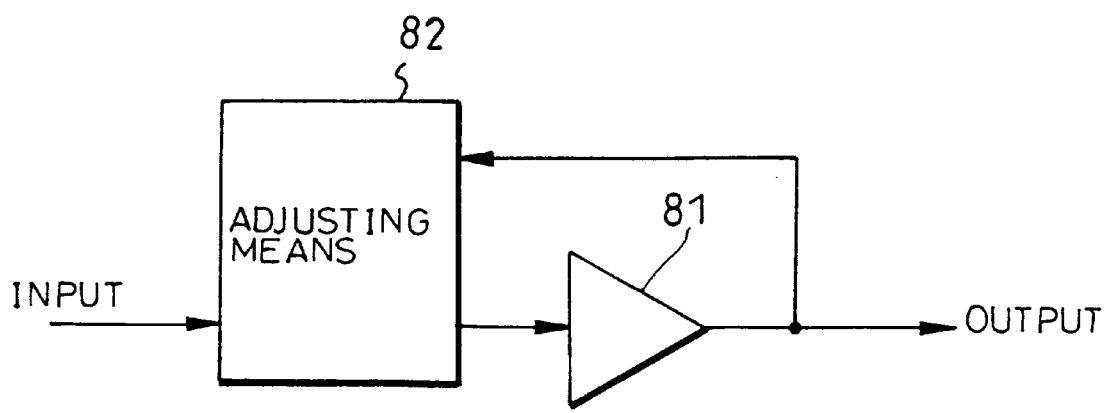
FIG. 20 is a block diagram showing a configuration of a signal amplifier provided with an offset adjusting function in accordance with the present invention.

As shown in FIG. 20, the signal amplifier circuit includes an amplifier 81 and adjusting means 82 for adjusting an offset voltage of the operational amplifier 81. Either of the noninverting-type and the inverting-type may be adopted for the operational amplifier 81. The operational amplifier 81 has a gain of not less than one different from the signal amplifier of the aforementioned example. For the amplifier 81, the above-mentioned inverting signal amplifier and noninverting signal amplifier are suitable. However, the amplifier 81 of the present invention is not limited to the above.

The adjusting means 82 inputs a reference voltage Vref to the operational amplifier 81, and detects a difference in voltage as an offset voltage $\Delta V$ between an output voltage (Vref+$\Delta V$) and a reference voltage Vref. When the noninverting amplifier 81 is adopted, a voltage (first signal voltage) given by subtracting the offset voltage $\Delta V$ from the voltage Vi of the input signal is inputted to the amplifier 81. On the other hand, when the inverting amplifier 81 is adopted, a voltage (first signal voltage) given by adding the offset voltage $\Delta V$ to the voltage Vi of the input signal is inputted to the amplifier 81.

As will be described later, the adjusting means 82 is composed of a plurality of switching elements and condensers, etc. Therefore, an internal parasitic capacity cannot be ignored. Especially, when adjusting the offset voltage $\Delta V$ by storing once an input signal, as the capacity of a charge amount is divided, not only the level of the voltage Vi of the input signal but also the detected offset voltage $\Delta V$ would be reduced. For example, when adopting the noninverting amplifier 81, the voltage Via (voltage of a compensating signal) to be inputted to the amplifier 81 is given by the following formula (3) when the voltage Vref is used as a reference, $$Via=(Vi-\Delta V)/M \qquad (3)$$

wherein M>1, and M is a parameter of an attenuation of a voltage due to a parasitic capacity, etc.

When the gain of the signal amplifier is 1, an voltage Vo of the output signal is given by the following formula (4), $$Vo=Via+\Delta V=(Vi/M)+((M-1)/M)\times\Delta V \qquad (4).$$

Therefore, an offset voltage cannot be completely canceled out.

In the signal amplifier circuit in accordance with the present invention, a gain of the amplifier 81 is set equivalent to parameter M (amplitude ratio of the first signal to the compensating signal). In this state, a voltage Vo of the output signal is given by the following formula (5), $$Vo=Via\times M+\Delta V=(Vi-\Delta V)+\Delta V=Vi \qquad (5)$$

Therefore, the offset voltage $\Delta V$ is completely canceled out, and an output signal of a voltage Vo equivalent of the voltage Vi of the input signal can be obtained.

The parameter M is determined by capacities of transistors, condensers, wires etc., which constitute a signal amplifier, and can be easily computed based on the configuration of the circuit, the layout pattern and the process parameter.

The signal amplifier circuit may be arranged so as to detect the offset voltage $\Delta V$ when it starts operating. However, in the case where an input signal is inputted at every predetermined period (in synchronous with a clock signal), it is preferable to carry out the detection at each clock.

By adjusting the offset voltage $\Delta V$ at each clock, even if the offset voltage $\Delta V$ fluctuates due to a change in operation environment (temperature change, etc.) of the signal amplifier circuit, or changes in various characteristics of the signal amplifier circuit as time passes, the offset voltage $\Delta V$ can be surely eliminated.

The beneficial characteristics of the signal amplifier having the described arrangement are appreciated in the case of adopting the signal amplifier composed of transistors on the monocrystal silicone substrate, however, those are more appreciated in the case of adopting the thin film transistor, especially, the polycrystalline silicone thin film associated with large fluctuation in its characteristics.

Figure 21:
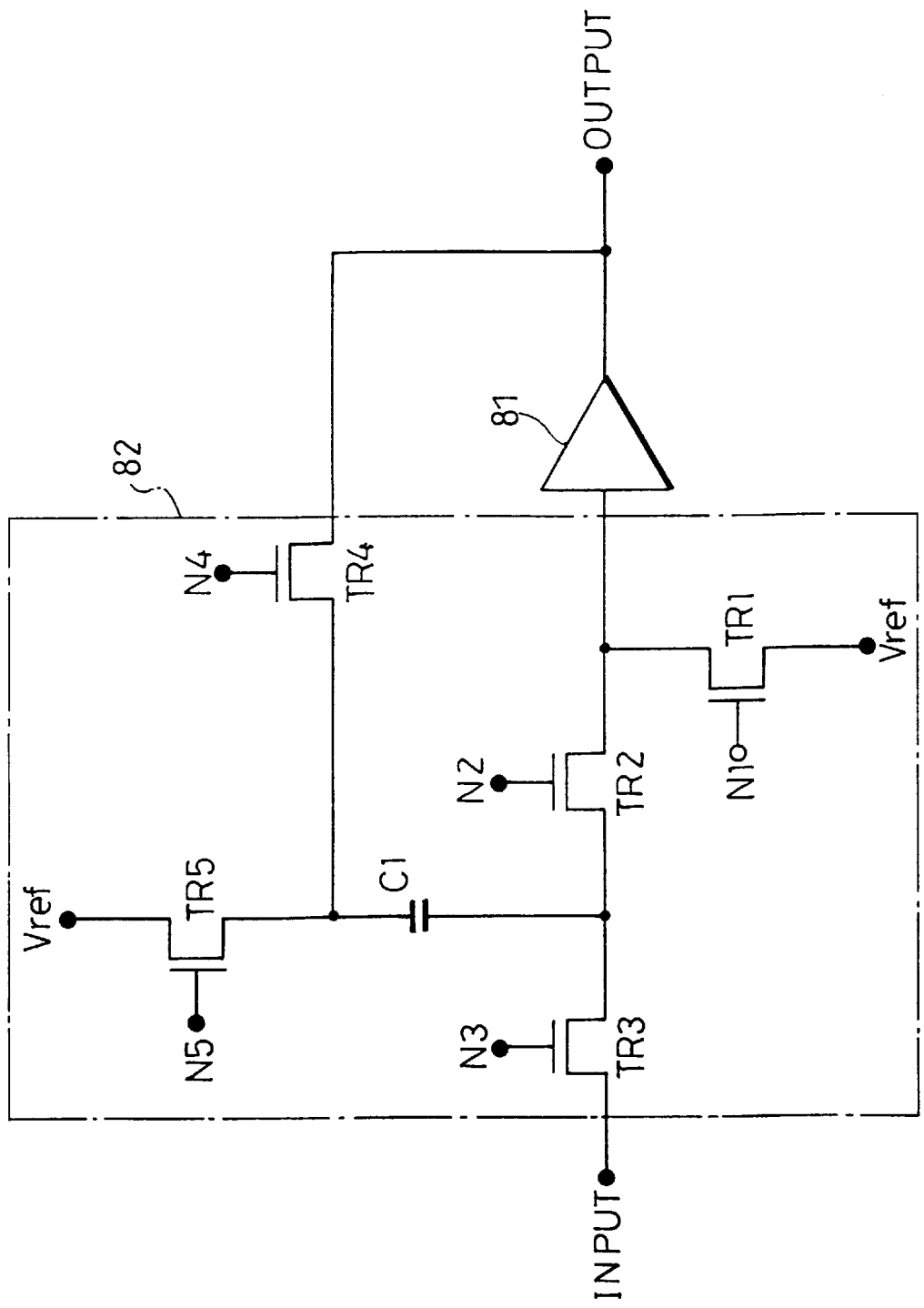
FIG. 21 is a circuit diagram showing an example of the signal amplifier of FIG. 20.

FIG. 21 shows an example of signal amplifier circuit provided with the offset adjusting function.

The adjusting means 82 of the signal amplifier circuit is composed of a condenser C1 (first condenser) and five switching elements TR1–TR5 (first through fifth switching elements). An input terminal of the amplifier 81 is connected to the reference voltage Vref through the switching element TR1, and is also connected to the first electrode of the condenser C1 through the switching element TR2. The first electrode of the condenser C1 is connected to the input terminal of the signal amplifier circuit through the switching element TR3. On the other hand, the second electrode of the condenser C1 is connected to the output terminal of the amplifier 81 through the switching element TR4 and is also connected to the reference voltage Vref through the switching element TR5. The basic configuration of the adjusting means 82 is the same as the adjusting means 2 shown in FIG. 2.

To stabilize of the signal level, a condenser of a small capacity may be added to the input terminal of the amplifier 81. This is effective when the parasitic capacity of the amplifier 81 and the switching elements TR1 and TR2 or the capacity of the wires are not sufficient to stabilize the signal level.

As mentioned earlier, for the amplifier 81, both the noninverting type and the inverting-type may be adopted. The amplifier 81 of the present embodiment has an offset voltage ΔV which is always constant within a certain input range. Namely, with a given input V, the output is given by (M×V+ΔV).

Figure 22:
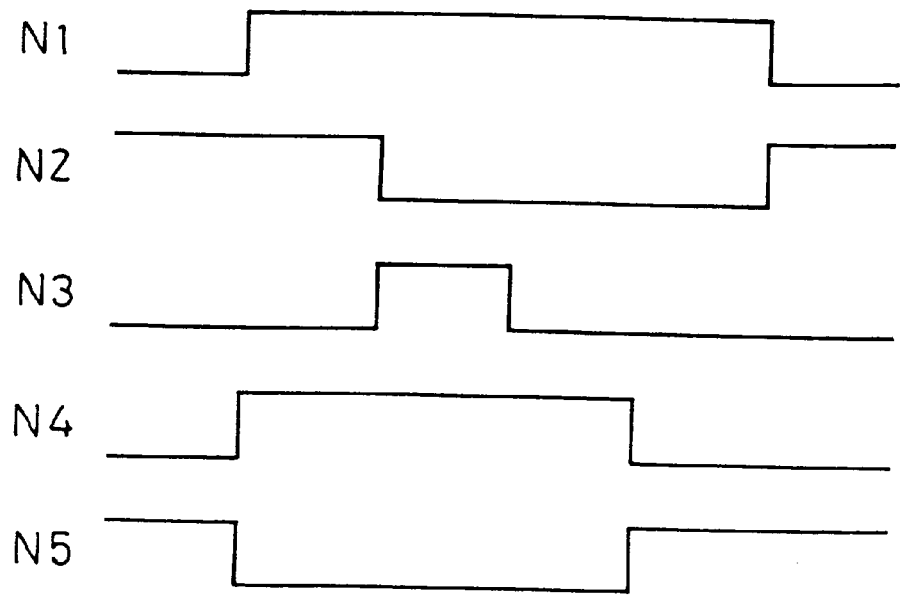
FIG. 22($a$) is a waveform chart of a control signal to be inputted to the signal amplifier provided with a noninverting amplifier among the signal amplifier of FIG. 21.
Figure 22:
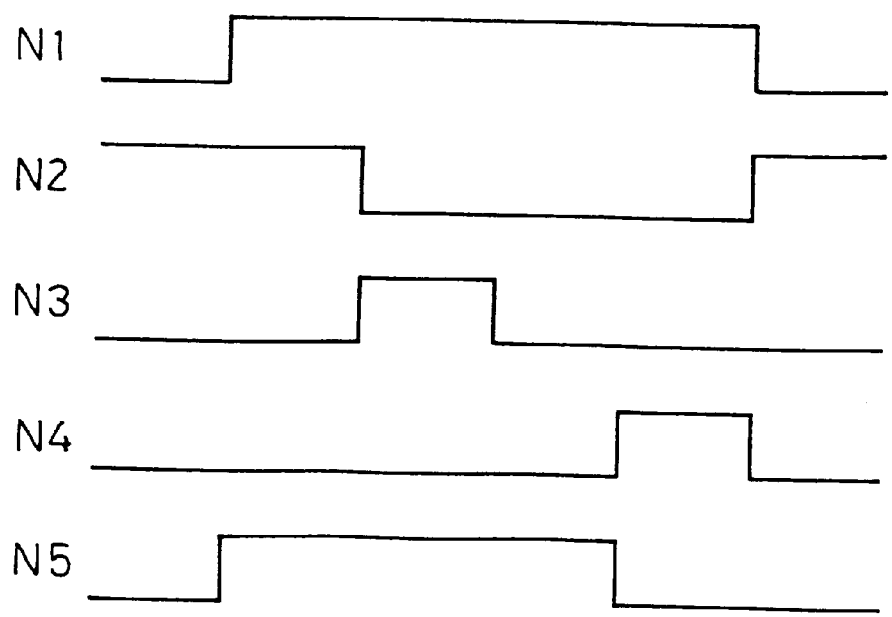

An operation of the signal amplifier circuit will be explained. FIG. 22(*a*) and FIG. 22(*b*) show a waveform of each control signal when driving the signal amplifier of FIG. 21. FIG. 22(*a*) is a waveform in the case of adopting the noninverting-type amplifier 81, and FIG. 22(*b*) is a waveform in the case of adopting the inverting amplifier 81.

FIG. 22(*a*) and FIG. 22 (*b*) show a waveform in the case of adopting the switching elements TR1–TR5 of the n-channel transistor. In contrast, in the case of adopting the switching elements TR1–TR5 of the p-channel transistors, a waveform of an inverting phase would be obtained. In addition, to attain more accurate and effective charge transfer, it is preferable to adopt the switching elements TR1–TR5 of the CMOS structure (n-channel type transistor and p-channel type transistor are connected in parallel). In this case, control signals for the n-channel and p-channel are respectively required.

Although it is shown in FIGS. 22(*a*) and (*b*) that the rise of the waveform of a control signal and the fall of another control signal theoretically occur simultaneously. In practice, however, as a certain time is required for a change in level of the control signal, it is preferable to slightly lag the rise of the control signal to prevent the rise and fall from being superimposed. This prevents a leakage of charge of the switching element, and offers a very accurate offset voltage adjustment. The described effects can be achieved also by the arrangements of the following presented preferred embodiments.

An operation of the noninverting amplifier 81 will be explained in reference to FIG. 22(*a*).

First, the switching element TR2 and the switching element TR1 conduct to reset the first electrode of the condenser C1 and the input terminal of the amplifier 81 to the reference voltage Vref. As a result, a voltage (Vref+ΔV) formed by shifting the level of an input voltage by the offset voltage of the amplifier 81 is outputted to the output terminal of the operational amplifier 81. In this state, as the switching element TR5 cuts off, and the switching element TR4 conducts, the output voltage (Vref+ΔV) is applied to the second electrode of the condenser C1.

Then, the switching element TR2 cuts off and the switching element TR3 conducts to write, for example, video data (voltage Vi of the input signal) in the first electrode of the condenser C1.

The switching element TR3 is then cuts off, and subsequently the switching element TR4 cuts off and the switching element TR5 conducts, to reset the second electrode of the condenser C1 to the reference voltage (Vref). In this state, the potential of the first electrode of the condenser C1 is (Vi−ΔV) which is shifted by the level of the potential by a change in potential (−ΔV) of the second electrode of the condenser C1.

The switching element TR1 then cuts off, and the switching element TR2 conducts, thereby applying a video data (Vi−ΔV) obtained by shifting a level of the voltage of the input video data by an offset level to the input terminal of the operational amplifier 81.

If the parasitic capacity of each of the switching elements TR1 through TR5 and wires are small enough, the effect on the data (charge amount) stored in the condenser C1 would be negligible, and the input voltage to the amplifier 81 would be (Vi−ΔV). In practice, however, due to a parasitic capacity, the input voltage would be reduced to 1/M, i.e., (Vi−ΔV)/M. By inputting the signal voltage to the amplifier 81 having an offset voltage ΔV and a gain M, the offset voltage ΔV is canceled, and a signal (Vo) of the same voltage as input video data (voltage Vi of the input signal) is outputted to the output terminal.

Figure 40:
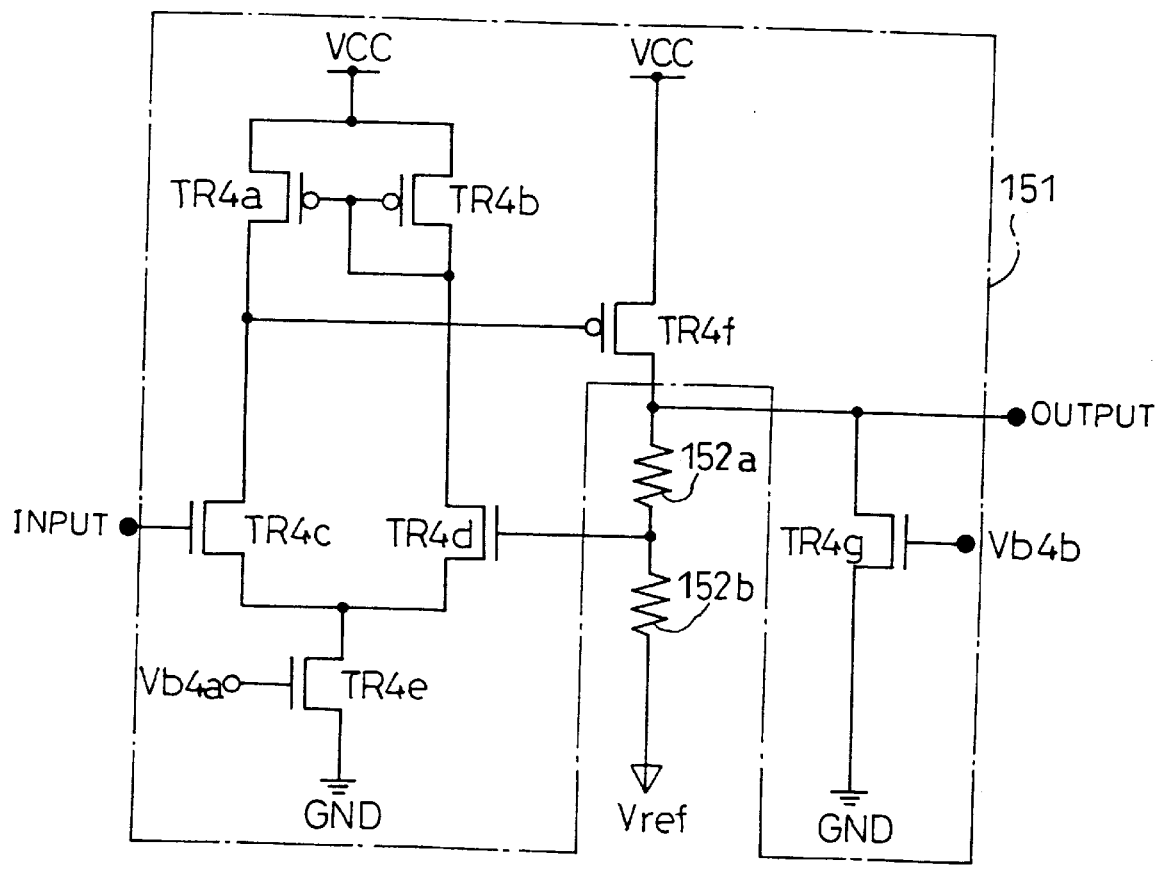
FIG. 40 is a circuit diagram showing an example of the noninverting signal amplifier of FIG. 39.
Figure 41:
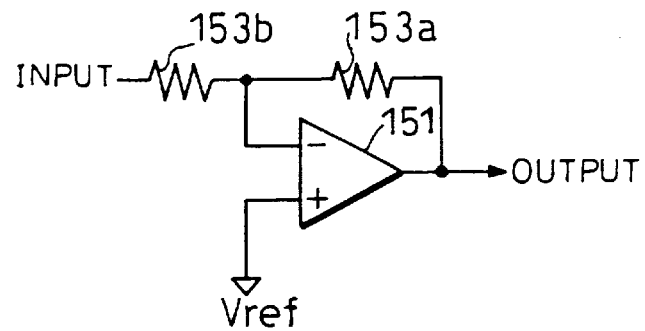
FIG. 41 is a block diagram showing an example of an inverting signal amplifier having a gain of not less than one for use in a data signal line drive circuit.

For the amplifier 81, the previously described noninverting signal amplifier shown in FIG. 13 may be adopted. However, the present invention is not limited to this, and noninverting signal amplifiers of any arrangement such as the noninverting signal amplifier shown FIG. 40 as prior art may be used. This is also true for the preferred embodiments to be presented later.

An operation of the noninverting operational amplifier 81 will be explained in reference to FIG. 22(*b*).

First, the switching element TR2 and the switching element TR1 conducts to reset the first electrode of the condenser C1 and the input terminal of the operational amplifier 81 to the reference voltage Vref. As a result, the voltage (Vref+ΔV) obtained by shifting by the offset voltage of the amplifier 81 is outputted. Here, as the switching element TR4 cuts off, and the switching element TR5 conducts, the reference potential Vref is applied to the second electrode of the condenser C1.

Next, the switching element TR2 cuts off, and the switching element TR3 conducts to write the video data (Vi) in the first electrode of the condenser C1. The switching element TR3 then cuts off, and subsequently the switching element TR5 cuts off and the switching element TR4 conducts to set the second electrode of the condenser C1 to the output potential (Vref+ΔV) of the amplifier 81. Here, the potential of the first electrode of the condenser C1 is a value (Vi+ΔV) obtained by shifting by a potential change (ΔV) of the second electrode of the condenser C1.

Thereafter, the switching elements TR1 and TR4 cuts off, and the switching element TR2 conducts, thereby applying the video data (Vi+ΔV) obtained by shifting a level of the input video data by an offset voltage to the input terminal of the operational amplifier 81.

If the parasitic capacities of the switching elements TR1–TR5 and the wires are small enough, the effect on the data stored in the condenser C1 would be negligible, and the input voltage to the operational amplifier 81 would be theoretically given by (Vi+ΔV). In practice, however, the input voltage is reduced by 1/M due to a parasitic capacity to be (Vi+ΔV)/M. By inputting the signal voltage to the inverting amplifier 81 having an offset voltage ΔV and a gain M, the offset voltage is canceled, and the signal (−Vo) of the same voltage having an opposite polarity to the input video data (Vi) with a given a reference voltage Vref is outputted to the output terminal.

Figure 42:
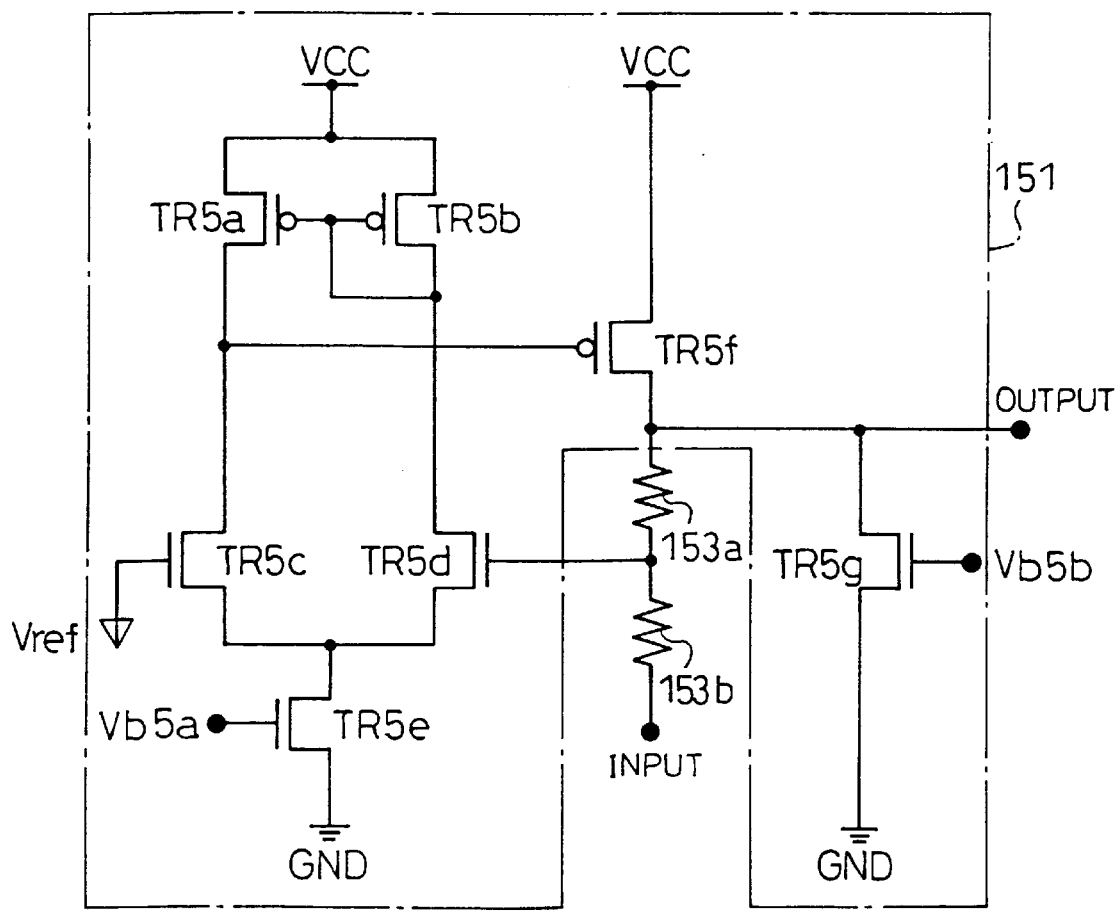
FIG. 42 is a circuit diagram showing an example of the inverting signal amplifier of FIG. 41.

For the amplifier 81, the inverting signal amplifier of FIG. 17 may be used. However, the present invention is not limited to this, and the inverting signal amplifier of various configuration including the inverting signal amplifier of FIG. 42 as prior art may be used. The same can be said for the preferred embodiments to be presented later.

In the signal amplifier circuit (including signal amplifier circuits to be described later), a certain time is required for adjusting the offset voltage ΔV. This time required for the adjustment of the offset voltage can be made shorter by lightening the load of the amplifier 81. Because in the adjusting period, the longest time is required for stabilizing the output voltage (Vref+ΔV) of the amplifier 81. Especially, when the level of the input signal before adjusting the offset voltage greatly differs from the reference voltage Vref, a long time is required.

Specifically, as shown in FIG. 23, to the output terminal of the amplifier 81, a switching element TR8 (eighth switching element) may be added for applying the reference voltage Vref to the output terminal of the amplifier 81. The ON resistance of the switching element TR8 is selected to be sufficiently small, so by conducting the switching element TR8 directly before inputting the reference voltage Vref to the input terminal of the amplifier 81, an output terminal of a large capacitive load can be charged.

Figure 24:
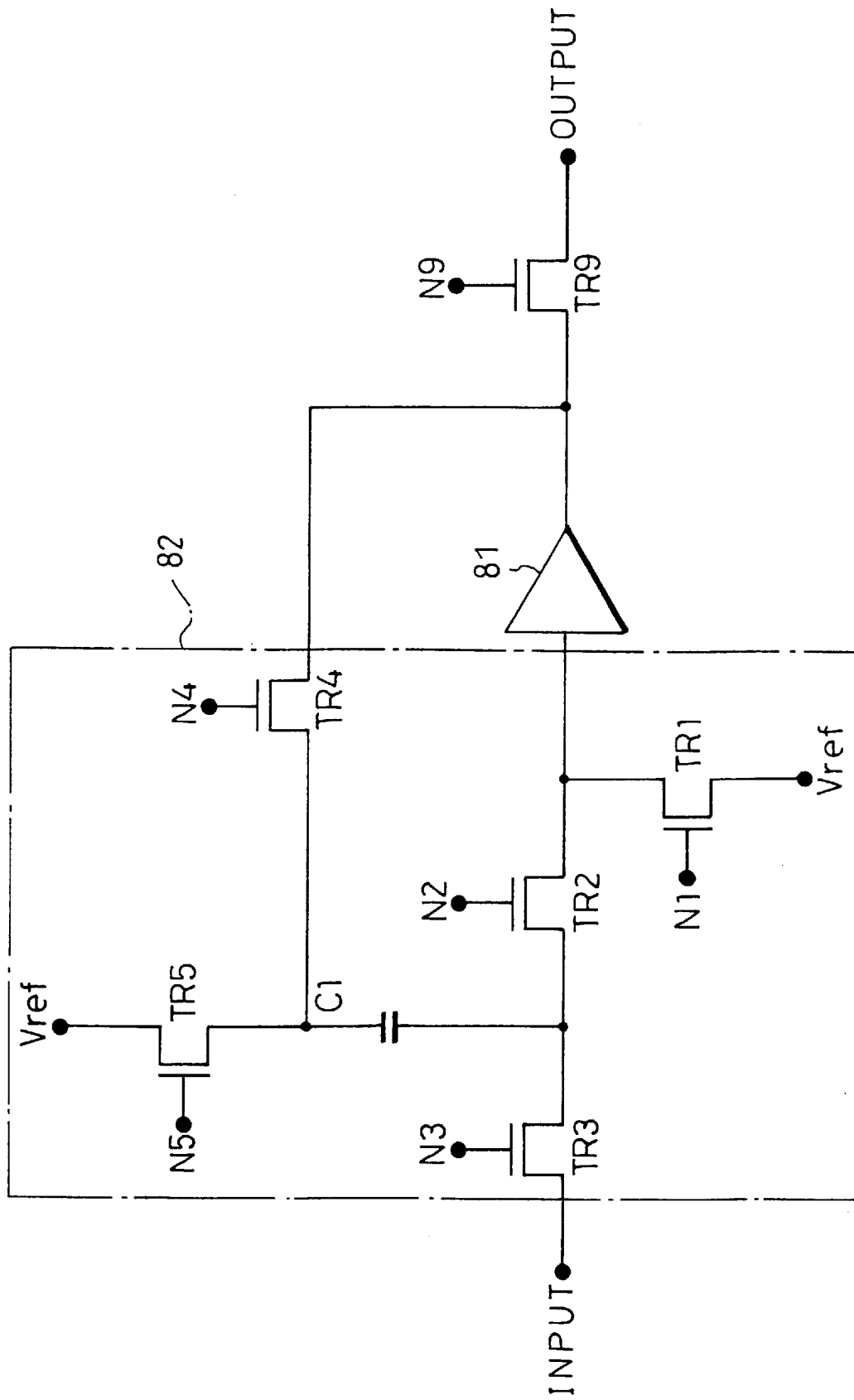
FIG. 24 is a circuit diagram showing the signal amplifier of FIG. 21 which is additionally provided with a switching element for separating a load from an output terminal.

Alternatively, as shown in FIG. 24, the switching element TR9 (ninth switching element) is formed next to the output terminal of the amplifier 81, and in the period in which an output signal is not outputted, it may be effective to isolate the load.

Figure 25:
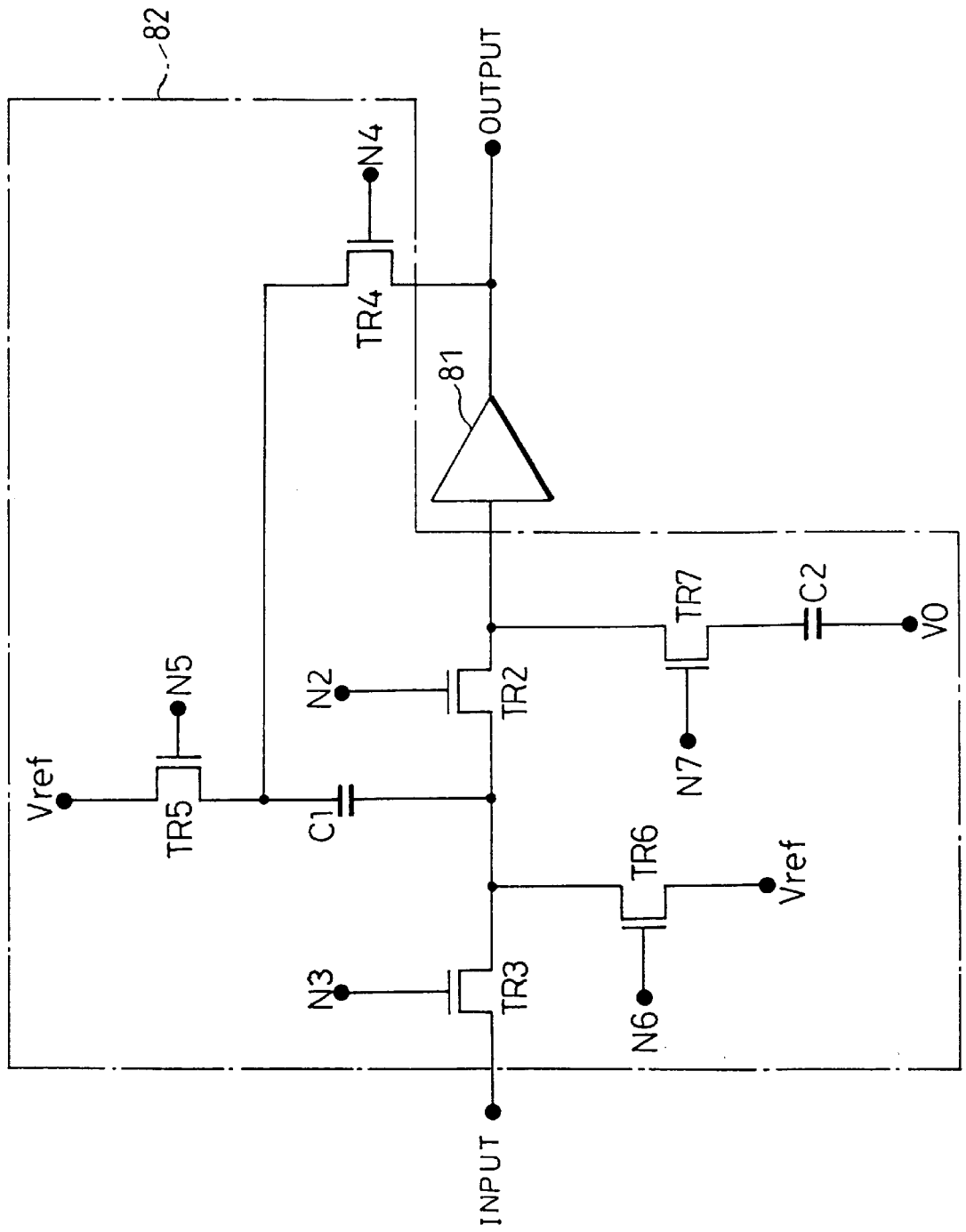
FIG. 25 is a circuit diagram showing another example of the signal amplifier of FIG. 20.
Figure 26:
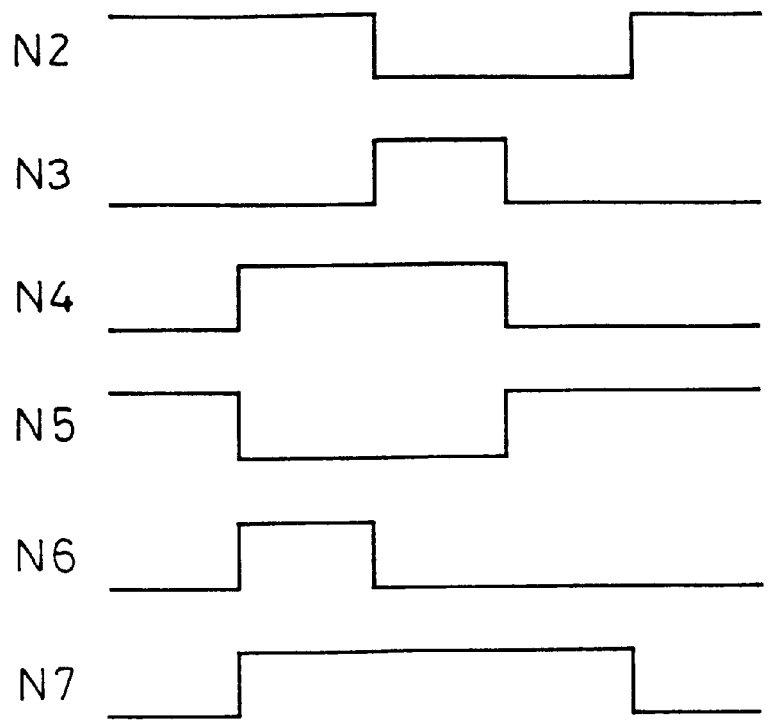
FIG. 26($a$) is a waveform chart of a control signal to be inputted to a signal amplifier provided with a noninverting amplifier among the signal amplifiers of FIG. 25.
Figure 26:
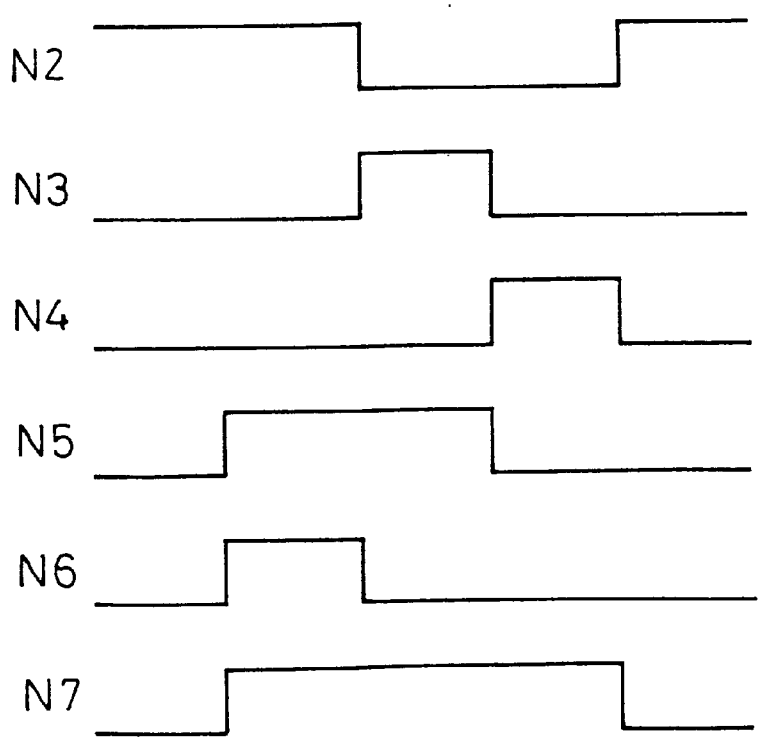

An example of the circuit configuration in accordance with another example of the signal amplifier circuit (FIG. 20) provided with the offset adjusting function is shown in FIG. 25.

The adjusting means 82 of the signal amplifier includes two condensers C1–C2 (first and second condensers) and six switching elements TR2–TR7 (second through seventh switching elements). In this signal amplifier circuit, the switching element TR1 is omitted from the signal amplifier (FIG. 21), and instead a switching element TR6 for applying a reverence voltage Vref to one electrode of the condenser C1 and a switching element TR7 for holding a potential of the input terminal of the amplifier 81 and a condenser C2 are added. Here, the voltage VO to be applied to the second electrode of the condenser C2 may be any voltage as long as it is constant.

In the described signal amplifier circuit, both the noninverting-type and the inverting-type may be adopted for the amplifier 81.

Next, operations of such signal amplifier circuit will be explained. FIG. 26(a) and FIG. 26(b) are waveform of each control signal for driving the signal amplifier circuit of FIG. 25. FIG. 26(a) is a waveform of the noninverting amplifier 81, and FIG. 26(b) is a waveform of the inverting amplifier 81.

Operations of the noninverting amplifier 81 will be explained in reference to FIG. 26(a).

First, the switching elements TR2, TR6 and TR7 conduct to reset the first electrode of the condenser C1 and the first electrode of the condenser C2 to the reference voltage Vref. As a result, to the output terminal of the amplifier 81, a voltage (Vref+ΔV) obtained by shifting an input voltage by the offset voltage of the amplifier 81 is applied. In this state, as the switching element TR5 cuts off, and the switching element TR4 conducts, the output voltage (Vref+ΔV) is applied to the second electrode of the condenser C1.

Nest, the switching elements TR2 and TR6 cuts off, and the switching element TR3 conducts to write the video data (Vi) in the first electrode of the condenser C1.

The switching element TR3 is then cuts off, and subsequently the switching element TR4 cuts off and the switching element TR5 conducts, thereby resetting the second electrode of the condenser C1 to the reference voltage (Vref). Here, the potential of the first electrode of the condenser C1 is at (Vi−ΔV) obtained by shifting an input data potential by the potential change −ΔV of the second electrode of the condenser C1.

Thereafter, the switching element TR7 cuts off, and the switching element TR2 conducts, and the video data (Vi−ΔV) obtained by shifting the input data by the offset level of the voltage is applied to the input terminal of the amplifier 81.

If parasitic capacities of the switching element TR2–TR7 and the wires are small enough, the effect on the data stored in the condenser C1 can be ignored, and the input voltage to the amplifier 81 would be theoretically given by (Vi−ΔV). In practice, however, the input voltage is reduced to 1/M, i.e.(Vi−ΔV)/M due to the parasitic capacities. By inputting the signal voltage to the amplifier 81 having an offset voltage ΔV and a gain M, the offset voltage would be canceled, thereby applying the signal (Vo) of the same voltage as the input video data (Vi) to the output terminal.

Operations of the inverting amplifier 81 will be explained in reference to FIG. 26(b).

First, the switching elements TR2 and TR5–TR7 conduct so as to write the reference potential Vref in the first electrode of the condenser C1 and the first electrode of the condenser C2. Here, the input terminal of the amplifier 81 is also at the reference potential (Vref). Thus, the voltage (Vref+ΔV) obtained by shifting an input voltage by an offset level of the amplifier 81 is outputted to the output terminal of the amplifier 81. In this state, the switching element TR4 cuts off, and the switching element TR5 conducts. Thus, the reference voltage Vref is applied to the second electrode of the condenser C1.

Next, the switching elements TR2 and TR6 cut off, and the switching element TR3 conducts to write video data (Vi) in the first electrode of the condenser C1.

The switching element TR3 is then cuts off, and subsequently the switching element TR5 cuts off and the switching element CR4 conducts, thereby setting the second electrode of the condenser C1 to the output potential (Vref+ΔV) of the amplifier 81. The potential of the first electrode of the condenser C1 is (Vref+ΔV) obtained by shifting by the change in potential (ΔV) of the second electrode of the condenser C1.

Then, the switching elements TR4 and TR7 cut off, and the switching element TR2 conducts, so as to apply the video data (Vi+ΔV) obtained by shifting the level of input data by an offset level of the voltage to the input terminal of the amplifier 81.

If parasitic capacities of the switching element TR2–TR7 and the wires are sufficiently small, the effect on the data stored in the condenser C1 can be ignored, and theoretically the input voltage of (Vi−ΔV) would be applied to the amplifier 81. In practice, however, the input voltage is reduced by 1/M, i.e., (Vi−ΔV)/M due to the parasitic capacities. Thus, by inputting this signal voltage to the amplifier 81 having an offset voltage ΔV and a gain M, the offset voltage can be canceled out, thereby applying the signal (Vo) of the same voltage as the input video data (Vi) and of the opposite polarity to the output terminal.

Another example of the signal amplifier circuit (FIG. 20) provided with the offset adjusting function is shown in FIG. 27.

The adjusting means 82 of the signal amplifier circuit is composed of two condensers C1 and C3 (first and third condensers) and four switching elements TR1 and TR3 through TR5. In this signal amplifier circuit, the switching element TR2 is omitted from the signal amplifier circuit (FIG. 21), and instead a condenser C3 for holding an output potential of the signal amplifier circuit is added between the switching element TR4 and the second electrode of the condenser C1. Here, the voltage to be applied to the second electrode of the condenser C3 can be any voltage V0 as long as it is constant.

For the described signal amplifier circuit, only the non-inverting amplifier 81 can be adopted.

Figure 28:
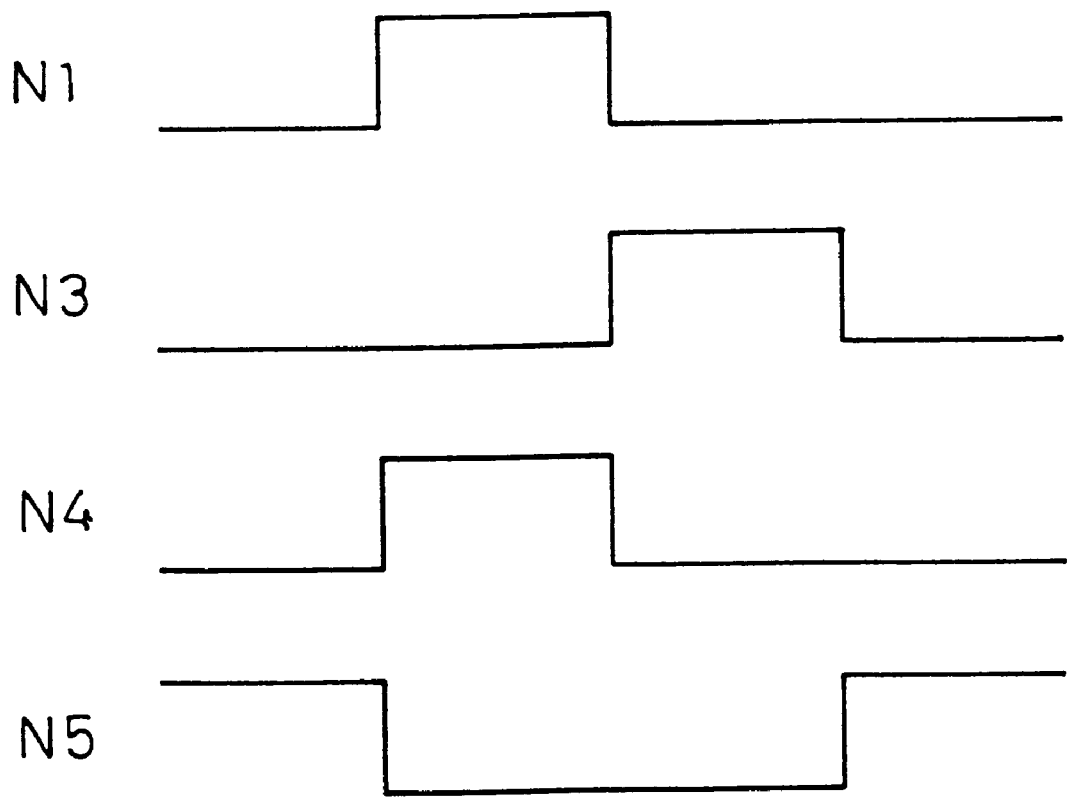
FIG. 28 is a waveform chart of a control signal to be inputted to the signal amplifier of FIG. 27.

Next, the operation of the signal amplifier circuit will be explained. FIG. 28 is a waveform of each control signal for driving the signal amplifier circuit of FIG. 27.

First, the switching elements TR1 and TR4 conduct to write the reference voltage Vref in the first electrode of the condenser C1 and the input terminal of the amplifier 81. As a result, the voltage (Vref+ΔV) obtained by shifting the level by the offset level of the amplifier 81 is outputted to the output terminal of the amplifier 81. In this state, the switching element TR5 cuts off, and the switching element TR4 conducts. Thus, the voltage (Vref+ΔV) is applied to the first electrode of the condenser C3 and the second electrode of the condenser C1.

Next, the switching elements TR1 and TR4 cut off, and the switching element TR3 conducts to write the video data (Vi) in the first electrode of the condenser C1. Here, if the condenser C3 is significantly larger as compared to the condenser C1, the potential of the second electrode of the condenser C1 is kept at the voltage (Vref+ΔV) without being affected by a change in potential of the first electrode of the condenser C1.

Then, after the switching element TR3 cuts off, the switching element TR5 conducts so as to set the second electrode of the condenser $C_1$ at the reference potential (Vref). In this state, the potential of the first electrode of the condenser $C_1$ is (Vi−ΔV) obtained by shifting by the potential change (−ΔV) of the second electrode of the condenser $C_1$. Thus, the input voltage to be applied to the amplifier 81 is also shifted to (Vi−ΔV). In practice, however, due to the parasitic capacity, the level of the input voltage is reduced by 1/M, i.e., (Vi−ΔV)/M. However, by inputting the signal voltage to the amplifier 81 which provides a gain of M at an offset voltage of ΔV, the offset voltage is canceled, and the signal (Vo) at the voltage of the input video data (Vi) is applied to the output terminal.

As an application example of the signal amplifier (FIG. 13 or FIG. 17), a data signal line drive circuit will be explained below.

Figure 29:
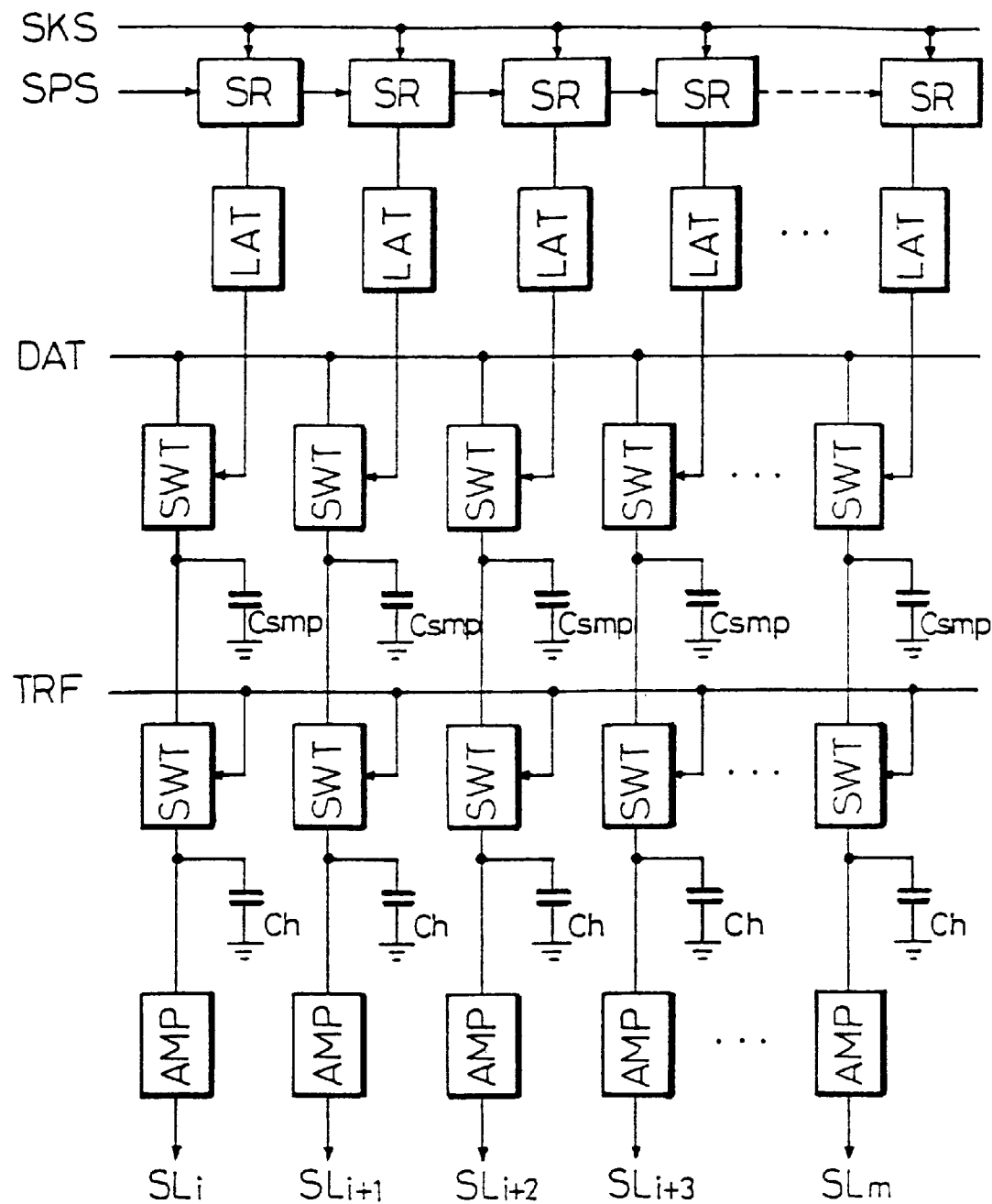
FIG. 29 is a block diagram showing a configuration of a data signal line drive circuit in the image display device of FIG. 10.
Figure 30:
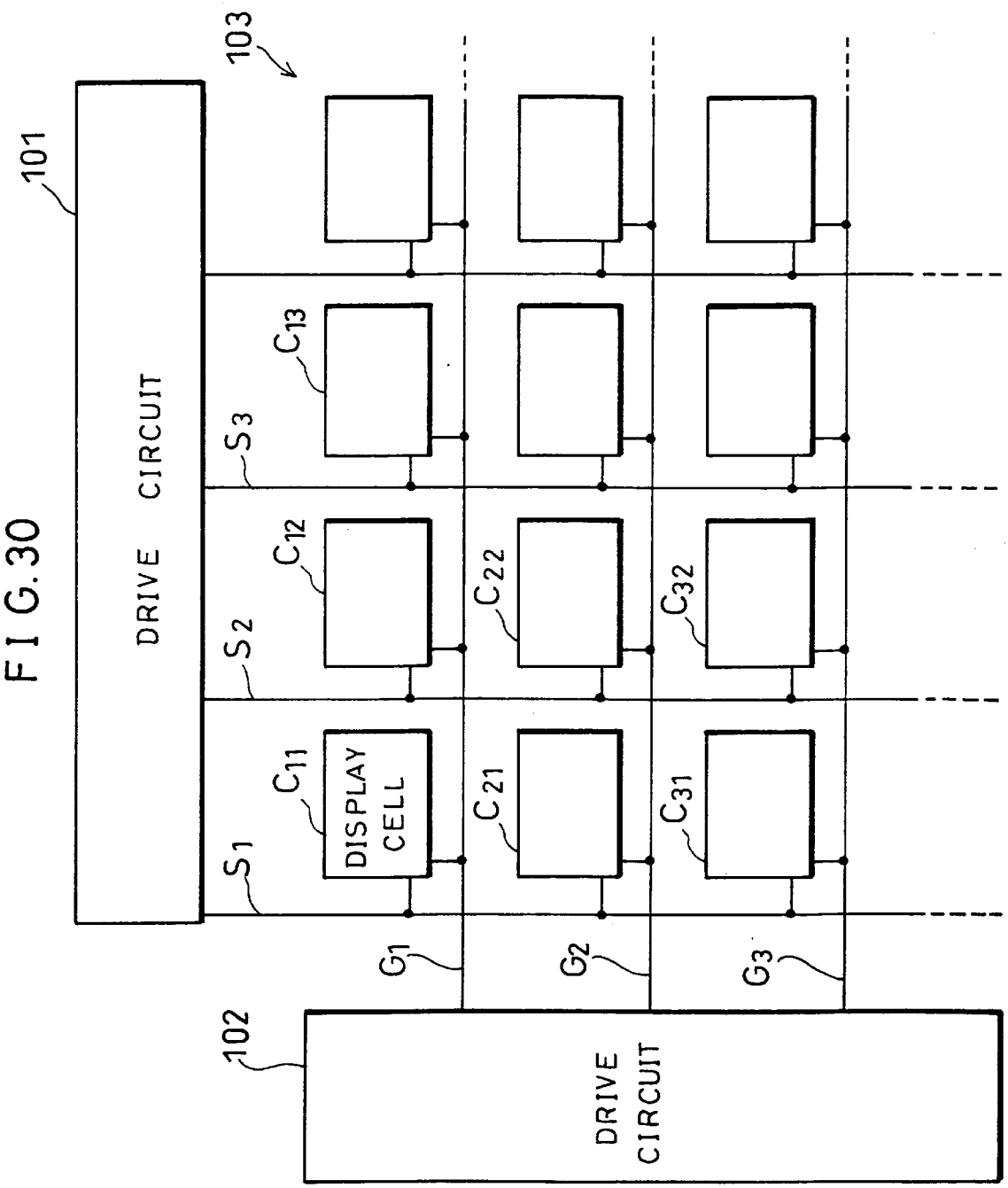
FIG. 30 is a block diagram showing a schematic configuration of a conventional image display device of an active-matrix drive system.
Figure 31:
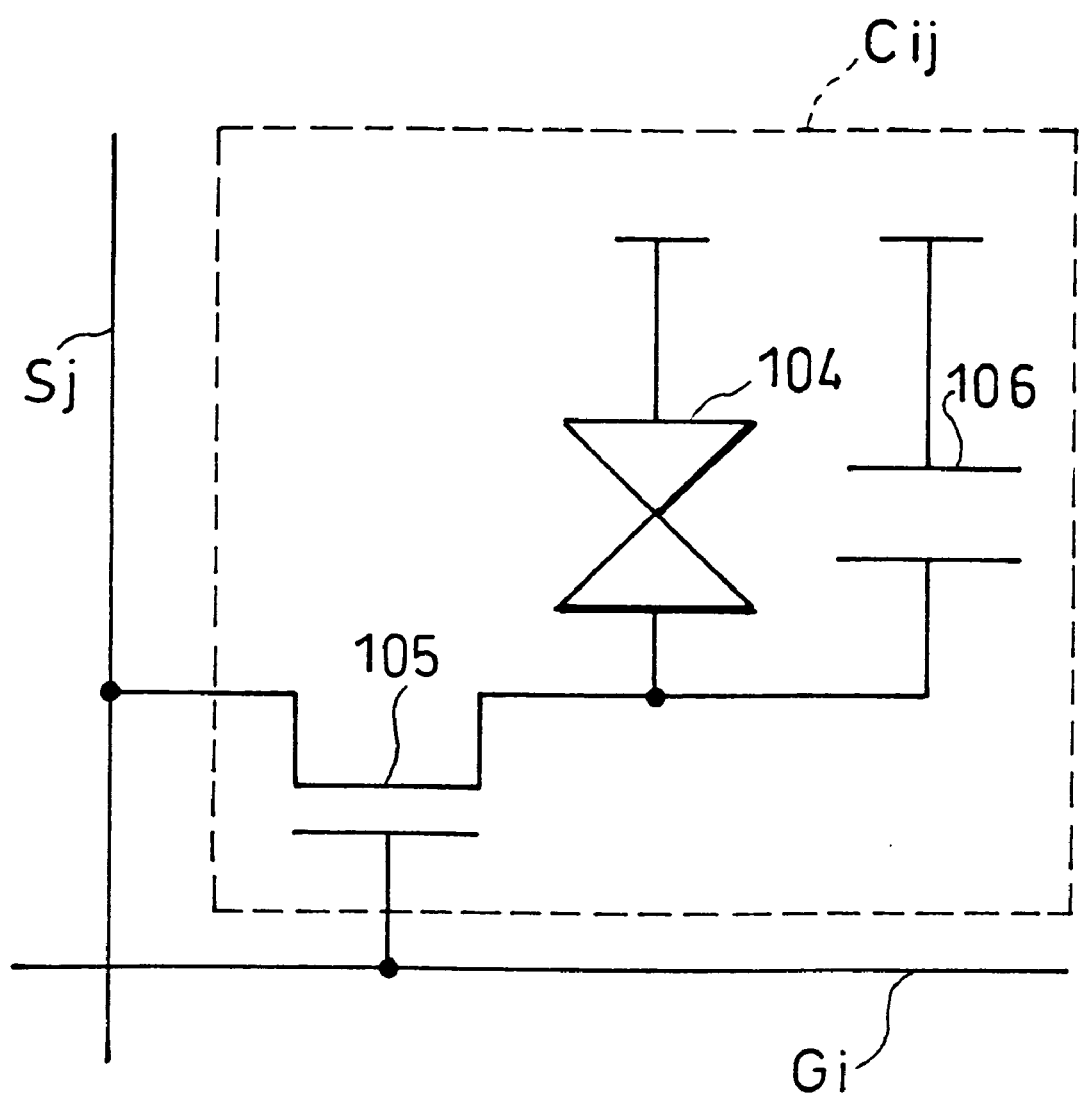
FIG. 31 is a circuit diagram showing a configuration of a display cell in the case where the image display device of FIG. 30 is a liquid crystal display device.
Figure 32:
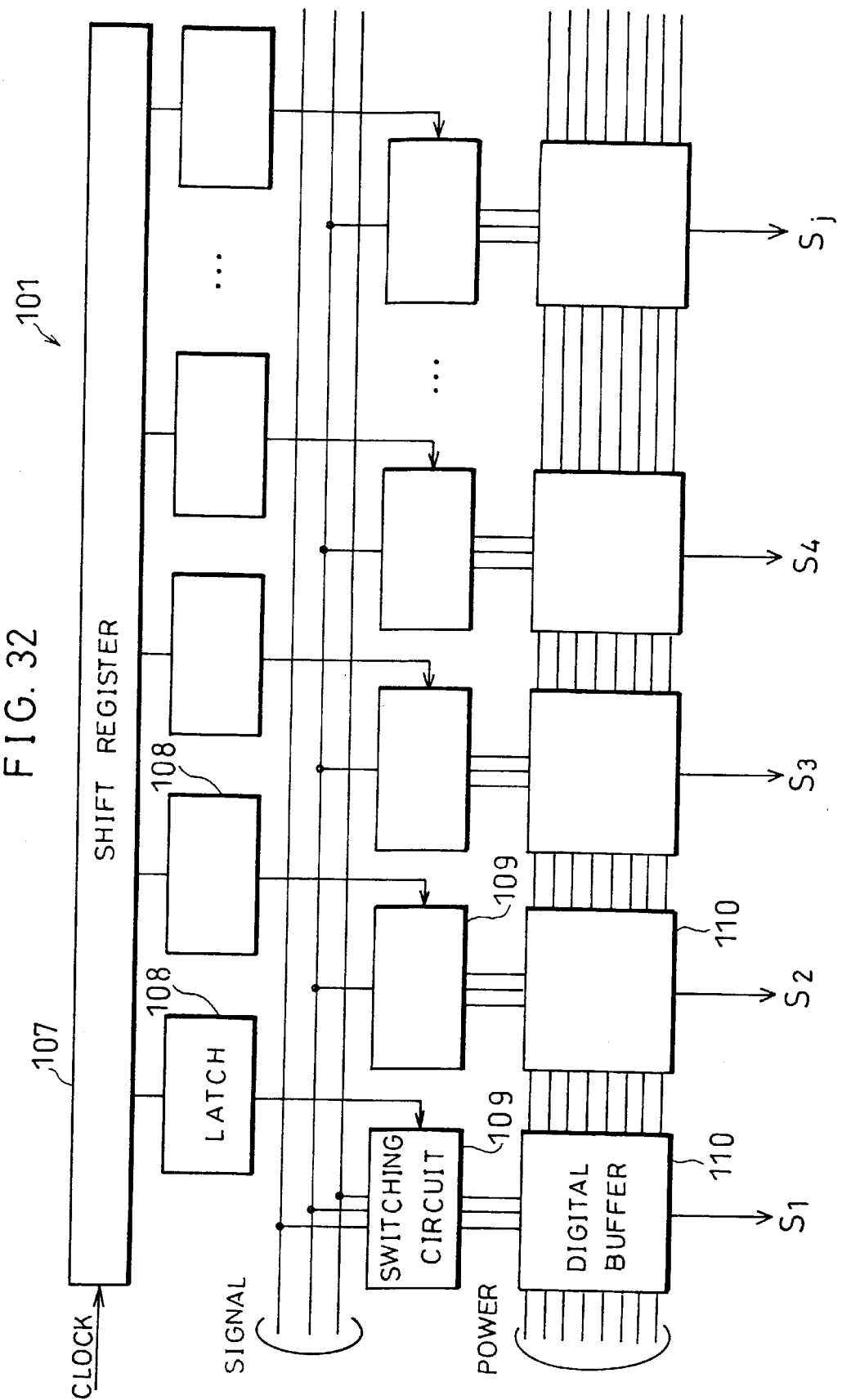
FIG. 32 is a block diagram showing a schematic configuration of a digital driver as an example of the drive circuit for sending data in the data signal line over the image display device of FIG. 30.
Figure 33:
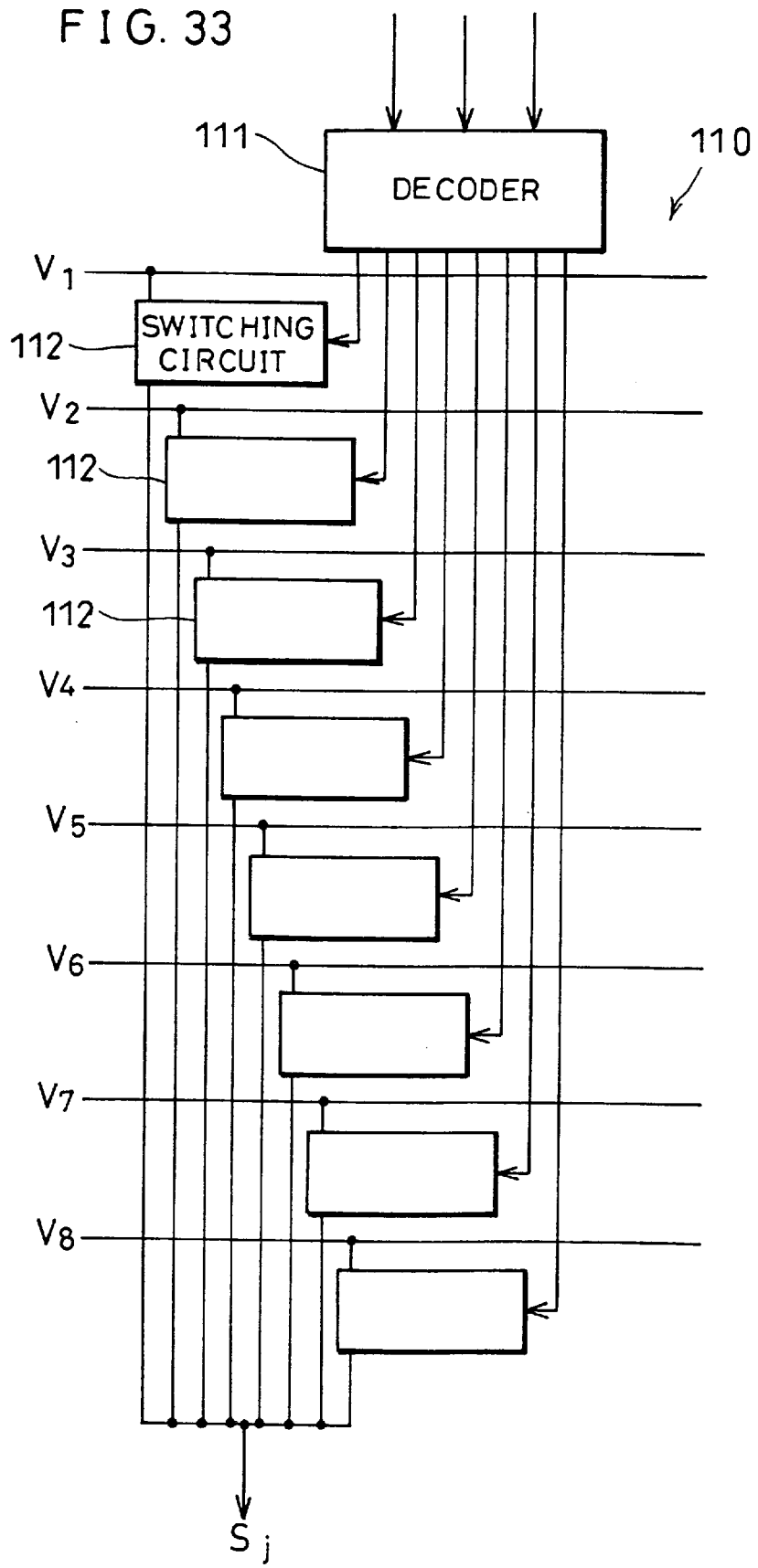
FIG. 33 is a block diagram showing a schematic configuration of a digital buffer in the digital driver of FIG. 32.
Figure 34:
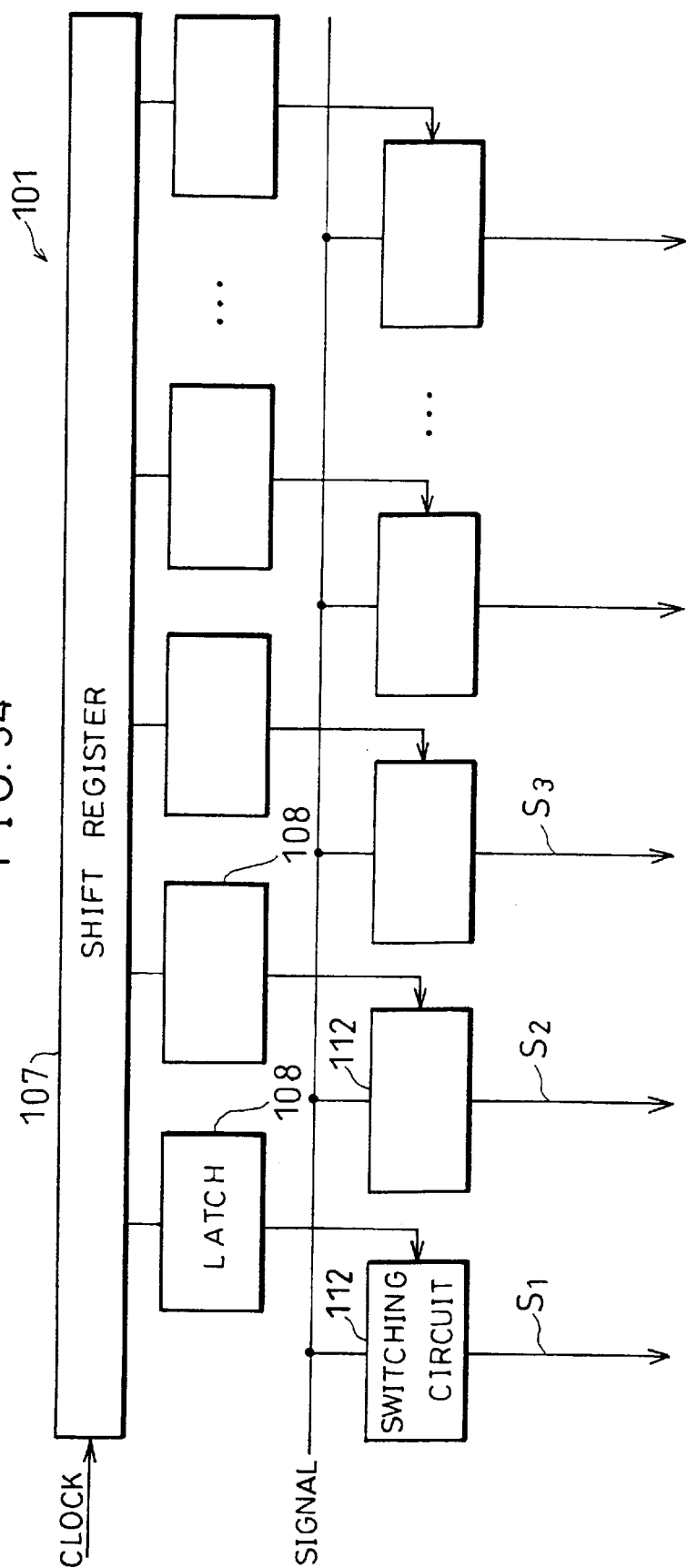
FIG. 34 is a block diagram showing a schematic configuration of an analog driver of a dot sequential drive system as another example of the drive circuit for sending data over the data signal line in the image display device of FIG. 30.
Figure 35:
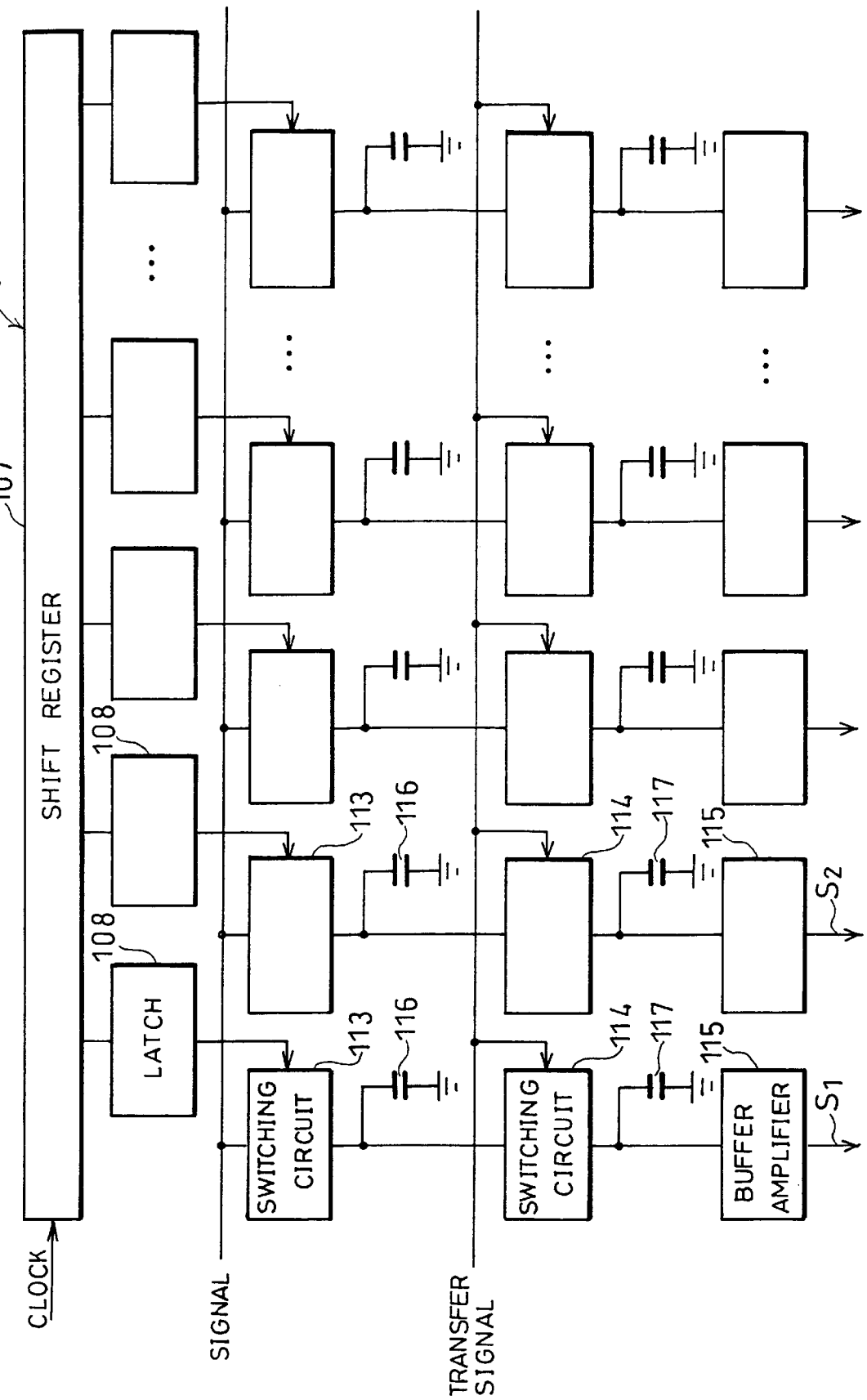
FIG. 35 is a block diagram showing a schematic configuration of an analog driver of a line-sequential drive system as still another example of the drive circuit for sending data over the data signal line in the image display device of FIG. 30.
Figure 36:
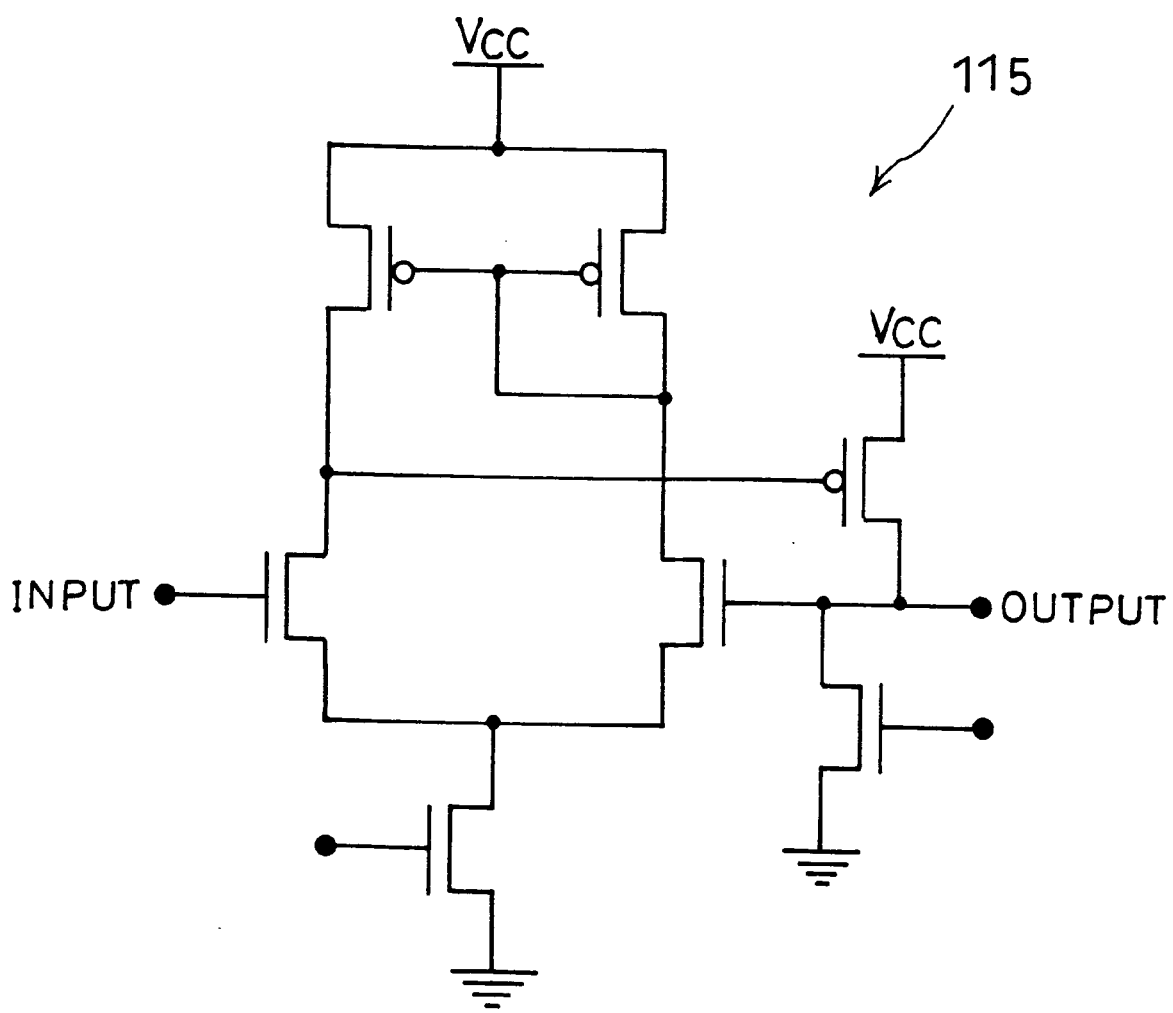
FIG. 36 is a circuit diagram shown an example of the buffer amplifier in the analog driver of FIG. 35.
Figure 37:
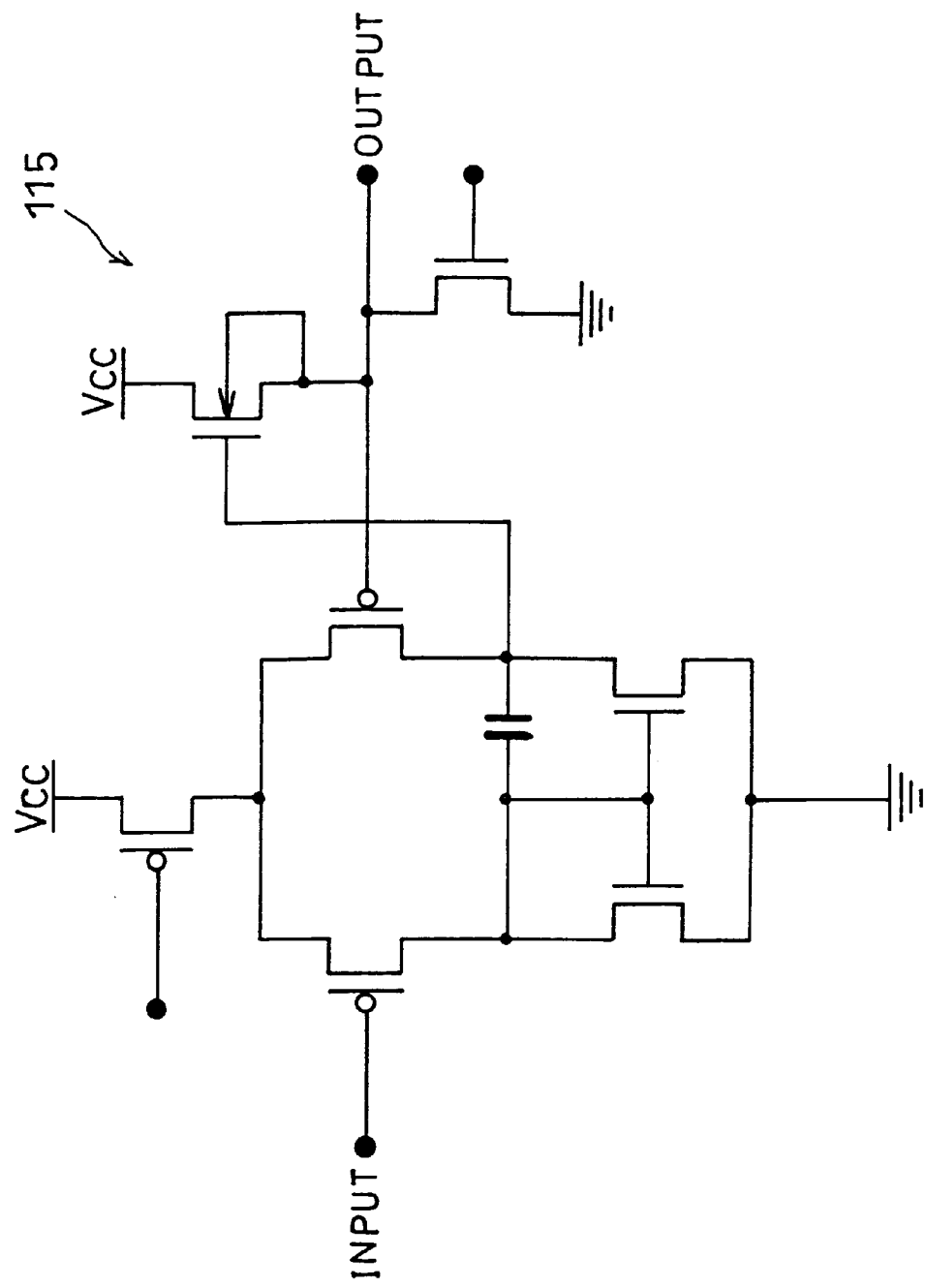
FIG. 37 is a circuit diagram showing another example of the buffer amplifier in the analog driver of FIG. 35.
Figure 38:
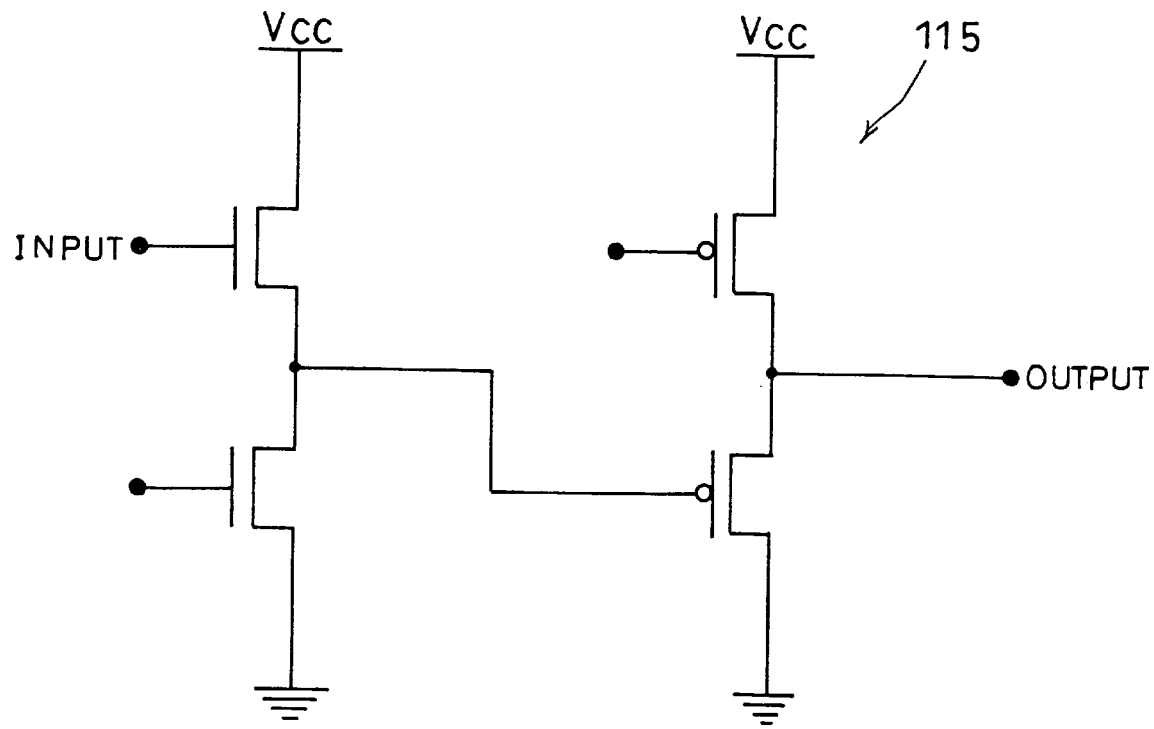
FIG. 38 is a circuit diagram showing still another example of the buffer amplifier in the analog driver of FIG. 35.
Figure 39:
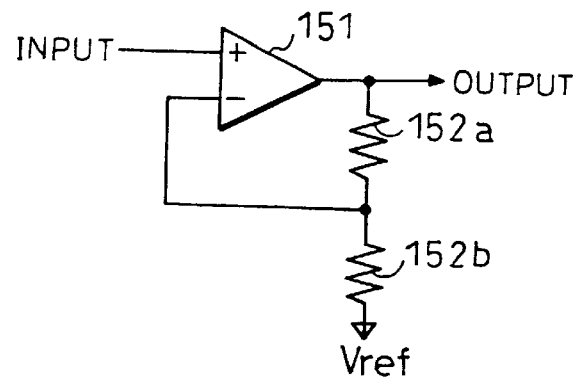
FIG. 39 is a block diagram showing an example of a noninverting signal amplifier having a gain of not less than one for use in a data signal line drive circuit.

As shown in FIG. 29, the data signal line drive circuit is provided with plurality of shift registers (SR), a plurality of latch circuits (LAT), a plurality of sampling circuits (SWT) for taking in a video signal DAT in synchronous with the clock signal, and a plurality of output circuits (AMP) for sending the sampled video signal at one time over the data signal line SLm in synchronous with the other clock signal TRF. The data signal line drive circuit employs a signal amplifier having the gain greater than 1 as the output circuits.

The sampled video signal DAT is once written on the condenser Csmp, and then sent into the condenser Ch. In proportion to the capacity, the charge is divided, and the level of the signal voltage attenuates to Csmp/(Csmp+Ch). The amount of attenuation in the level of the signal voltage is determined by the ratio of the condenser Csmp to the condenser Ch. Thus, by adopting a signal amplifier having a gain ((Csmp+Ch)/Csmp) sufficient for compensating for the attenuation in the level of the signal as an output circuit, the output signal in the same level as the sampled signal can be obtained.

Additionally, by setting the gain of the output circuit larger, it is even possible to achieve a smaller amplitude of the video signal to be inputted to the data signal line drive circuit than that originally required amplitude. Since the described arrangement permits a smaller drive voltage such as a sampling circuit for taking in the video signal DAT, low power consumption of the circuit is enabled.

Furthermore, in the case of adopting the thin film transistor such as a polycrystalline silicon thin film transistor, etc., as the output circuit, by employing a stable condenser as a gain controlling element, the gain can be set with high precision, thereby enabling a high quality data signal line drive circuit.

In the case where the signal amplifier circuit provided with the offset adjusting function of FIG. 20 is employed as the output circuit for the data signal line drive circuit instead of the signal amplifier of FIG. 13 or FIG. 17, the offset voltage of the signal amplifier circuit and fluctuations in the offset voltage can be suppressed, thereby enabling fluctuations in output from the signal line drive circuit corresponding to plural signal lines to be suppressed.

Therefore, it is especially effective to employ the thin film transistor such as a polycrystalline thin film transistor, etc., for the output circuit, because the fluctuations in offset voltage can be suppressed.

Next, as an application example of the data signal line drive circuit provided with the signal amplifier (FIGS. 13, 17 and 20), the active matrix liquid crystal display device will be explained. It should be noted here that the technique of the present invention is also applicable to the image display device other than the liquid crystal display device such as a plasma display, an LED (light emitting diode) display, an FED (field emission element) display, etc.

The liquid crystal display device employs the data signal line drive circuit. The liquid crystal display has the same arrangement as the aforementioned liquid crystal display under prior art except that the data signal line drive circuit is adopted.

The data signal line drive circuit reduces fluctuation of the output (a display video signal) from each data signal line and a desirable multi-level display can be achieved.

Recently, earnest researches have been made to attain a lower cost for the drive circuit and for mounting the drive circuit and an improved reliability of the portion having the drive circuit mounted thereon. In the monolithic structure (the structure where the picture element array and the drive circuit are integrally formed on the same substrate), in most cases, the drive circuit is composed of monocrystal, polycrystalline or amorphous silicone thin film transistor (in the case of transmission display). Therefore, as already mentioned, to eliminate the problem associated with the fluctuations in output voltage due to the unstable element, it is especially effective to employ the signal amplifier or the signal line drive circuit provided with the signal amplifier to achieve the monolithic structure of the image display device.

As described, in the signal amplifier of the present invention, the condenser is employed as an element for controlling the gain. This provides a particular effect that a gain of the signal amplifier can be controlled with high precision even in the thin film transistor circuit associated with large fluctuations in characteristics of the transistor or the resistance element.

The signal amplifier circuit which employs the offset adjusting function of the present invention employs the signal amplifier having a gain greater than 1. Therefore, even when the level of the signal attenuates in the adjusting means, a high precision offset voltage adjustment is still ensured.

The signal line drive circuit of the present invention employs the above-mentioned signal amplifier or the signal amplifier circuit provided with the offset adjusting function as the signal amplifier. Therefore, the signal in the same level as the input signal can be outputted precisely and stably.

Furthermore, in the image display device of the present invention, the described signal line drive circuit is employed as the data signal line drive circuit. This permits reduced fluctuations in signals supplied to the image display and high quality multi-level image display can be achieved.

The following will provide examples of signal amplifier circuits and image display devices adopting such signal amplifier circuits.

The first signal amplifier circuit is provided with a buffer amplifier 1 and adjusting mean 2. The adjusting means 2 detects a difference in voltage between a reference voltage $V_0$ and an output voltage ($V_0+\Delta V$) of the buffer amplifier 1 obtained when the reference voltage $V_0$ is inputted thereto. An obtained difference in voltage is defined as an offset voltage $\Delta V$. The adjusting meas 2 cancels the offset voltage $\Delta V$ by inputting voltage obtained by subtracting the offset voltage $\Delta V$ from the voltage of the input signal.

According to the above arrangement, since the offset voltage $\Delta V$ can be canceled, a signal amplifier circuit having a desirable buffer characteristic that a signal outputted therefrom has the same voltage level as a signal inputted thereto can be ensured even if the buffer amplifier 1 has the offset voltage $\Delta V$.

The second signal amplifier circuit having the structure of the first signal amplifier circuit is arranged such that an input signal is inputted in synchronous with a clock, and the offset voltage $\Delta V$ is canceled out by the adjusting mean 2 at each clock.

According to the arrangement of the second amplifier, the following effect can be achieved in addition to the effect achieved from the first signal amplifier circuit. By eliminating the offset voltage $\Delta V$ at each clock, even if the offset voltage $\Delta V$ changes due to a change in the environment under which the signal amplifier circuit is operated (for example, change in temperature) or due to a change in characteristic of the signal amplifier circuit as time passes, canceling out of the offset voltage $\Delta V$ can be always ensured.

The third signal amplifier circuit having the structure of the second signal amplifier circuit is arranged such that the adjusting mean 2 is composed of a condenser 3 and switching elements 4–8, and that an input terminal 1*a* of the buffer amplifier 1 is connected to an input terminal 9 of a reference voltage $V_0$ through the switching element 4 and is also connected to one electrode 3*a* of the condenser 3 through the switching element 5. The third signal amplifier circuit is further arranged such that the electrode 3*a* of the condenser 3 is connected to an input terminal 10 of the input signal through the switching element 6, and the other electrode 3*b* of the condenser 3 is connected to an output terminal 1*a* of the buffer amplifier 1 through the switching element 7 and is connected to the input terminal 9 of the reference voltage $V_0$ through the switching element 8.

The fourth signal amplifier having the arrangement of the second amplifier circuit is arranged such that, the adjusting means 2 is composed of a condensers 3 and 16 and switching elements 5–8, 14 and 15, an input terminal 1*a* of the buffer amplifier 1 is connected to an electrode 3*a* of the condenser 3 through the switching element 5 and is also connected to the constant voltage terminal through the switching element 15 and the condenser 16, one electrode 3*a* of the condenser 3 is connected to the input terminal 10 of the input signal through the switching element 6 and is also connected to the input terminal 9 of the reference voltage $V_0$ through the switching element 14, the other electrode 3*b* of the condenser 3 is connected to the output terminal 1*b* of the buffer amplifier 1 through the switching element 7 and is also connected to the input terminal 9 of the reference voltage $V_0$ through the switching element 8.

The fourth signal amplifier circuit enables a reduced number of components in addition to the effect of the second signal amplifier circuit.

The fifth signal amplifier circuit having the structure of the second signal amplifier circuit is arranged such that the adjusting means 2 is composed of condensers 3*a* and 17 and switching elements 4, 6–8, and the input terminal 1*a* of the buffer amplifier 1 is connected to the input terminal 9 of the reference voltage $V_0$ through the switching element 4. The other electrode 3*b* of the condenser 3 is connected to the output terminal 1*b* of the buffer amplifier 1 through the switching element 7, and is also connected to the input terminal 9 of the reference voltage $V_0$ through the switching element 8, and the other electrode 1*b* of the condenser 3 is connected to the constant voltage terminal through the condenser 17.

The fifth signal amplifier circuit enables a reduced number of components in addition to the effect of the second signal amplifier circuit.

The sixth signal amplifier circuit having the structure of the first, second, third, fourth or fifth signal amplifier circuit is arranged such that a switching element 21 is provided for applying the reference voltage $\Delta V$ to the output terminal 1*b* of the buffer amplifier 1.

The sixth signal amplifier circuit permits a load of the buffer amplifier 1 to be reduced in addition to the effect obtained from the first, second, third, fourth or fifth signal amplifier circuit. Therefore, a time required for canceling the offset voltage $V_0$ can be shortened.

The seventh signal amplifier circuit having the arrangement of the first, second, third, fourth or fifth signal amplifier circuit is arranged such that a switching element 22 for separating the buffer amplifier 1 from an external load is provided.

The seventh signal amplifier circuit permits a load of the buffer amplifier 1 to be reduced in addition to the effect of the first, second third, fourth or fifth signal amplifier circuit. Therefore, a time required for eliminating the offset voltage $\Delta V$ can be reduced.

The eighth signal amplifier circuit having the structure of the third signal amplifier circuit is arranged such that at least one of the switching elements 4–8 is a complementary MOS transistor switch.

The eighth signal amplifier circuit permits a higher accuracy compared with the signal amplifier circuit adopting a n-channel or p-channel MOS transistor switch in addition to the effect of the third signal amplifier circuit.

The ninth signal amplifier circuit having the structure of the fourth signal amplifier circuit is arranged such that at least one of the switching elements 5, 8, 14 and 15 is a complementary MOS transistor switch.

The ninth signal amplifier circuit permits the same effect as the eighth signal amplifier circuit.

The tenth signal amplifier circuit having the structure of the fifth signal amplifier circuit is arranged such that at least one of the switching elements 4 and 6–8 is a complementary MOS transistor switch.

The tenth signal amplifier circuit permits the same effect as the eighth signal amplifier circuit.

The first image display device of the present invention comprises a display 53 composed of display cells arranged so as to form a matrix; a drive circuit 51 for sampling a video signal so as to send a voltage obtained by sampling as data over a data signal line $S_j$; and a drive circuit 52 for selecting a scanning signal line $G_j$ in order so as to send data on the data signal line $S_j$ to a display cell, wherein the drive circuit 51 comprises a shift register 57, switching circuits 59 in the same number as the number of display cells in a lateral direction; sampling-use condensers 60 in the same number as the number of switching circuits 59 and signal amplifier circuits 61 in the same number of sampling-use condenser 60. The first image display device is arranged such that the shift register 57 sends a signal to the switching circuits 59 in order in synchronous with a clock signal, and each switching circuit 59 is switched ON by a signal from the shift register 57. Furthermore, each condenser 60 samples the level of the signal as data when each switching circuit 59 is turned ON, and when data in the same number as the number of the display cells in lateral direction are held in the condensers 60, the signal amplifier circuit 61 reads in data from the condensers 60 at one time. Then, the data is outputted over the data signal line $S_j$, thereby displaying a video signal on the display 53. In the above first image display device, the signal amplifier circuit 61 is selected among the first through tenth signal amplifier circuits.

In the first image display device, one of the first through tenth signal amplifier circuits is adopted as the signal amplifier circuit 61. Therefore, voltage having the same level as the voltage held in a sampling-use condenser 60 can be sent over the data signal line $S_j$. As a result, the first image display device permits a high quality image display.

The second image display device having the arrangement of the first image display device is arranged such that the display cells and drive circuits 51 are formed on the same substrate.

The second image display device permits a compact size image display device in addition to the effect of the first image display device.

The third image display device having the arrangement of the second image display device is arranged such that the substrate is composed of a transparent substrate a single crystal silicon thin film or polycrystalline silicon thin film formed on a transparent substrate.

In the third image display device, since the transparent substrate is used, a transmission display device is enabled. Moreover, since a single crystal silicon thin film or a polycrystalline silicon thin film which permits a transistor having a high drive force is used, a practical drive circuit including a signal amplifier circuit can be manufactured. Especially when a transistor composed of a single crystal silicon thin film or polycrystalline silicon thin film is used, electric properties widely vary. However, with the above signal amplifier circuit, the variations can be adjusted.

The fourth image display device having the arrangement of the first, second or third image display device is arranged such that the level of the video signal is successive.

According to the fourth image display device, an image can be displayed with a successively varying gradation in addition to the effects of the first through third image display devices. Moreover, reversing of the gradation which may occur when varying the gradation at every vertical line can be prevented.

The fifth image display device having the arrangement of the first, second or third image display device is arranged such that the video signal is discrete having at least four levels.

The fifth image display device offers the same effect of the fourth embodiment.

The sixth image display device having the arrangement of the first, second, third, fourth or fifth image display device is arranged such that each display cell includes a liquid crystal display element.

In the described arrangement, the display cell includes the liquid crystal display element. Therefore, in addition to the effects of the first through fifth image display devices, the display element having the uniform display characteristic can be achieved. As a result, only by adjusting the offset voltage $\Delta V$, a high quality display image can be achieved.

The following will provide examples of signal amplifiers having a gain of not less than one of the above-explained preferred embodiments, signal line drive circuits adopting such signal amplifier circuits and image display devices adopting such signal line drive circuits.

The first signal amplifier includes an operational amplifier 71, and condensers 72a and 72b for setting a gain of the operational amplifier 71. The condenser 72a is connected across an inverting input terminal and an output terminal of the operational amplifier 71, while the condenser 72b is connected across an inverting input terminal of the operational amplifier 71 and a constant voltage source. In this arrangement, an output signal obtained by noninversion-amplification of an input signal inputted to an inverting input terminal is outputted.

This arrangement enables the gain of the signal amplifier to be set by the capacitances of the condensers 72a and 72b, thereby providing the noninverting signal amplifier which permits a gain to be set with higher precision as compared to the conventional signal amplifier that sets a gain by resistors. Especially, by forming a signal amplifier on a semiconductor thin film such as a polycrystalline silicone, an inverting signal amplifier which permits a gain to be set with much higher precision as compared to the conventional signal amplifier can be achieved.

The second signal amplifier having the arrangement of the first signal amplifier includes a switching element 74 for connecting the inverting input terminal and the output terminal to the constant power source.

The described arrangement offers a particular effect that the inverting input terminal and the output terminal can be reset at the potential Vref of the constant power supply which results in that the gain of the signal amplifier is determined by (Ca+Cb)/Ca in addition to the effect of the first signal amplifier. Here, Ca and Cb are respective capacitances of the condensers 72a and 72b.

The third signal amplifier includes an operational amplifier 71 and condensers 72a and 72b for setting a gain of the operational amplifier 71. The condenser 72a is connected across an inverting input terminal and an output terminal of the operational amplifier 71, and the noninverting input terminal is connected to the constant power source. In this arrangement, an output signal obtained by inversion-amplification of a signal that is inputted from the signal source to the inverting input terminal through the condenser 72b is outputted from the output terminal.

This arrangement enables a gain of the signal amplifier to be set by capacitances of the condensers 72a and 72b, thereby providing an inverting signal amplifier which permits a gain to be set with higher precision as compared to the conventional signal amplifier that sets a gain by resistors. Especially, by forming a signal amplifier on a semiconductor thin film such as a polycrystalline silicone, an inverting signal amplifier which permits a gain to be set with much higher precision as compared to the conventional signal amplifier can be achieved.

The fourth signal amplifier having the arrangement of the third signal amplifier is provided with a switching element 74 for connecting the inverting input terminal and the output terminal to the signal source.

The fourth signal amplifier having the arrangement of the third signal amplifier includes the switching element 74 for connecting the inverting input terminal and the output terminal to the signal source.

The described arrangement offers a particular effect that the inverting input terminal and the output terminal can be reset at the potential of the signal source which results in that a gain of the signal amplifier is determined by Cb/Ca in addition to the effect of the third signal amplifier. Here, Ca and Cb are respective capacitances of the condensers 72a and 72b.

The fifth signal amplifier having the arrangement of the second or fourth signal amplifier is arranged such that the input signal is inputted in synchronous with the first clock signal, and the switching element 74 is set ON in synchronous with the second clock signal.

The described arrangement offers a particular effect that a constant gain can be ensured without being affected by a leakage of charge stored in the condensers 72a and 72b in addition to the effect achieved by the second or fourth signal amplifier.

The sixth signal amplifier having the arrangement of the fifth signal amplifier is arranged such that the first clock signal and the second clock signal have the same frequencies, and that the switching element 74 is set ON directly before receiving each input signal.

The described arrangement permits a constant gain to be ensured in addition to the effect of the fifth signal amplifier.

The eleventh signal amplifier circuit includes an amplifier 81 and adjusting means 82 for detecting a difference in voltage as an offset voltage ΔV between a reference voltage and an output voltage of the amplifier 81 when inputting thereto the reference voltage and inputting a compensating signal obtained by attenuating a level of the first signal obtained by sifting the level of the input signal by the offset voltage ΔV so as to reduce the offset voltage ΔV of the amplifier 81, wherein the gain of the amplifier 81 is set to an amplitude ratio of the first signal to the adjusting signal.

The described arrangement permits the offset voltage ΔV of the amplifier 81 to be reduced, thereby obtaining the output signal almost in the same level as the input signal.

The twelfth signal amplifier circuit having the arrangement of the eleventh signal amplifier circuit is arranged such that an input signal is inputted in synchronous with a clock signal, and the level of the offset voltage ΔV is reduced at every clock by the adjusting means 82.

The described arrangement offers an effect that even if the offset voltage ΔV fluctuates due to a change in operation environment (temperature change, etc.) of the signal amplifier circuit, or changes in various characteristics of the signal amplifier as time passes, the offset voltage ΔV can be surely eliminated in addition to the effect of the eleventh signal amplifier circuit.

The thirteenth signal amplifier circuit having the arrangement of the twelfth signal amplifier circuit is arranged such that the adjusting means 82 includes a condenser C1, and switching elements TR1–TR5, wherein an input terminal of the amplifier 81 is connected to an input terminal of a reference voltage Vref through the switching element TR1 and is also connected to one electrode of the condenser C1 through the switching element TR2, the electrode of the condenser C1 is connected to the input terminal of the input signal through the switching element TR3, and the other electrode of the condenser C1 is connected to the output terminal of the amplifier 81 through the switching element TR4 and is also connected to the input terminal of the reference voltage Vref through the switching element TR5.

The fourteenth signal amplifier circuit having the arrangement of the twelfth signal amplifier circuit is arranged such that the adjusting means 82 includes condensers C1 and C2, and switching elements TR2–TR7, wherein an input terminal of the amplifier 81 is connected to one electrode of the condenser C1 through the switching element TR2 and is connected to the constant voltage terminal through the switching element TR7 and the condenser C2, the electrode of the condenser C1 is connected to the input terminal of the input signal through the switching element TR3 and is also connected to the input terminal of the reference voltage Vref through the switching element TR6, and the other electrode of the condenser C1 is connected to the output terminal of the amplifier 81 through the switching element TR4 and is also connected to the input terminal of the reference voltage Vref through the switching element TR5.

The fifteenth signal amplifier circuit having the arrangement of the twelfth signal amplifier circuit is arranged such that the adjusting means 82 includes condensers C1 and C3, and switching elements TR1, TR3–TR5, wherein an input terminal of the amplifier 81 is connected to an input terminal of the reference voltage Vref through the switching element TR1 and is also connected to one electrode of the condenser C1, the electrode of the condenser C1 is connected to the input terminal of the input signal through the switching element TR3, and the other electrode of the condenser C1 is connected to the output terminal of the amplifier 81 through the switching element TR4 and is also connected to the input terminal of the reference voltage Vref through the switching element TR5 and is further connected to a constant voltage terminal through the condenser C3.

All of the described arrangements of the thirteenth through fifteenth signal amplifier circuits provide a signal amplifier circuit enable an offset voltage ΔV to be reduced with a simple circuit structure in addition to the effect achieved by the arrangement of the twelfth signal amplifier.

The sixteenth signal amplifier circuit having the arrangement of the eleventh, twelfth, thirteenth, fourteenth or fifteenth signal amplifier circuit includes a switching element TR8 for applying a reference voltage Vref to the output terminal of the amplifier 81.

The described arrangement permits the load of the signal amplifier circuit to be reduced in addition to the effect of the eleventh through fifteenth signal amplifier circuits. As a result, the time required for adjusting the offset voltage ΔV can be shortened.

The seventeenth signal amplifier circuit having the arrangement of the eleventh, twelfth, thirteenth, fourteenth or fifteenth signal amplifier circuit includes a switching element TR9 for electrically isolating an output terminal of the amplifier 81 from an external load.

According to the described arrangement, since the load of the signal amplifier circuit can be reduced, the time required for compensating for the offset voltage ΔV can be reduced in addition to the effects achieved by the eleventh through fifteenth signal amplifiers.

The first signal line drive circuit includes sampling means for taking in a video signal in synchronous with a clock signal and output means for outputting sampled video signals at one time to the data signal line in synchronous with other clock signal, wherein the output means is selected from the first through fourth signal amplifiers or the eleventh through thirteenth signal amplifier circuits.

The described arrangement enables a signal in the same level as the sampled video signal is sent over the data signal line.

The seventh image display device includes a display composed of display cells arranged so as to from a matrix, a signal line drive circuit 101 for sampling a video signal so as to send the video signal obtained by sampling over a data signal line, and a signal line drive circuit 102 for selecting a scanning signal line in order so as to write the video signal on the data signal line onto a display picture element, wherein the signal line drive circuit 101 is the previously explained first signal line drive circuit, and the display picture element and the first signal line drive circuit are formed on the same substrate, and the first signal line drive circuit is composed of a thin film transistor.

The described arrangement enables to provide transmission image display devices and drive circuits adopting the described signal amplifiers of practical applications.

The invention being thus described, it will be obvious that the same way be varied in many ways. Such variations are not to be regarded as a departure from the spirit and scope of the invention, and all such modifications as would be obvious to one skilled in the art are intended to be included within the scope of the following claims.

What is claimed is:

1. A signal amplifier circuit, comprising:

a buffer amplifier, an input means for inputting a reference voltage into said buffer amplifier during a detection period, and an adjusting circuit detecting a difference in voltage as an offset voltage between the reference voltage and an output voltage from said buffer amplifier during the detection period, and during an operation period after the detection period, inputting a voltage obtained by subtracting the offset voltage from a voltage of an input signal before said input signal is input into said buffer amplifier so as to cancel the offset voltage.

2. The signal amplifier circuit as set forth in claim 1, wherein the input means inputs the input signal synchronously with a clock signal, and the detection period corresponds to each clock cycle.

3. The signal amplifier circuit as set forth in claim 2, wherein:

said input means includes a first switching element, said adjusting circuit includes a first condenser and second through fifth switching elements, an input terminal of said buffer amplifier is connected to an input terminal of the reference voltage through said first switching element, and is also connected to one electrode of said first condenser through said second switching element, the electrode of said first condenser is connected to an input terminal of the input signal through said third switching element, and the other electrode of said first condenser is connected to the output terminal of said buffer amplifier through said fourth switching element and is also connected to the input terminal of the reference voltage through said fifth switching element.

4. The signal amplifier circuit as set forth in claim 2, wherein:

said adjusting circuit includes first and second condensers, and second through fifth and seventh switching elements, said input means includes a sixth switching element, and an input terminal of said buffer amplifier is connected to one electrode of said first condenser through said second switching element and is also connected to a constant voltage terminal through said seventh switching element and said second condenser, and the electrode of said first condenser is connected to the input terminal of the input signal through said third switching element and is also connected to the input terminal of the reference voltage through said sixth switching element, and the other electrode of said first condenser is connected to an output terminal of said buffer amplifier through said fourth switching element and is also connected to the input terminal of the reference voltage through said fifth switching element.

5. The signal amplifier circuit as set forth in claim 2, wherein:

said input means includes a first switching element, said adjusting circuit includes first and third condensers and third through fifth switching elements, and an input terminal of said buffer amplifier is connected to the input terminal of the reference voltage through said first switching element and is also connected to one electrode of said first condenser, the electrode of said first condenser is connected to the input terminal of the input signal through said third switching element, and the other electrode of said first condenser is connected to an output terminal of said buffer amplifier through said fourth switching element and is also connected to the input terminal of the reference voltage through said fifth switching element, and the other electrode of said first condenser is also connected to a constant voltage terminal through said third condenser.

6. The signal amplifier circuit as set forth in claim 1, further comprising:

a switching element for applying the reference voltage to an output from said buffer amplifier.

7. The signal amplifier circuit as set forth in claim 1, further comprising:

a switching element for electrically isolating said buffer amplifier from an external load.

8. The signal amplifier circuit as set forth in claim 3, wherein:

at least one of said first through fifth switching elements is a complementary MOS transistor switch.

9. The signal amplifier circuit as set forth in claim 4, wherein:

at least one of said second through seventh switching elements is a complementary MOS transistor switch.

10. The signal amplifier circuit as set forth in claim 5, wherein:

at least one of said first, and third through fifth switching elements is a complementary MOS transistor switch.

11. The image display device as set forth in claim 1, wherein said adjusting circuit includes:

a first condenser; and a switch applying an output voltage from said buffer amplifier to a first electrode of said first condenser when the reference voltage is input thereto, and applying a voltage of the input signal to a second electrode of said first condenser, and subsequently applying the reference voltage to the first electrode of said first condenser so as to connect the second electrode to said buffer amplifier.

12. The signal amplifier circuit as set forth in claim 1, wherein:

said adjusting circuit includes a condenser for holding the input signal, and a signal for canceling offset voltages is superimposed on the input signal by varying a potential on one electrode of the condenser from an output potential of said buffer amplifier, obtained when a reference potential is inputted thereto, to the reference potential.

13. A signal amplifier circuit comprising:

a buffer amplifier having an input terminal and an output terminal;

a first signal output circuit for applying a first signal to the input terminal of said buffer amplifier during a detection period;

a memory for storing a compensating signal generated at the output terminal by said buffer amplifier during the detection period, wherein during an operation period after the detection period, the compensating signal stored in said memory is combined with an input signal before said input signal is input to the input terminal of said buffer amplifier so that when said input signal is processed by said buffer amplifier during the operation period, the compensating signal cancels an offset characteristic of said buffer amplifier.

14. The signal amplifier circuit as set forth in claim 13, wherein:

the memory is a capacitor connected at one side to the input terminal and at another side to the output terminal.

15. The signal amplifier circuit as set forth in claim 13, wherein:

the memory is a digital memory such as a flip-flop.

16. The signal amplifier circuit as set forth in claim 13, wherein:

subsequent signals are applied at regular clock intervals and compensating signals correct corresponding ones of the subsequent signals at each clock interval.

17. A signal amplifier, comprising:

an operational amplifier; and a first gain setting condenser and a second gain setting condenser for setting a gain of said operational amplifier, wherein said first gain setting condenser is connected across an inverting input terminal and an output terminal of said operational amplifier, said second gain setting condenser is connected across the inverting input terminal and a constant voltage source, and an output signal obtained by noninverted amplification of a signal coupled to a noninverting input terminal of said operational amplifier is output from the output terminal.

18. The signal amplifier as set forth in claim 17, further comprising:

a switch connecting the inverting input terminal and the output terminal to the constant voltage source.

19. The second amplifier as set forth in claim 18, wherein:

an input signal is input synchronously with a first clock signal applied in a predetermined cycle.

20. The signal amplifier as set forth in claim 19, wherein:

the cycle of the first clock signal is the same as an input cycle of the input signal, and said switch is set ON directly before receiving each input signal.

21. A signal amplifier, comprising:

an operational amplifier; and a first gain setting condenser and a second gain setting condenser for setting a gain of said operational amplifier, wherein:

said first gain setting condenser is connected across an inverting input terminal and an output terminal of said operational amplifier, a noninverting input terminal of said operational amplifier is connected to a constant voltage source, and an output signal obtained by inverted amplification of a signal coupled to the inverting input terminal from a signal source through said second gain setting condenser is output from the output terminal.

22. The signal amplifier as set forth in claim 21, further comprising:

a switch connecting the inverting input terminal and the output terminal to the signal source.

23. The signal amplifier as set forth in claim 22, wherein:

an input signal is synchronously with a first clock signal, and said switch is set ON synchronously with a second clock signal.

24. A signal amplifier circuit, comprising:

an amplifier;

an input means for inputting a reference voltage to said amplifier during a detection period; and an adjusting circuit detecting a difference in voltage as an offset voltage between the reference voltage and an output voltage from said amplifier during the detection period, and during an operation period after the detection period, shifting a level of the input signal before the input signal is provided to said amplifier by a level of the offset voltage to reduce the offset voltage of said amplifier, wherein a gain of said amplifier is set to an amplitude ratio of the shifted input signal to the compensating signal.

25. The signal amplifier circuit, as set forth in claim 24, wherein:

the input signal is input synchronously with the clock signal, and the detection period is provided for each clock cycle.

26. The signal amplifier circuit as set forth in claim 25, wherein:

said input means includes a first switching element, said adjusting circuit includes a first condenser and second through fifth switching elements, an input terminal of said amplifier is connected to an input terminal of the reference voltage through said first switching element, and is also connected to one electrode of said first condenser through said second switching element, the electrode of said first condenser is connected to an input terminal of the input signal through said third switching element, and the other electrode of the first condenser is connected to an output terminal of said amplifier through said fourth switching element and is also connected to the input terminal of the reference voltage through the fifth switching element.

27. The signal amplifier circuit as set forth in claim 25, wherein:

said adjusting circuit includes first and second condensers, and second through fifth and seventh switching elements, said input means includes a sixth switching element, and an input terminal of said amplifier is connected to one electrode of said first condenser through said second switching element and is also connected to a constant voltage terminal through said seventh switching element and said second condenser, the electrode of said first condenser is connected to an input terminal of the input signal through said third switching element and is also connected to the input terminal of the reference voltage through said sixth switching element, and the other electrode of said first condenser is connected to an output terminal of said amplifier through said fourth switching element and is also connected to the input terminal of the reference voltage through said fifth switching element.

28. The signal amplifier circuit as set forth in claim 25, wherein:

said input means includes a first switching element, said adjusting circuit includes first and third condensers and third through fifth switching elements, and an input terminal of said amplifier is connected to an input terminal of the reference voltage through said first switching element and is also connected to one electrode of said first condenser, the electrode of said first condenser is connected to an input terminal of the input signal through said third switching element, and the other electrode of said first condenser is connected to an output terminal of said signal amplifier circuit through said fourth switching element and is also connected to the input terminal of the reference voltage through said fifth switching element and to a constant voltage terminal through said third condenser.

29. The signal amplifier circuit as set forth in claim 24, further comprising:

an eighth switching element for applying the reference voltage to an output terminal from said amplifier.

30. The signal amplifier circuit as set forth in claim 24, further comprising:

a ninth switching element for electrically isolating an output terminal of said amplifier from an external load.

31. A signal line drive circuit, comprising:

a sampling circuit sampling a video signal synchronously with a clock signal; and an output device sending video signals obtained by sampling over a data signal line at one time in synchronous with another clock signal, wherein said output means includes:
an operational amplifier; and
a first gain setting condenser and a second gain setting condenser for setting a gain of said operational amplifier, said first gain setting condenser is connected across an inverting input terminal and an output terminal of said operational amplifier, said second gain setting condenser is connected across the inverting input terminal of said operational amplifier and a constant voltage source and sends an output signal obtained by noninverted amplification of a video signal coupled to a noninverting input terminal of said operational amplifier over the data signal line.

32. A signal line drive circuit, comprising:

a sampling device sampling a video signal synchronously with a clock signal; and an output device providing sampled video signals over a data signal line at one time synchronously with another clock signal, wherein said output device includes:
an operation amplifier; and
a first gain setting condenser and a second gain setting condenser for setting a gain of said operational amplifier, said first gain setting condenser is connected across an inverting input terminal and an output terminal of said operational amplifier, a noninverting input terminal of said operational amplifier is coupled to a constant voltage source and provides an output signal obtained by inverted amplification of a video signal coupled to the inverting input terminal from a signal source through said second gain setting condenser over the data signal line.

33. A signal line drive circuit, comprising:

a sampling device sampling a video signal synchronously with a clock signal; and an output device providing sampled video signals over a data signal line at one time synchronously with another clock signal, wherein said output device includes:
an amplifier;
an input means for inputting a reference voltage to said amplifier during a detection period; and
an adjusting circuit detecting a difference in voltage as an offset voltage between the reference voltage and an output voltage from said amplifier during the detection period, and during an operation period after the detection period, shifting a level of a video signal before the video signal is input to the amplifier by a level of the offset voltage to reduce the offset voltage of said amplifier, and wherein a gain of said amplifier is set to an amplitude ratio of the shifted video signal to the compensating signal.

* * * * *